United States Patent
Spencer et al.

(10) Patent No.: US 9,088,413 B2
(45) Date of Patent: *Jul. 21, 2015

(54) RATE MATCHING FOR A WIRELESS COMMUNICATIONS SYSTEM

(71) Applicant: Marvell International Ltd., Hamilton (BM)

(72) Inventors: Paul S. Spencer, Modiin (IL); Amir Winstok, Tel Aviv (IL)

(73) Assignee: Marvell International Ltd., Hamilton (BM)

( * ) Notice: Subject to any disclaimer, the term of this patent is extended or adjusted under 35 U.S.C. 154(b) by 186 days.

This patent is subject to a terminal disclaimer.

(21) Appl. No.: 13/830,020

(22) Filed: Mar. 14, 2013

(65) Prior Publication Data

US 2013/0201886 A1 Aug. 8, 2013

Related U.S. Application Data

(60) Continuation of application No. 12/962,497, filed on Dec. 7, 2010, which is a division of application No. 12/182,833, filed on Jul. 30, 2008, now Pat. No. 7,865,813.

(Continued)

(51) Int. Cl.
*H03M 13/03* (2006.01)
*H04L 1/22* (2006.01)
(Continued)

(52) U.S. Cl.
CPC .............. *H04L 1/22* (2013.01); *H03M 13/2957* (2013.01); *H03M 13/6306* (2013.01);
(Continued)

(58) Field of Classification Search
CPC .................... H03M 13/6362; H03M 13/6356; H04L 1/0013
USPC .................................................. 714/790, 755
See application file for complete search history.

(56) References Cited

U.S. PATENT DOCUMENTS 5,271,012 A 12/1993 Blaum et al.
6,023,783 A 2/2000 Divsalar et al.
(Continued)

FOREIGN PATENT DOCUMENTS

KP 10-2001-0038383 5/2001
WO WO-2006030019 A2 3/2006

OTHER PUBLICATIONS

Douglas N. Rowitch et al. "On the Performance of Hybrid FEC/ARQ Systems Using Rate Compatible Punctured Turbo (RCPT) Codes" IEEE Transactions on Communications, IEEE Service Center, Piscataway, NJ, vol. 48, No. 6, Jun. 1 2000, pp. 948-959.

(Continued)

*Primary Examiner* — M. Mujtaba K Chaudry

(57) ABSTRACT

Apparatuses and methods are provided for generating a plurality of redundancy versions using various rate matching algorithms. In some embodiments, a rate matcher is provided that allocates systematic and parity bits to the redundancy versions in a manner that allows all of these bits to be transmitted in at least one redundancy version. In some embodiments, the rate matcher uses a first puncturing algorithm to generate both a first redundancy version and a third redundancy version, but allocates a different proportion of the systematic bits to these redundancy versions. In these embodiments, the second redundancy version may include only bits that were not transmitted in the first redundancy version.

22 Claims, 31 Drawing Sheets

Related U.S. Application Data

(60) Provisional application No. 60/952,736, filed on Jul. 30, 2007, provisional application No. 60/957,056, filed on Aug. 21, 2007, provisional application No. 60/957,061, filed on Aug. 21, 2007, provisional application No. 60/978,218, filed on Oct. 8, 2007.

(51) Int. Cl.
  *H03M 13/00* (2006.01)
  *H03M 13/29* (2006.01)
  *H04L 1/00* (2006.01)
  *H04L 1/18* (2006.01)

(52) U.S. Cl.
  CPC ..... *H03M 13/6356* (2013.01); *H03M 13/6362* (2013.01); *H04L 1/0013* (2013.01); *H04L 1/0068* (2013.01); *H04L 1/0071* (2013.01); *H04L 1/1816* (2013.01); *H04L 1/1819* (2013.01); *H04L 1/0041* (2013.01); *H04L 1/0066* (2013.01)

(56) References Cited

U.S. PATENT DOCUMENTS

| | | | |
|---|---|---|---|
| 6,622,281 B1 | 9/2003 | Yun et al. | |
| 7,000,173 B2 | 2/2006 | Buckley et al. | |
| 7,089,480 B2 | 8/2006 | Yun et al. | |
| 7,146,552 B2 | 12/2006 | Kim et al. | |
| 7,210,089 B2 | 4/2007 | Xu et al. | |
| 7,280,606 B2 | 10/2007 | Kim et al. | |
| 7,372,837 B2 | 5/2008 | Kinjo et al. | |
| 7,523,383 B2 | 4/2009 | Yun et al. | |
| 7,640,486 B2 | 12/2009 | Dottling et al. | |
| 7,764,743 B2 | 7/2010 | Farag | |
| 2003/0081690 A1 | 5/2003 | Kim et al. | |
| 2003/0135811 A1 | 7/2003 | Xu et al. | |
| 2005/0053168 A1* | 3/2005 | Song et al. | 375/261 |
| 2005/0100085 A1* | 5/2005 | Dottling et al. | 375/240 |
| 2007/0030917 A1* | 2/2007 | Farag | 375/265 |
| 2007/0101232 A1* | 5/2007 | Kim et al. | 714/755 |
| 2007/0135152 A1 | 6/2007 | Kim | |
| 2008/0028273 A1* | 1/2008 | Jeong et al. | 714/752 |
| 2008/0256424 A1 | 10/2008 | Shen et al. | |
| 2008/0294958 A1 | 11/2008 | Lee et al. | |

OTHER PUBLICATIONS

MCS Design for RED HOT A, 3GPP TSG GERAN WGI ad hoc on HUGE & RED HOT#1, Sophia Antipolis, France, Jun. 17-19, 2007, Source: Ericsson, Nokia Siemens Networks, Nokia.

Rate Matching for RED HOT, 3GPP TSG GERN 7th Telco on RED HOT/HUGE, Aug. 14, 2007, Source: Marvell.

MCS design for RED HOT B, 3GPP TSG GERAN WGI ad hoc on HUGE & RED HOT #1, Sophia Antipolis, France, Jun. 17-19, 2007, Source: Ericsson, Nokia Siemens Networks, Nokia.

* cited by examiner

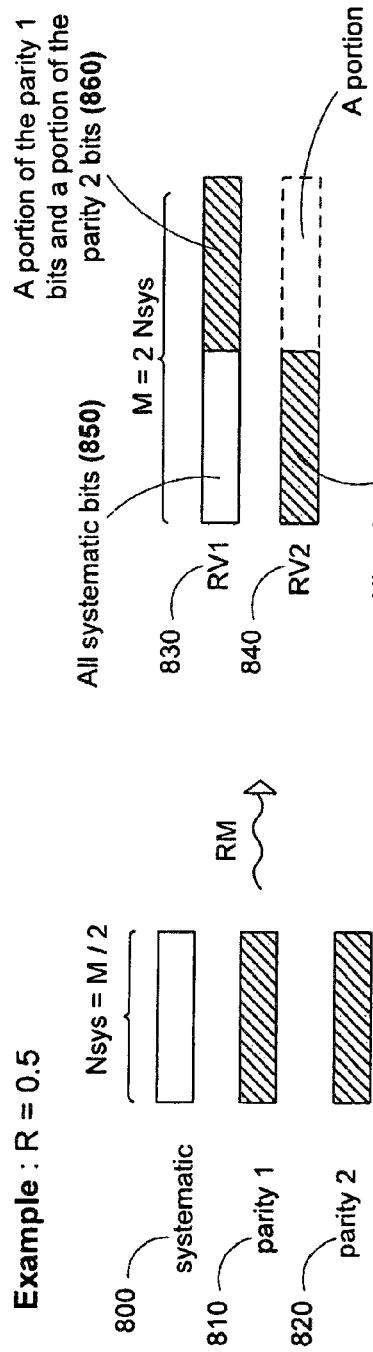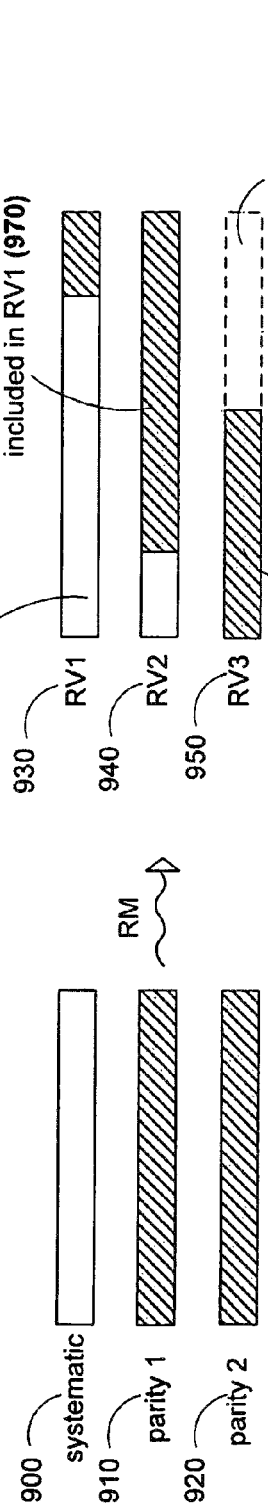

Table 1: *Flip* values

|  | RV1 | RV2 - I | RV2 - II | RV3 |
|---|---|---|---|---|
| Systematic bits | 0 | 1 | 1 | 1 |
| Parity 1 bits | 0 | 1 | 0 | 1 |
| Parity 2 bits | 0 | 1 | 0 | 1 |

Include a bit if the bit was not previously included

Do not include a bit if the bit was previously included

Table 2: Rate Matching Parameters

|  | swap | $N_{SYS}$ | $M_{NO\_PAN}$ | $M_{PAN}$ |
|---|---|---|---|---|
| DAS-5 | 5% | 466 | 1248 | 1172 |
| DAS-10 | 15% | 674 | 1060 | 1022 |
| DBS-5 | 5% | 466 | 956 | 876 |
| DBS-6 | 15% | 610 | 956 | 876 |
| DBS-8 | 5% | 610 | 996 | 956 |

FIG. 13

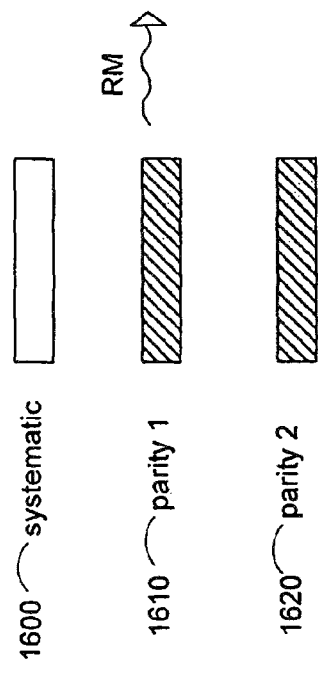
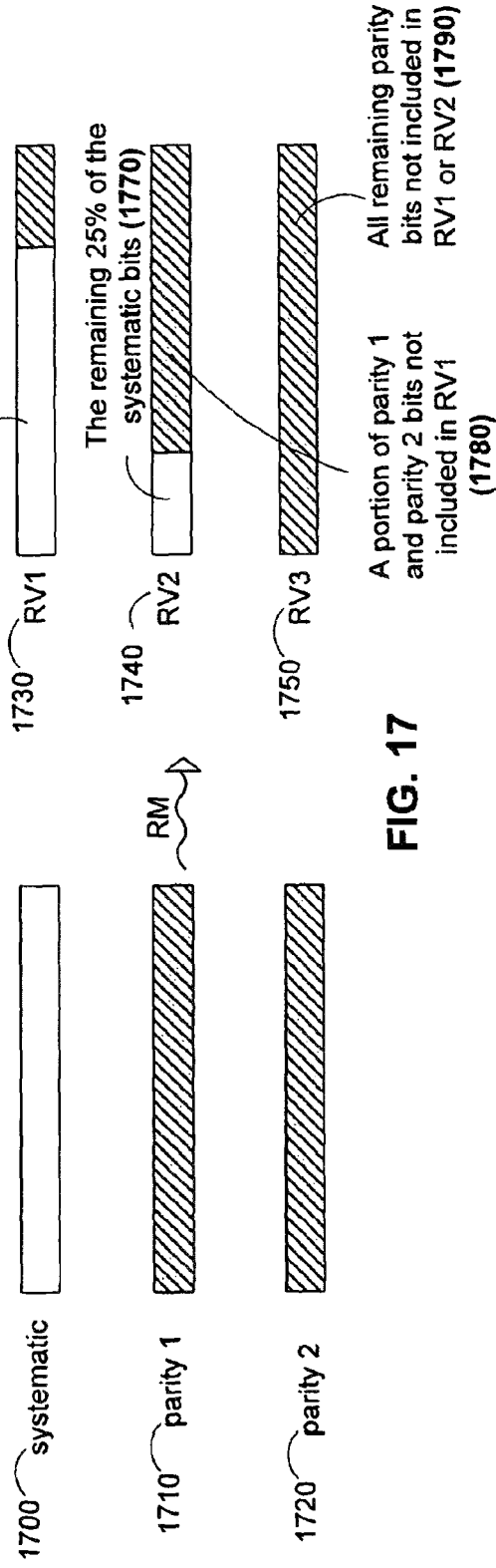
FIG. 16
FIG. 17

Table 3: Loop parameters

| | $e_{plus}$ | $e_{minus}$ | $e2_{plus}$ | $e2_{minus}$ |
|---|---|---|---|---|
| Systematic bits | $X_{ir,1}$ | $|X_{ir,1} - N_{tr,1}|$ | $\tilde{X}_{ir,1}$ | $|\tilde{X}_{ir,1} - \tilde{N}_{tr,1}|$ |
| Parity 1 bits | $2 \cdot X_{ir,2}$ | $2 \cdot |X_{ir,2} - N_{tr,2}|$ | $2 \cdot \tilde{X}_{ir,2}$ | $2 \cdot |\tilde{X}_{ir,2} - \tilde{N}_{tr,2}|$ |
| Parity 2 bits | $X_{ir,3}$ | $|X_{ir,3} - N_{tr,3}|$ | $\tilde{X}_{ir,3}$ | $|\tilde{X}_{ir,3} - \tilde{N}_{tr,3}|$ |

Internal parameters computed from system-level rate matching parameters

FIG. 19

Example : R = 1

Example : R = 1

Table 4: *Flip* values

| RV1 | RV2 - I | RV2 - II | RV3 |
|---|---|---|---|
| 0 | 1 | 0 | 1 |

RATE MATCHING FOR A WIRELESS COMMUNICATIONS SYSTEM

CROSS-REFERENCE TO RELATED APPLICATIONS

This application is a continuation application of U.S. patent application Ser. No. 12/962,497, filed Dec. 7, 2010 (currently pending), which is a divisional of U.S. patent application Ser. No. 12/182,833, filed Jul. 30, 2008, now U.S. Pat. No. 7,865,813, which claims the benefit under 35 U.S.C. §119(e) of U.S. Provisional Application Nos. 60/952,736 filed Jul. 30, 2007, 60/957,056, filed Aug. 21, 2007, 60/957,061, filed Aug. 21, 2007, and 60/978,218, filed Oct. 8, 2007, which are hereby incorporated by reference herein in their entireties.

BACKGROUND OF THE DISCLOSURE

The disclosed technology relates generally to transmitting and receiving messages over a wireless communications network, and more particularly to distributing encoded data across a plurality of redundancy versions for transmission and receipt over the wireless communications network.

In accordance with various wireless communications standards, each base station and mobile station employs a rate matcher. The rate matcher determines which of the bits in an encoded message to send in a current transmission block. For reasons related to data integrity, and because the encoded message may be substantially larger than the amount of data that can be transmitted in a single transmission block, a transmitting station (e.g., a base station or a mobile station) may perform multiple transmissions based on the same encoded message before the receiving station (e.g., a mobile station or a base station) can recover the message. The rate matcher, therefore, determines which set of bits to select for each transmission block.

There are several known rate matching algorithms that are employed by cellular communications systems today. These algorithms have several weaknesses. One weakness is the high percentage of bits in the encoded message that are not selected for transmission within a reasonable number of transmissions. Another weakness is the drastic decrease in decoding performance if the receiving station is not able to interpret the header in one of the transmissions. Accordingly, it would be desirable to provide a rate matcher that is capable of a high decoding performance in different operating scenarios.

SUMMARY OF THE DISCLOSURE

Accordingly, apparatuses and methods for rate matching are disclosed. A rate matcher configured in accordance with the present invention may be implemented within a transmitting station and/or a receiving station in a wireless communications system, or in any other suitable communications or storage system. For purposes of clarity, and not of limitation, the rate matcher may be described below as being implemented on a base station as part of a transmitting station and as being implemented on a mobile station as part of a receiving station. However it should be understood that both the transmitting stations and the receiving stations of the disclosed embodiment can be implemented on both base stations and mobile stations.

A transmitting station constructed in accordance with the present invention may include a Turbo encoder, a rate matcher, and a transmitter. The Turbo encoder may employ a rate-1/3 mother code, and can encode the message to produce encoded data. The encoded data may include a plurality of systematic bits and a plurality of parity bits (e.g., parity 1 and parity 2 bits). The rate matcher may then generate a plurality of redundancy versions of the message by selecting bits from the systematic, parity 1, and parity 2 bits for inclusion in each redundancy version according to a rate matching algorithm. The transmitter may then transmit the plurality of the redundancy versions over the wireless communications network using, for example, a hybrid automatic repeat request (HARQ) protocol.

A receiving station constructed in accordance with the present invention may include a receiver, a rate matcher, and a Turbo decoder. The receiver may receive a plurality of the redundancy versions that were transmitted from a transmitting station over the wireless communications network. The rate matcher may then process the received redundancy versions to determine which of the bits of the redundancy versions correspond to systematic, parity 1, and parity 2 bits of an encoded message. The rate matcher of the receiving station may process the received redundancy versions using the same rate matching algorithm used by the rate matcher of the transmitting station. The Turbo decoder may then decode the encoded message to produce an estimate of the encoded data.

In some embodiments of the present invention, the rate matcher may select a first subset of the systematic bits using a first puncturing algorithm and a first parameterized swap value. The size of the first subset may be based at least partly on the first parameterized swap value. The rate matcher may then generate a first redundancy version, having a predetermined number of bit positions. The first redundancy may include a first subset of the systematic bits. The unused bit positions of the first redundancy version may be allocated to a first subset of the parity bits.

The rate matcher may then select a second subset of the systematic bits. The second subset may include all of the systematic bits corresponding to the message that were not included in the first subset of the systematic bits. The rate matcher may generate a second redundancy version of the message, which has the predetermined number of bit positions, may include the second subset of the systematic bits. The unused bit positions of the second redundancy version may be allocated to a second subset of parity bits that includes parity bits what are not included in the first subset of parity bits.

In some embodiments, a rate matcher and/or transmitter and/or receiver may operate based on a particular transmission scheme selected from among a plurality of available transmission scheme. For example, a transmitting station may include a configuration unit that is configured to select the particular transmission scheme and to provide the corresponding system-level rate matching parameters to the rate matcher and/or the corresponding transmission parameters to the transmitter. The rate matcher, which may operate based on the selected transmission scheme, generates a plurality of redundancy versions, where each of the plurality of systematic bits is allocated to at least one of the redundancy versions. The systematic bits may also be allocated such that each redundancy version includes less than all of the systematic bits. The transmitter, which may operate based on the selected transmission scheme, may transmit the plurality of redundancy versions over the wireless communications network to a receiver which may include a rate matcher which may operate on the selected transmission scheme. The transmitter transmits at least one of the redundancy versions over a plurality of time slots defined by a time division multiple access (TDMA) protocol.

In still other embodiments of the present invention, a rate matcher may operate such that all systematic bits are included in the first two redundancy versions of a message. In particular, the rate matcher may select a first subset of the systematic bits and may generate a first decodable redundancy version of the message that includes the first subset of systematic bits. The rate matcher may then select a second subset of the systematic bits that includes all of the systematic bits corresponding to the message that are not included in the first subset of the systematic bits. The rate matcher may then generate at least one additional redundancy version of the message including the second subset of systematic bits.

In some embodiments of the present invention, a rate matcher may generate redundancy versions such that any parity bits selected for the first redundancy version is excluded from the second subset of the parity bits. In particular, the rate matcher may select a first subset of the parity bits. The rate matcher may generate a first redundancy version including the first subset of parity bits. The rate matcher may then select a second subset of the parity bits such that those parity bits selected for the first subset are excluded from being selected for the second subset. In some embodiments, after all of the parity bits that were not selected for the first subset have been selected for the second subset, the parity bits that were selected for the first subset may also be selected for the second subset. Using the second subset of parity bits, the rate matcher may generate a second redundancy version.

In still other embodiments, a rate matcher can generate redundancy versions such that pairs of redundancy versions are decodable. In particular, the rate matcher may select a first subset of the systematic bits. The rate matcher may generate a first decodable redundancy version of the message that includes the first subset of systematic bits. The rate matcher may then select a second and a third subset of the systematic bits. The rate matcher may allocate all of the systematic bits corresponding to the message that are not included in the first subset to at least one of the second and third subsets. The rate matcher may then generate a second redundancy version of the message that includes the second subset and a third redundancy version of the message that includes the third subset. From the allocation of systematic bits to the second and third redundancy versions, a combination of the second and third redundancy versions may be decodable without any additional systematic information provided from the first redundancy version.

In other embodiments of the present invention, a rate matcher configured in accordance with the present invention can generate at least three redundancy versions of an encoded message, where the third redundancy version is the same as the first redundancy version. First, the rate matcher may select a first subset of the systematic bits. The rate matcher may generate a first decodable redundancy version of the message that includes the first subset of systematic bits. The rate matcher may then select a second subset of the systematic bits, where the second subset includes all of the systematic bits corresponding to the message that were not included in the first redundancy version. The rate matcher may generate a second redundancy version of the message that includes the second subset of systematic bits. The rate matcher may then generate a third redundancy version of the message that includes the first subset of systematic bits.

In still other embodiments of the present invention, a rate matcher may generate at least three redundancy versions, where two of the redundancy versions are generated using the same puncturing algorithm, but different swap values. In particular, the rate matcher may select a first subset of the systematic bits using a first puncturing algorithm and a first parameterized swap value. The rate matcher may generate a first redundancy version that includes the first subset of systematic bits. Then, the rate matcher may select a second subset of the systematic bits using a second puncturing algorithm. The second subset can include all of the systematic bits that were not included in the first redundancy version. The rate matcher may generate a second redundancy version, where the second redundancy version includes the second subset of the systematic bits. The rate matcher may then select a third subset of the systematic bits using the first puncturing algorithm and a second parameterized swap value. The second parameterized swap value is different from (e.g., greater than) the first parameterized swap value such that the third subset includes a different number of systematic bits than the first redundancy version. Using the third subset of systematic bits, the rate matcher may generate a third redundancy version In still other embodiments of the present invention, a rate matcher configured in accordance with the present invention may implement loop logic for puncturing data bits. The rate matcher may initialize a first set of loop parameters for puncturing the systematic bits. Using the first set of loop parameters as input, the rate matcher may execute the loop logic to puncture a subset of the systematic bits. The rate matcher may also initialize a second set of loop parameters for puncturing the first plurality of parity bits. Using the second set of loop parameters as input, the rate matcher may execute the loop logic to puncture a subset of the first plurality of parity bits. Finally, the rate matcher may combine the systematic bits and the first plurality of parity bits that have not been punctured.

BRIEF DESCRIPTION OF THE DRAWINGS

The above and other aspects and advantages of embodiments of the invention will be apparent upon consideration of the following detailed description, taken in conjunction with the accompanying drawings, in which like reference characters refer to like parts throughout, and in which:

FIG. 8 is a schematic diagram illustrating two redundancy versions generated in accordance with the flowchart of FIG. 6;

FIG. 9 is a schematic diagram illustrating three redundancy versions generated in accordance with the flowchart of FIG. 7;

FIG. 13 shows two tables of rate matching parameters, where the first table illustrates flip variables for different redundancy versions and bit types (systematic versus parity) and the second table illustrates various transmission schemes that use non-zero swap values;

FIG. 16 is a schematic diagram illustrating two redundancy versions generated in accordance with the flowchart of FIG. 14;

FIG. 17 is a schematic diagram illustrating three redundancy versions generated in accordance with the flowchart of FIG. 15;

FIG. 19 is a table of loop parameters computed based on internal parameters and bit type (systematic, parity 1, or parity 2);

DETAILED DESCRIPTION OF THE DISCLOSURE

Figure 1:
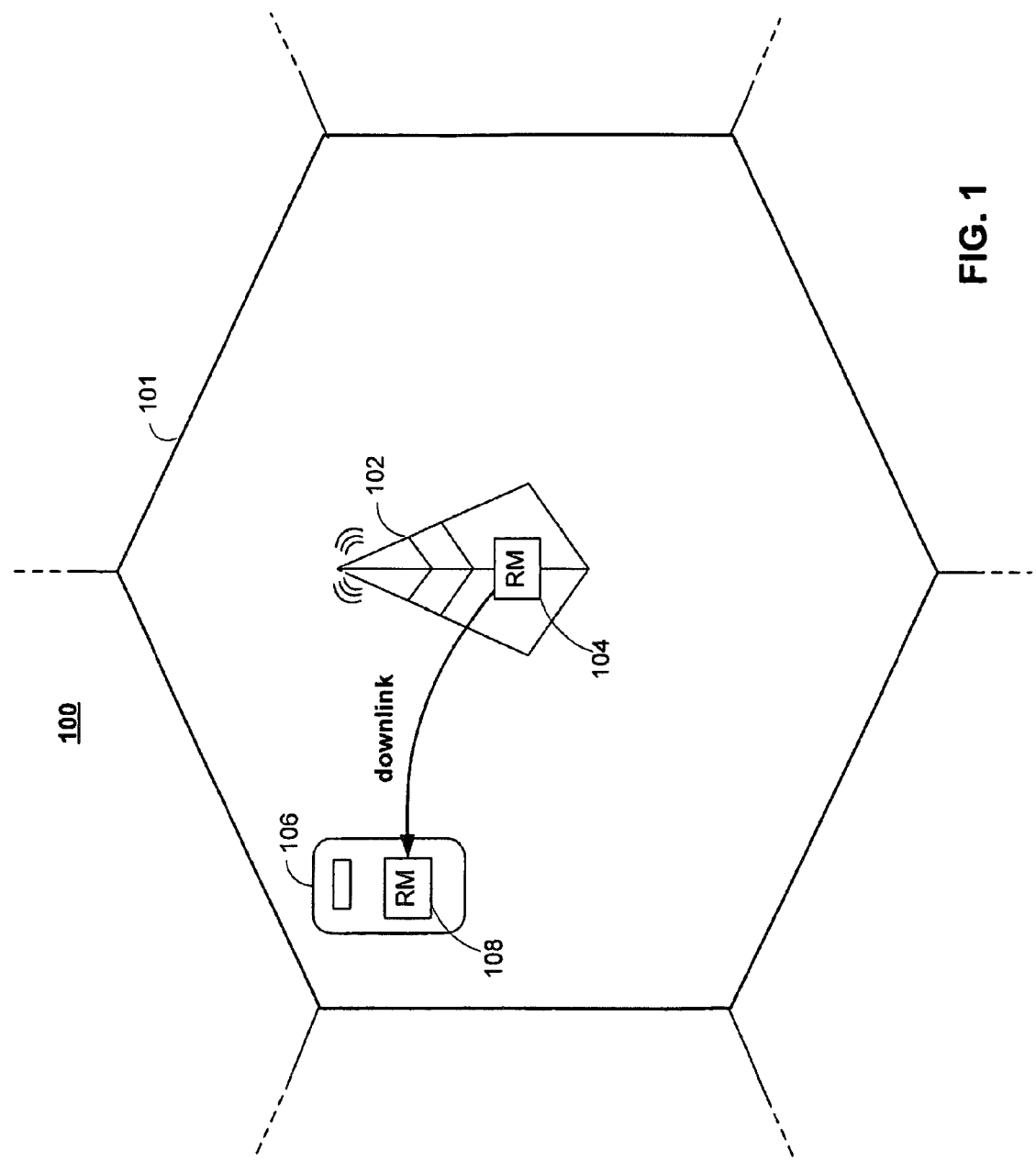
FIG. 1 is a simplified schematic diagram of a radio cell in a cellular network that includes a base station and a mobile station, each having an enhanced rate matcher employing the disclosed technology.

FIG. 1 shows an illustrative wireless communications system 100, which may be a cellular system. Wireless communications system 100 can include a plurality of base stations that are interconnected to form a mobile or cellular network. For example, wireless communications system 100 can include base station 102. Base station 102 may be configured to communicate with mobile stations within its radio communication range via radio signals. Radio cell 101 may represent a physical area that lies within the radio communication range of base station 102.

Base station 102 may be able to communicate with mobile station 106, which is located within radio cell 101, and with other mobile stations that are also within radio cell 101 (not shown). For example, base station 102 may broadcast information that can be received by any mobile station within radio cell 101, including mobile station 106. Such transmissions from base station 102 to mobile station 106 (or any other mobile station) may sometimes be referred to as downlink transmissions.

Mobile station 106 may be any suitable type of cellular telephone compatible with the mobile network of wireless communications system 100. For example, mobile station 106 can operate based on a protocol or communications standard compatible with base station 102. In some embodiments, the mobile network may use the EGPRS2 Downlink ("DL") protocol. The EGPRS2 DL protocol may define, for example, various coding and modulation properties that allow cellular communication to occur reliably and at a high data rate. In other embodiments, the mobile network illustrated in FIG. 1 can employ a protocol other than a EGPRS2 DL protocol, such as a modified form of the EGPRS2 DL protocol. For example, the mobile network may employ a modified protocol that may sometimes be referred to as the Reduced symbol Duration, Higher Order modulation and Turbo codes (RED HOT) protocol.

Base station 102 may send an encoded message via downlink transmissions to mobile station 106 in blocks of a predetermined size. The predetermined size may be defined by the transmission protocol employed by the cellular network. To select which parts of the encoded message to transmit in each block, base station 102 may include enhanced rate matcher 104. As will be described in greater detail below, enhanced rate matcher 104 may select portions of the encoded message using particular selection techniques to generate one or more redundancy versions of the message. These selection techniques include puncturing algorithms that puncture the encoded data such that the encoded data is distributed between multiple redundancy version of the message. These redundancy versions of the message may then be transmitted to mobile station 106. Mobile station 106 may include enhanced rate matcher 108 to interpret the one or more redundancy versions of the message received from base station 102. In particular, enhanced rate matcher 108 may apply the same selection technique used by rate matcher 104 to determine which portion (e.g., which bit locations) of the encoded message were included in each of the received redundancy versions of the message. In some embodiments, mobile station 106 may send encoded messages via uplink transmissions to base station 102 using a similar technique.

Figure 2:
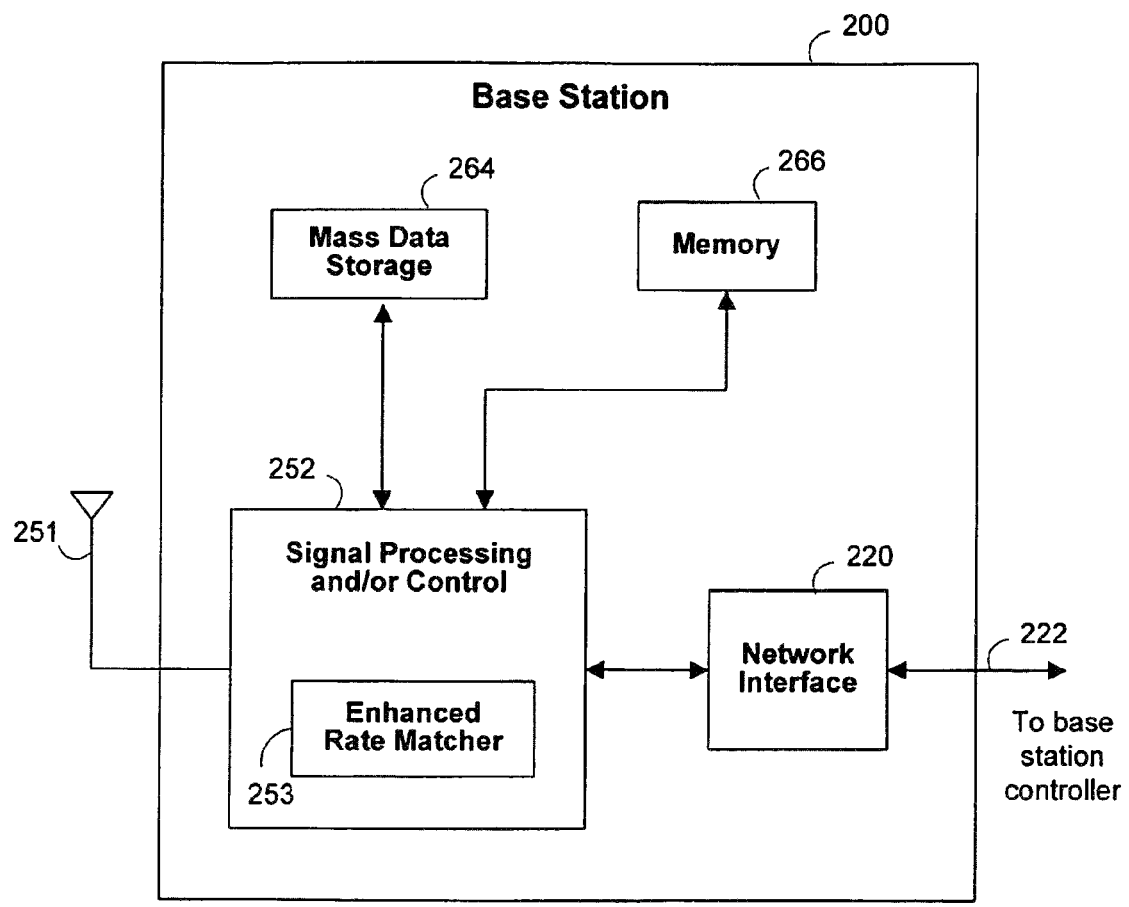
FIG. 2 is a simplified block diagram of a base station with control circuitry that employs the enhanced rate matching techniques of the disclosed technology.
Figure 3:
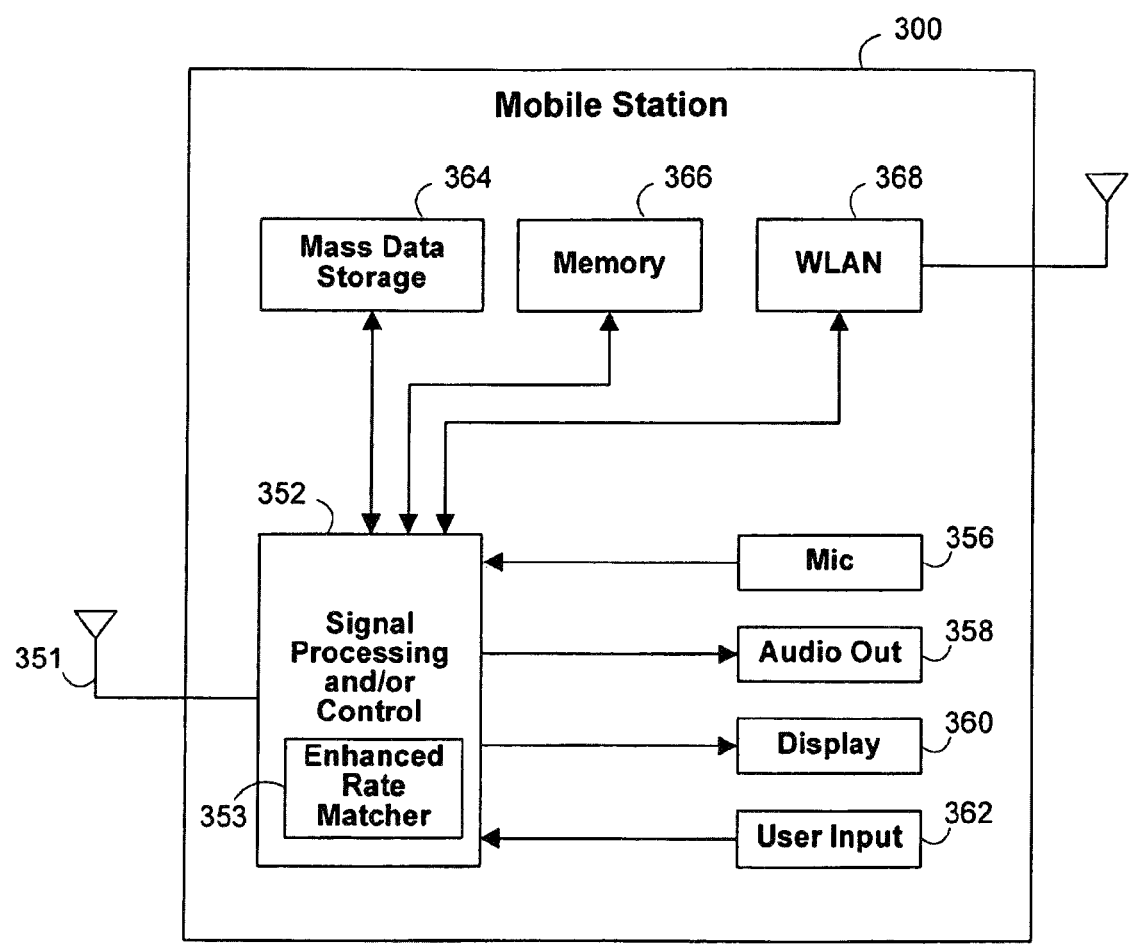
FIG. 3 is a simplified block diagram of a mobile station with control circuitry that employs the enhanced rate matching techniques of the disclosed technology.

FIGS. 2 and 3 show illustrative block diagrams of a base station and a mobile station, respectively, constructed in accordance with an embodiment of the present invention. Referring first to FIG. 2, a block diagram of base station 200 is shown which may be a more detailed representation of base station 102 of FIG. 1. Base station 200 can include signal processing and/or control circuits 252, mass data storage 264, memory 266, antenna 251 for wireless transmission and/or reception, and network interface 220. Mass data storage 264 and memory 266 may be implemented using any suitable type of storage mediums (e.g., ROM, RAM, FLASH, etc.), and may be coupled to signal processing and/or control circuits 252 to support the functions of signal processing and/or control circuits 252.

Base station 200 may obtain a message from a base station controller that controls the flow of information over the cellular network. In particular, base station 200 may include network interface 220 that communicates with the base station controller over communications link 222. From the base station controller, network interface 220 may acquire the message to transmit to a particular mobile station (e.g., mobile station 106 of FIG. 1). Network interface 220 may provide the message to signal processing and/or control circuits 252 for processing and transmission to the mobile station.

To transmit the message, signal processing and/or control circuits 252 may include enhanced rate matcher 253. Enhanced rate matcher 253 may have any of the features or functionalities of rate matcher 104 (FIG. 1). For example, enhanced rate matcher 253 may select portions of the encoded message to generate one or more redundancy versions of the message. As will be described in greater detail below, enhanced rate matcher 253 may select portions of the encoded message using puncturing algorithms that puncture the encoded data such that the encoded data is distributed between multiple redundancy version of the message. Signal processing and/or control circuits 252 may further include any communication circuitry (not shown) needed to transmit data selected by enhanced rate matcher 253 via antenna 251. In some embodiments, signal processing and/or control circuits 252 may also perform coding and/or encryption, perform calculations, format data and/or perform other base station functions. Signal processing and/or control circuits 252 may include a single processor, or may include several processors each of which is configured to perform one or more base station functions. For example, signal processing and/or control circuits 252 may include a modem processor and an application processor. The processors may be hardware, software, or firmware-based processors.

Referring now to FIG. 3, a block diagram of mobile station 300 is shown which may be a more detailed representation of mobile station 106 of FIG. 1. Mobile station 300 can include mass data storage 364, memory 366, WLAN interface 368, signal processing and/or control circuits 352, antenna 351 for wireless transmission and/or reception, microphone 356, audio output 358, display 360, and user input device 362. Generally, each of these components may be controlled, receive information, or provide information to signal processing and/or control circuits 352.

The signal processing and/or control circuits 352 and/or other circuits (not shown) in the cellular telephone 350 may include any suitable communications circuitry (e.g., a modem) (not shown) coupled to antenna 351 to receive and demodulate incoming data from a base station (e.g., base station 102 of FIG. 1 or base station 200 of FIG. 2). For example, antenna 351 may receive signals corresponding to the message transmitted from antenna 251 of base station 200 (FIG. 2). To interpret the data received via antenna 351, signal processing and/or control circuits 352 may include enhanced rate matcher 353. Enhanced rate matcher 353 may have any of the features or functionalities of enhanced rate matcher 108 of FIG. 1. For example, signal processing and/or control circuits 352 may also process data, perform coding and/or encryption, perform calculations, format data and/or perform other cellular telephone functions. Signal processing and/or control circuits 352 may include a single processor, or may include several processors each of which is configured to perform one or more cellular telephone functions. For example, signal processing and/or control circuits 32 may include a modem processor and an application processor. The processors may be hardware, software, or firmware-based processors. Although base station 102 of FIG. 1 and base station 200 of FIG. 2 have been described above as encoding and transmitting messages to mobile stations and mobile station 106 of FIG. 1 and mobile station 300 of FIG. 3 have been described above as receiving and decoding messages from base stations, it should be understood that that both base stations and mobile stations may transmit, receive, and process messages from base stations and/or mobile stations.

Figure 4:
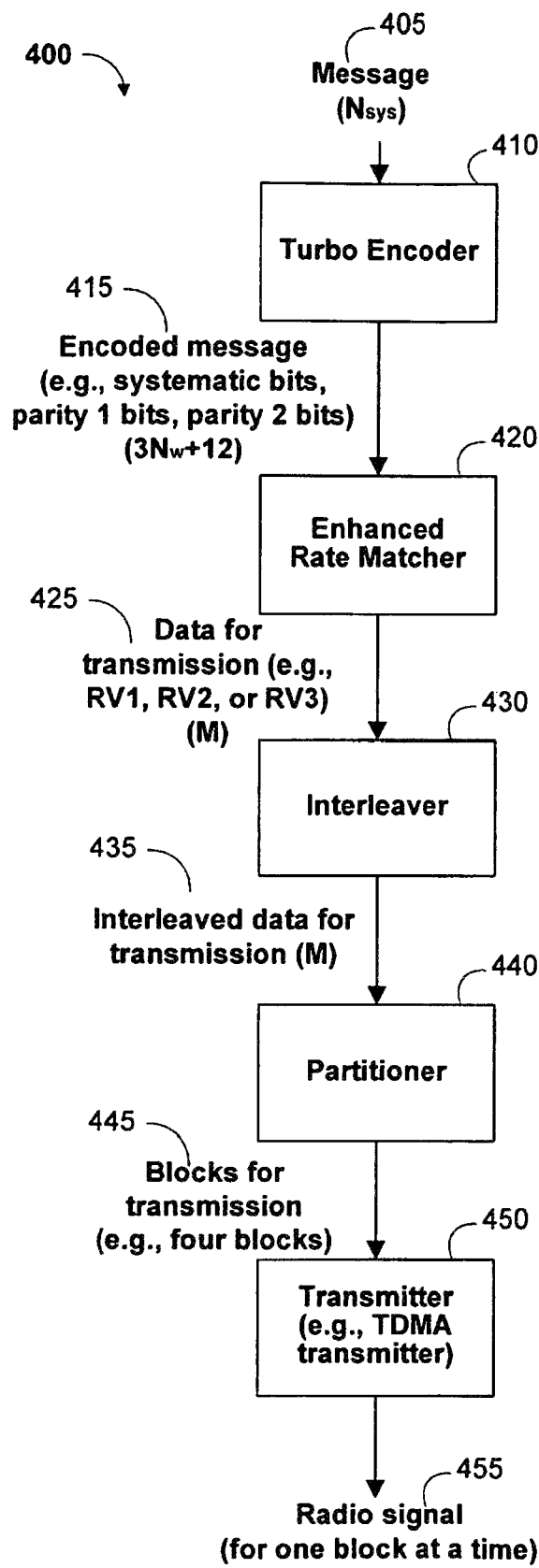
FIG. 4 is a simplified block diagram of the communications circuitry for a base station, which includes an enhanced rate matcher that employs the disclosed technology.
Figure 5:
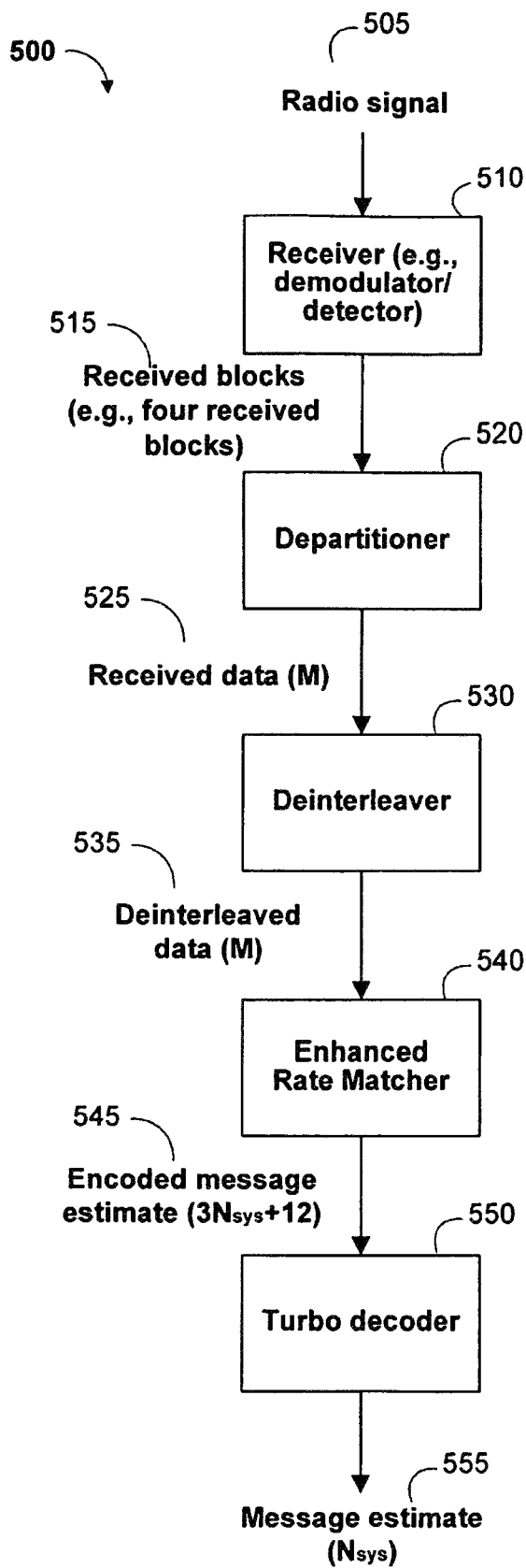
FIG. 5 is a simplified block diagram of a communications circuitry for a mobile station, which includes an enhanced rate matcher that employs the disclosed technology.

Turning to FIGS. 4 and 5, simplified block diagrams of signal processing and/or control circuits are shown for transmitting and receiving data, respectively, in a base station and/or a mobile station. Referring first to FIG. 4, a block diagram of signal processing and/or control circuits 400 a transmitting station is shown. Signal processing and/or control circuits 400 may be a more detailed representation of signal processing and/or control circuits 252 of base station 200 (FIG. 2) or signal processing and/or control circuits 352 of mobile station 300 (FIG. 3). Signal processing and/or control circuits 400 may include Turbo encoder 410, rate matcher 420, interleaver 430, partitioner 440, and transmitter 450. These components may be configured to convert message 405 to radio signal 455 that is suitable for a wireless transmission.

Turbo encoder 410 may encode message 405 to produce encoded message 415. Turbo encoder 410 may operate using any suitable Turbo code, such as a rate-1/3 Turbo mother code that converts message 405, having $N_{sys}$ bits, to an encoded message that has approximately $3N_{sys}+12$ bits also referred to herein as $3N_w$ bits, where $N_w$ is equal to $N_{sys}+4$. Turbo encoder 410 may be a systematic encoder that outputs the bits of the original message 405, referred to as a stream of "systematic bits," as well as two streams of $N_{sys}$ parity bits. For simplicity, one stream of $N_{sys}$ parity bits may be referred to as "parity 1" bits, and the other stream of $N_{sys}$ parity bits may be referred to as "parity 2" bits. The remaining bits produced by Turbo encoder 410 (e.g., the remaining 12 bits) may be termination bits.

Enhanced rate matcher 420 may select a portion of the systematic, parity 1, and parity 2 bits for transmission to a receiving station (e.g., mobile station 106 of FIG. 1 or mobile station 300 of FIG. 3). Enhanced rate matcher 420 may have any of the features or functionalities of enhanced rate matcher 104 (FIG. 1) or enhanced rate matcher 253 (FIG. 2) or enhanced rate matcher 353 (FIG. 3). Thus, for each downlink transmission, enhanced rate matcher 420 may select a predetermined number of these bits for transmission based on an employed transmission scheme or on transmission constraints and limitations. The number of bits selected by enhanced rate matcher 420 may be referred to by the variable, M, which can be of any suitable size. Thus, enhanced rate matcher 420 may use a suitable selection technique for selecting M bits as data 425 for transmission from approximately $3N_w$ bits.

Since only a portion of encoded message 415 is selected for each transmission, multiple transmissions may be used in order to send most or all of the encoded message 415 and in order to achieve successful reception in less than optimal conditions. Enhanced rate matcher 420 may select a different set of M bits for each transmission, where the sets may be overlapping or non-overlapping sets. Thus, enhanced rate matcher 420 may produce different M-bit versions of encoded message 415. These versions may be referred to as "redundancy versions" (RVs) of a message or encoded message. Alternatively, the redundancy versions may be referred to as "puncturing versions," since the selection of M bits may be performed by puncturing bits from the approximately $3N_w$ bits. The first redundancy version may be referred to as RV1, and the second redundancy version may be referred to as RV2, etc.

The M bits 425 of encoded message 405 selected for the next transmission may then be passed to interleaver 430. Interleaver 430 may interleave the M bits selected for transmission such that neighboring bits are separated from one another. In some embodiments, the M bits may be transmitted in multiple blocks, sometimes referred to "bursts." In these embodiments, interleaver 430 may interleave the M bits such that neighboring bits are moved to adjacent or non-adjacent bursts. Interleaver 430 therefore produces interleaved data 435, which is the same as data 425 but arranged in a different order. Partitioner 440 may then partition the interleaved data 435 into distinct blocks for transmission. For example, partitioner 440 may partition interleaved data 435 into four transmission blocks 445.

Transmitter 450 prepares each of transmission blocks 445 for transmission over the wireless network. Transmitter 450 may include communications circuitry (not shown), such as a suitable modulator, to convert blocks 445 to convert the bits of transmission blocks 445 into radio signal 455 suitable for wireless transmission. The modulator may use any suitable modulation scheme to perform the conversion (e.g., quadrature amplitude modulation (QAM), pulse amplitude modulation (PAM), phase shift keying (PSK), etc.), which may be defined by the transmission scheme. Transmitter 450 may employ a time division multiple access (TDMA) protocol in which each block of blocks 445 is allocated to a different time slot. Thus, each redundancy version may be transmitted in radio signal 455 in four time slots.

In some embodiments, transmitter 450 may append a header to each of the transmission blocks 445 prior to transmission. The header may provide information on which messages are being sent in the current time slot—in this case, message 405. Each message in transmission block 445 may be referred to sometimes as a block sequence number (BSN). This allows a receiving station receiving the radio signal to identify which is being sent, and to match the redundancy version that is received to any redundancy versions for the same message that have already been received.

FIG. 4 illustrates the signal processing and/or control circuit that transmits one BSN in each radio block. In some embodiments of the present invention, the signal processing and/or control circuit may be configured to transmit redundancy versions for a plurality of encoded messages (e.g., two, three, or four encoded messages, etc.) in the same radio block.

Referring now to FIG. 5, a block diagram of signal processing and/or control circuits 500 for a receiving station is shown. Signal processing and/or control circuits 500 may be a more detailed representation of signal processing and/or control circuits 252 of base station 200 (FIG. 2) or signal processing and/or control circuits 352 of mobile station 300 (FIG. 3). Signal processing and/or control circuits 500 may include receiver 510, departitioner 520, deinterleaver 530, enhanced rate matcher 540, and Turbo decoder 555. The operation of these components may complement the operation of transmitter 450, partitioner 440, interleaver 430, enhanced rate matcher 420, and Turbo encoder 410 of FIG. 4, respectively, where each component of signal processing and/or control circuits 500 can essentially undo the processing of its corresponding component in signal processing and/or control circuits 400 to reconstruct a message that was transmitted using enhanced rate matching techniques.

For example, receiver 510 may receive radio signal 505 from a downlink wireless transmission that corresponds to a burst of information (e.g., part of a redundancy version). Receiver 510 may include a demodulator/detector that interprets radio signal 505. Thus, for each time slot, receiver 510 may produce a stream of bits corresponding to all or part of a redundancy version. Once all parts of a redundancy version have been received (e.g., all four bursts), departitioner 520 may combine the streams to produce data 525. Data 525 includes all the bits of the redundancy version, and therefore has M bits. Deinterleaver 530 may then deinterleave data 525 to obtain the original order of the sequence.

From deinterleaved data 535, rate matcher 540 may identify which M bits of the original $3N_w$ bits in the encoded message have been received. In particular, enhanced rate matcher 540 may determine how the received M bits of a received redundancy version were selected from the $3N_w$ bits in the encoded message in order to produce an estimate 545 of the encoded message. In addition, if previous redundancy versions have been received for the same message, estimate 545 of the encoded message may add information from the previously received redundancy versions to generate an improved estimate of the encoded message. Turbo decoder 550 may then decode estimate 545 of the encoded message using a code corresponding to the same Turbo code employed by the corresponding Turbo encoder (e.g., Turbo encoder 410 of FIG. 4). The resulting output of Turbo decoder 550 is an estimate 555 of the original message. If the transmission is successful, estimate 555 is the same as the original message (e.g., message 405 of FIG. 4).

The success of Turbo decoder 550 depends at least partially on whether estimate 545 includes information on some, most, or all of the bits from the encoded message. In particular, although Turbo decoder 550 may be able to successfully decode an encoded message estimate 545 with only partial information, it may do so with a higher rate of success if estimate 545 includes information on a greater number of the bits in the encoded message, rather than having to use erasures for some of the bit positions. Therefore, in some embodiments, redundancy versions may be generated such that each bit of the encoded message is selected for at least one of the redundancy versions. Therefore, in the event that all of the redundancy versions are transmitted, each bit estimate in the encoded message estimate 545 may be based on information from at least one of the redundancy versions.

Figure 6:
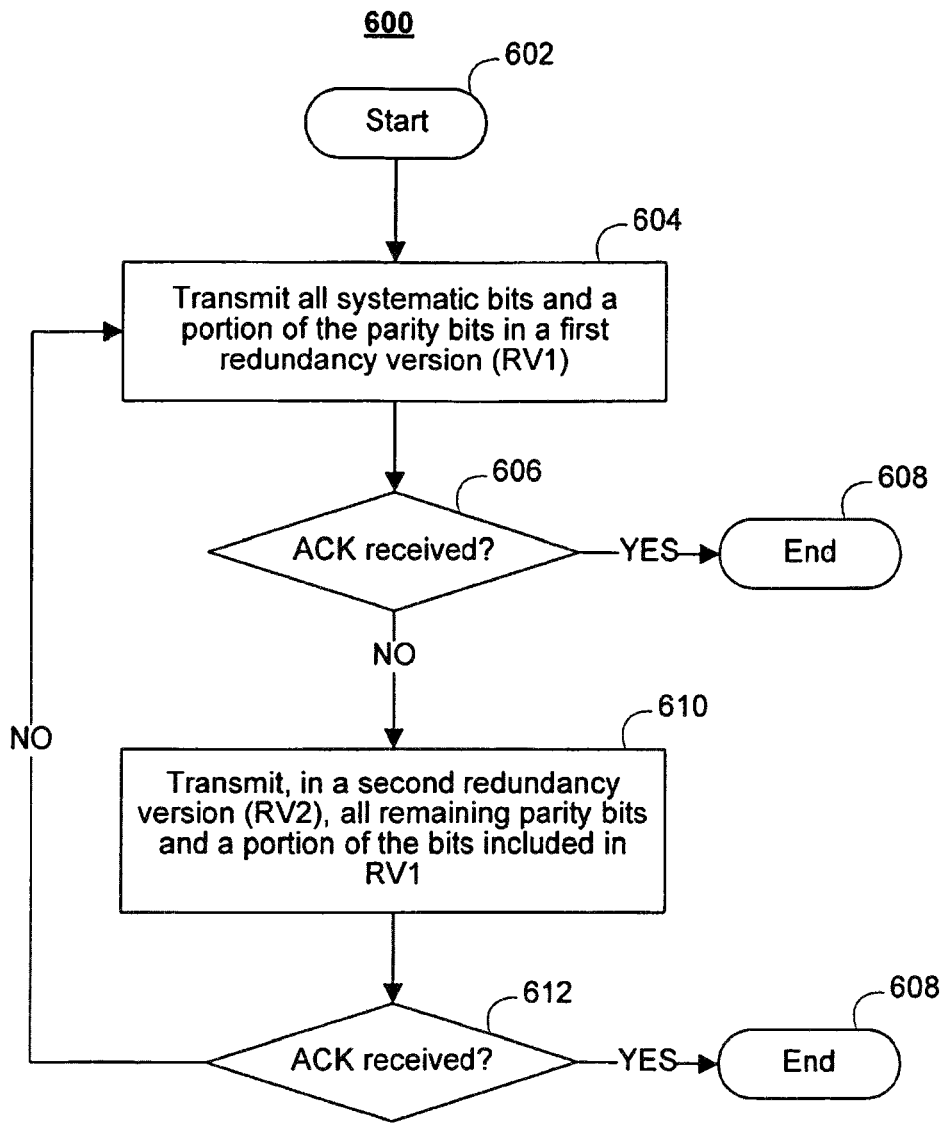
FIG. 6 is a flowchart of an illustrative process for transmitting encoded data in two redundancy versions using a hybrid automatic repeat request (ARQ) protocol, where all of the systematic bits are included in the first redundancy version (RV1), in accordance with an embodiment of the present invention.

FIG. 6 shows an illustrative flowchart of process 600 for transmitting all of the bits of an encoded message in two redundancy versions using a hybrid automatic repeat request (HARQ) protocol. All of the bits in the encoded message can be transmitted in two redundancy versions when:

$$2M \geq 3N_w, \tag{EQ. 1}$$

so that all $3N_w$ bits in the systematic, parity 1, and parity 2 streams can be transmitted within the 2M bits of two redundancy versions. EQ. 1 may be rewritten as:

$$N_w/M \leq 2/3, \tag{EQ. 2}$$

where this ratio may be referred to as the code rate and sometimes by the variable, R. Therefore, process 600 may be executed in embodiments where the code rate is less than or equal to 0.66. The rate matcher may also initialize a variable, $R_{max}$, that represents the number of redundancy versions needed to transmit the full encoded message. Thus, when $R \leq 0.66$, the rate matcher may set $R_{max}$ to two.

Process 600 may begin at step 602 and continue to step 604. In an embodiment, at step 604, all of the systematic bits and a portion of the parity bits (e.g., parity 1 and/or parity 2 bits) may be selected for transmission in a first redundancy version of a message over the wireless communications network. In this embodiment, all of the systematic bits may be included in the first redundancy version so that the corresponding receiving station can attempt to recover the message using all of the systematic bits, should the first redundancy version be properly received and its header successfully decoded. The receiving station's Turbo decoder may be more likely to correctly recover the original message when the Turbo decoder has information on all of the systematic bits. Parity bits may be selected for the first redundancy version such that a total of M bits are chosen for transmission. This selection of parity bits may be performed by a rate matcher implemented on the transmitting station. This process for selecting systematic and parity bits is merely illustrative of an embodiment, other techniques for selecting bits for inclusion in one or more redundancy versions will be described in greater detail below.

Process 600 may then continue to step 606. At step 606, it may be determined whether an acknowledgment (ACK) signal has been received from the receiving station. If an ACK is received, the receiving station has successfully recovered the transmitted message, and therefore process 600 may move to step 608 and end. Otherwise, if a NACK signal is received or if no ACK signal is received within a predetermined period of time, the message may not have been successfully decoded by the receiving station. Thus, process 600 may continue to step 606 in which a second redundancy version is generated for transmission.

In the second redundancy version of the message, the transmitting station may avoid selecting parity bits that were included in the first redundancy version, until all of the parity bits have been selected for transmission in at least one redundancy version. Then, other bits that were included in the first redundancy version at step 604 may be selected for inclusion in the second redundancy version. Thus, after the second redundancy version is transmitted at step 606, the transmitting station has transmitted all of the bits in the encoded message at least once.

Process 600 may then proceed to step 612. At step 612, the transmitting station may determine whether an ACK signal has been received following transmission of the second redundancy version. If the transmitting station receives an ACK signal, the receiving station has successfully recovered the message. Thus, process 600 may proceed to step 608 and end. Otherwise, process 600 may return to step 604, where the transmitting station may retransmit the first redundancy version, for example. The transmitting station may retransmit the first and the second redundancy versions in this manner until an ACK signal is received from the receiving station or until the transmitting station retransmits the first and second redundancy versions a predetermined number of times.

Figure 7:
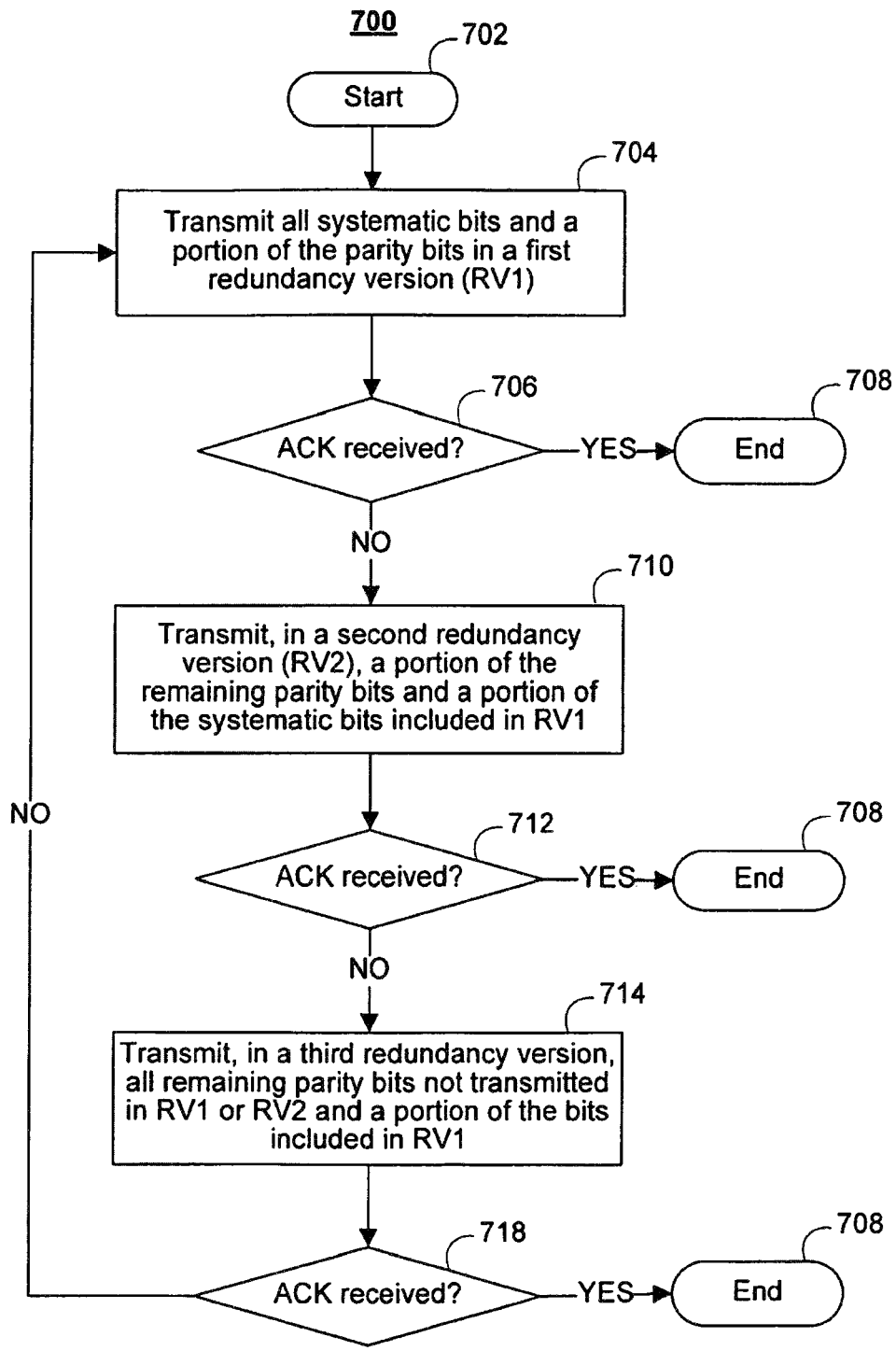
FIG. 7 is a flowchart of an illustrative process for transmitting encoded data in three redundancy versions using a HARQ protocol, where all of the systematic bits are included in the first redundancy version (RV1), in accordance with an embodiment of the present invention.

Turning now to FIG. 7, an illustrative flowchart of process 700 is shown for including for transmission over a wireless communications network all of the bits of an encoded message in three redundancy versions using a HARQ retransmission protocol. Suitable HARQ transmission protocols are described in the 3rd Generation Partnership Project (3GPP) technical specifications (TS), for example, at section 43.064, release 7, version 7.8.0. This portion of the 3GPP TS is incorporated by reference herein in its entirety. This process for selecting systematic and parity bits for is merely illustrative of an embodiment, other techniques for selecting bits for inclusion in one or more redundancy versions will be described in greater detail below. A suitable transmitting station may execute the steps of process 700 when $R_{max}=3$ and when:

$$3M \geq 3N_w > 2M, \tag{EQ. 3}$$

so that all $3N_w$ bits in the systematic, parity 1, and parity 2 streams can be transmitted within the 3M bits of three redundancy versions, but cannot be transmitted in two redundancy versions. EQ. 3 may be rewritten as:

$$0.66 < N_w/M \leq 1 \tag{EQ. 4}$$

Therefore, the transmitting station may execute the steps of process 700 when the code rate of the system is greater than 0.66, but less than or equal to one.

Process 700 begins at step 702, and then proceeds to step 704. At step 704, the transmitting station may select all of the systematic bits and a portion of the parity bits (e.g., parity 1 and/or parity 2 bits) for transmission in a first redundancy version of a message over the wireless communications network. As described above in connection with step 604 of process 600 (FIG. 6), the transmitting station may include all of the systematic bits in the first redundancy version to maximize the probability that a corresponding receiving station can recover the transmitted message in a single transmission.

Then, at step 706, the transmitting station may determine whether an ACK signal has been received from the receiving station. If an ACK signal has been received, the receiving station has successfully recovered the message, and process 700 may end at step 708. Otherwise, if a NACK signal is received or if no ACK signal is received within a predetermined period of time, the message may not have been successfully decoded by the receiving station. Therefore, process 700 may continue to step 708, where the transmitting station may generate a second redundancy version for transmission.

For the second redundancy version of the message, the transmitting station may select, at step 712, a portion of the parity bits that were not included in the first redundancy version. In an embodiment, parity bits that were selected for transmission in the first redundancy version are excluded from selection for the second redundancy version, unless all of the previously unselected bits are included in the second redundancy version. Thus, if the receiving station successfully receives both the first and the second redundancy versions, the receiving station can perform decoding based on all of the systematic bits (from the first redundancy version) and the parity bits included in either the first or the second redundancy versions. In some embodiments, the transmitting station may also include some of the systematic bits that were included in the first redundancy version in subsequent redundancy versions. Therefore, for some of the systematic bits of the encoded message, the receiving station can perform decoding using information from multiple transmissions.

Process 700 may then continue to step 712 in which the transmitting station determines whether an ACK signal has been received following transmission of the second redundancy version. If the transmitting station determines that an ACK signal has been received, process 700 may move to step 708 and end. Otherwise, the receiving station still may not have successfully recovered the message, and therefore process 700 moves to step 714.

At step 714, the transmitting station transmits a third redundancy version of the message. In the third redundancy version, the transmitting station may generate for transmission a redundancy version that includes all the parity bits that were not included in the first or the second redundancy versions. Thus, following receipt of the third redundancy version the receiving station may have information on all of the systematic, parity 1, and parity 2 bits. Since the transmitting station may include a total of M bits for transmission in the third redundancy version, in some embodiments, the transmitting station may allocate any remaining bit positions to some of the bits (e.g., systematic, parity 1, and/or parity 2 bits) that were included in the first redundancy version.

Then, process 700 may move to step 718, where the transmitting station may again determine whether an ACK signal has been received. If an ACK is received, process 700 may end at step 708. If a NACK signal or no acknowledgement is received, process 700 may return to step 704 and retransmit the first redundancy version. Thus, the transmitting station may transmit the first, second, and third redundancy versions in order until an ACK signal is received from the receiving station, or until the transmitting station has retransmitted these redundancy versions a predetermined number of times.

It should be noted that the flowcharts of processes 600 (FIG. 6) and 700 (FIG. 7) are merely illustrative. Any of the steps may be modified, removed, or combined, or any additional steps may be modified, without departing from the scope of the present disclosure. For example, the steps of either flowchart may be modified to use a retransmission protocol other than a HARQ protocol for transmitting the different redundancy versions.

Referring now to FIGS. 8 and 9, two examples are shown illustrating the redundancy versions of a message that may be generated from executing processes 600 (FIG. 6) and 700 (FIG. 7). In particular, FIG. 8 illustrates the rate matching that generates two redundancy versions when the code rate of the system is 0.50, and FIG. 9 illustrates the rate matching that generates three redundancy versions when the code rate of the system is 0.75. It should be understood that the examples of FIGS. 8 and 9, as well as any other similar rate matching illustrations in later figures, merely illustrate the constitution of redundancy versions. The illustrations are not intended to illustrate the order of the bits in each redundancy version, and should not be limited to such.

FIG. 8 illustrates the generation of redundancy versions 830 and 840 from systematic bits 800, parity 1 bits 810, and parity 2 bits 820. The code rate in this example is 0.5, and therefore, systematic bits 800, parity 1 bits 810, and parity 2 bits 820 are each half the bit length of M, the number of bits in each redundancy version. After rate matching, a first redundancy version, RV1 830, is produced, where half of the bit positions include all systematic bits 850, and the remaining half are allocated to parity bits 860 in some suitable proportion. Systematic bits 850 may be the same as systematic bits 800, while parity bits 860 may be allocated between parity 1 bits 810 and parity 2 bits 820 in some suitable proportion (e.g., half parity 1 bits and parity 2 bits).

The second redundancy version, RV2 840, may exclude all parity bits 840 that were included in RV1 830 until there are no more unallocated parity bits. Therefore, due to the 0.5 code rate, half of the bit positions in RV2 840 are allocated to previously unused parity bits. The remaining bit positions 880 in RV2 are used for bits that were included in RV1 830. For example, remaining bit positions 880 may include all of systematic bits 850, all of parity bits 860, or part of both systematic bits 850 and parity bits 860 in some suitable proportion. One way for a rate matcher to select bits for RV2 840 will be described below in connection with FIG. 10.

FIG. 9 illustrates the generation of redundancy versions 930, 940, and 950 from systematic bits 900, parity 1 bits 910, and parity 2 bits 920. The code rate in this example is 0.75, and therefore, systematic bits 900, parity 1 bits 910, and parity 2 bits 920 are each ¾ of bit length of M, the number of bits in each redundancy version. After rate matching, a first redundancy version, RV1 930, is produced, where ¾ of the bit positions therein are allocated to systematic bits 960, and the remaining quarter of the bit positions in RV1 930 are allocated to parity bits 970 in some suitable proportion. Systematic bits 960 may be the same as systematic bits 900, while the parity bits may be allocated to parity 1 bits 910 and parity 2 bits 920 in some suitable proportion (for example, half parity 1 bits, and half parity 2 bits).

The second redundancy version, RV2 940, may include parity bits 970 which are selected from parity 1 bits 910 and/or parity 2 bits 920. In an embodiment, parity bits 970 may initially exclude parity bits that were included in RV1 930. In some embodiments, in addition to parity bits 970, RV2 may include a portion of the systematic bits that were included in RV1, although this may not be the case.

Turning to the third redundancy version in FIG. 9, RV3 950 includes parity bits 980, which is composed of parity 1 bits 910 and/or parity 2 bits 920 that were not included in RV1 930 or RV2 940. For a code rate of 3.75, there may still be space in RV3 950 even after all of the previously unused parity bits are selected for parity bits 980. In an embodiment, these remaining bit positions 990 are allocated to a portion of the bits that were included in RV1 930. For example, remaining bit positions 990 may include only systematic bits 900, only parity 1 bits 910 and/or parity 2 bits 920, or both systematic bits and parity bits in some suitable proportion.

Figure 10:
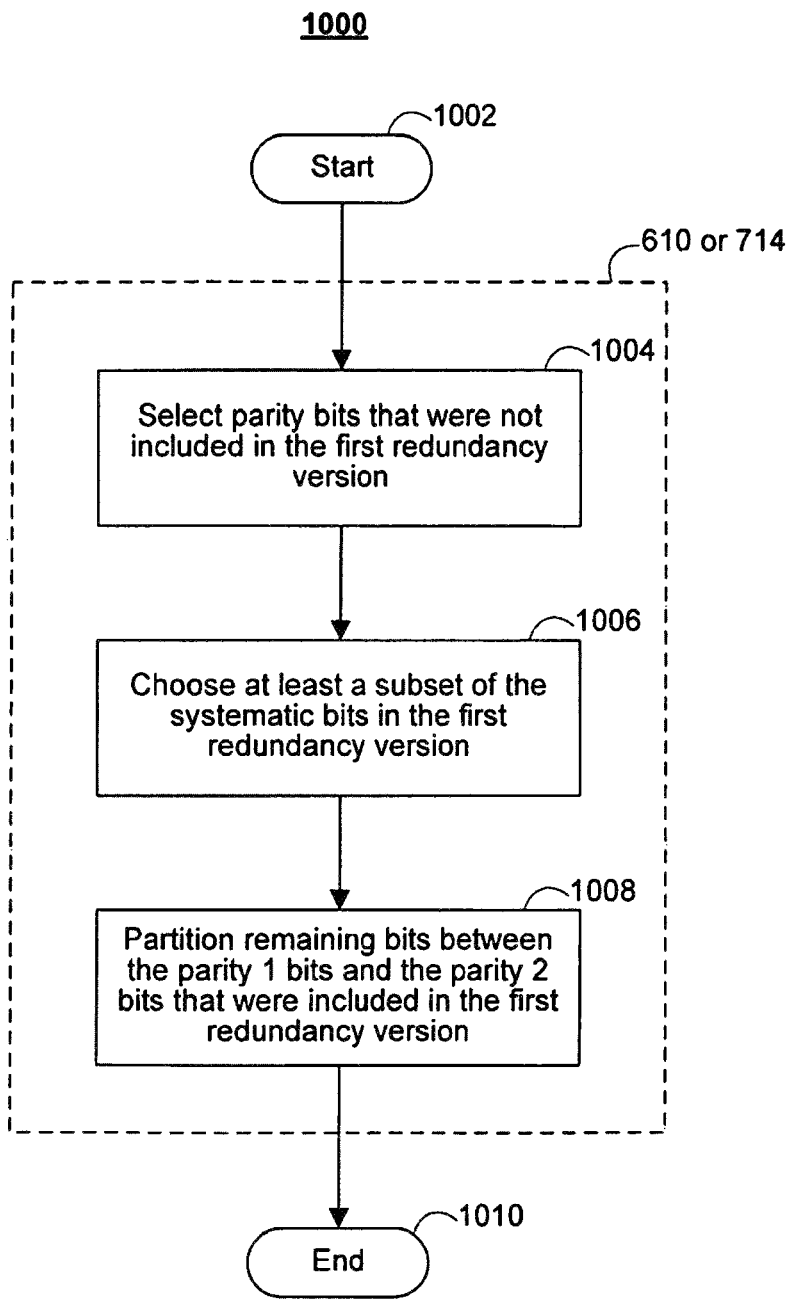
FIG. 10 is a flowchart of an illustrative process for selecting systematic and parity bits to include in the last redundancy version.

FIG. 10 shows an illustrative flowchart of process 1000 for selecting bits for inclusion in a final redundancy version (e.g., RV2 for systems with R≤0.66, RV3 for systems with R>0.66). The steps of process 1000 may be a more detailed view of step 610 in process 600 (FIG. 6) or step 714 in process 700 (FIG. 7). The steps of process 1000 may be performed by a suitable rate matcher (e.g., enhanced rate matcher 104 of FIG. 1, etc.), and may be the steps used by the rate matcher to generate RV2 840 in FIG. 8 or RV3 950 of FIG. 9.

Process 1000 begins at step 1002 and may continue to step 1004. At step 1004, the rate matcher may select parity bits (e.g., parity 1 bits and/or parity 2 bits) that were not included in a first redundancy version. Thus, after the final redundancy version is transmitted, the corresponding receiving station may have information on all of the bits in an encoded message. After these parity bits are selected, there may still be remaining bit positions available in the final redundancy version. Therefore, at step 1006, the rate matcher may choose at least a subset of the systematic bits that were included in the first redundancy version. For example, the rate matcher may choose all of the systematic bits for inclusion in the final redundancy version, or may choose only a portion of the systematic bits that were included in a previous redundancy version. Process 1000 may then continue to step 1008 in which the rate matcher partitions any remaining bit positions in the final redundancy version to parity 1 bits and parity 2 bits that were included in the first redundancy version. For example, the rate matcher may allocate approximately half of the remaining bits to parity 1 bits, and may allocate the remaining approximately half to parity 2 bits. Process 1000 then moves to step 1010 and ends.

As described above, in one embodiment, when a rate matcher generates three redundancy versions, any remaining space in the third redundancy version, after all of the parity bits that were not included in the other redundancy version are added to RV3, is allocated to bits included in RV1. In one embodiment, 30% of the systematic bits of the encoded message are included in RV3. In other embodiments of the present invention, the rate matcher may allocate at least some of the remaining space to bits included in RV2. The selection of bits for inclusion in RV3 may be done so as to maximize the probability that the corresponding receiving station can recover the transmitted message even if the first redundancy version is not successfully received (e.g., due to failure to interpret the header).

Figure 11:
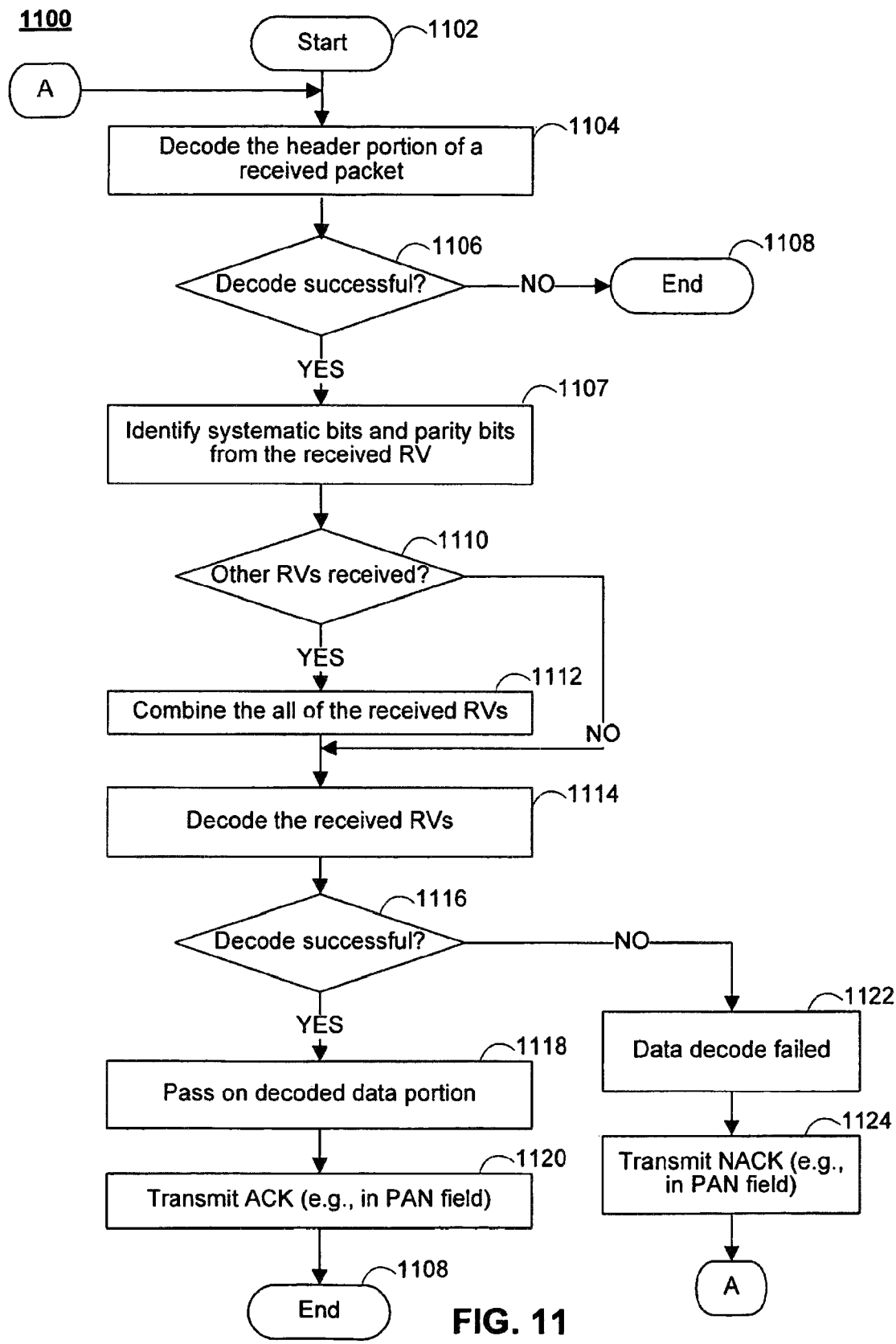
FIG. 11 is a flowchart of an illustrative process for decoding a plurality of received redundancy versions that collectively include all bits of an encoded message, where the plurality of redundancy versions are received using a HARQ protocol.

Referring now to FIG. 11, an illustrative flowchart of process 1100 is shown for decoding received redundancy versions at a receiving station (e.g., mobile station 106 of FIG. 1 or mobile station 300 of FIG. 3) using a HARQ protocol. The redundancy versions received by the receiving station may have been generated using any of the techniques described above in connection with FIGS. 4-10.

Process 1100 begins at step 1102 and proceeds to step 1104. At step 1104, the receiving station decodes the header portion of a received packet. The header may include a BSN which identifies the message being transmitted in the data portion of the received packet. At step 1106, the receiving station determines whether the decoding is successful. For example, the receiving station may determine whether the BSN has been successfully identified from decoding the header. If the decode is not successful, process 1100 ends at 1108 without the receiving station obtaining any information from the transmitted redundancy version.

If, at step 1106, the receiving station determines that the header portion has been successfully decoded, process 1100 moves to step 1107. At step 1107, the receiving stations may identify the bits of the received redundancy version. In particular, a rate matcher within the receiving station may be used to identify which bit positions of the encoded message are included in the received redundancy version. The rate matcher in the receiving station may identify these bits using the same bit selection technique applied by corresponding rate matcher in the transmitting station to generate the redundancy versions. (Step 1107 is described in more detail with respect to the process illustrated below in FIG. 34) Then, at step 1110, the receiving station may determine whether other redundancy versions associated with the same message have been received. For example, the receiving station may compare the BSN of the received redundancy version with the BSN of previously received redundancy versions. If other redundancy versions have not been received, process 1100 skips step 1112 and proceeds to step 1114. At step 1114, the receiving station decodes the data portion of the received packet. That is, when step 1112 is skipped, the receiving station performs decoding using only one redundancy version.

If, at step 1110, the receiving station instead determines that other redundancy versions have been received, process 1100 continues to step 1112 in which the receiving station combines the data portions (e.g., the redundancy versions) of all the received packets. For example, the receiving station may use incremental redundancy (IR) combining to combine bits that are included in one redundancy version but not other redundancy versions, and may use Chase combining or any other symbol-level or bit-level combining to combine bits that are included in multiple redundancy versions. If the receiving station has received and successfully decodes the headers of all two (for R≤0.66) or all three (for 0.66<R≤1) redundancy versions, the receiving station has information on all of the bits in the encoded message. Thus, at step 1114, the receiving station can decode the combined redundancy version that has information on the full encoded message.

After decoding at step 1114, process 1116 continues to step 1116. At step 1116, the receiving station determines whether decoding the data portion was successful. For example, the receiving station may determine whether any errors can be detected in the decoded message. If the receiving station determines that decoding was not successful, the receiving station may perform any steps necessary after decoding failure at step 1112. For example, the receiving station may discard the erroneously decoded packet, or the receiving station may save the erroneously decoded packet to combine with the next redundancy version that is received. Then, at step 1124, the receiving station may transmit a NACK back to the transmitting station to request transmission of another redundancy version. The receiving station may transmit the NACK signal with other packet data that the receiving station needs to transmit to the transmitting station. Therefore, the NACK signal may be transmitted in a "piggy-backed ACK/NACK" (PAN) field of the packet data. Process 1100 may then return to step 1104 to decode the next packet received from the transmitting station.

Returning to step 1116, if the receiving station determines instead that the data portion of the received packet has been successfully decoded, process 1100 may move to step 1118. At step 1118, the receiving station may pass on the decoded data portion from the communications circuitry of the receiving station to modules of the receiving station that use this information. The receiving station may also transmit, at step 1120, an ACK signal back to the transmitting station to inform the transmitting station that the message has been successfully received. In some embodiments, the receiving station may transmit the ACK signal in a PAN field. Process 1100 may then end at step 1108.

In some embodiments, a variable, referred to as a flip variable, may be used by a rate matcher within a transmitting station or receiving station when generating each redundancy version. The value of the flip variable may cause the rate matcher to exclude or include particular bits, typically parity bits, in a redundancy version. For example, the rate matcher may set flip to zero to exclude bits from being selected for a current redundancy version that have already been included in a previous redundancy version. The rate matcher may instead set flip to one so that all bits that were not included in a previous redundancy version may be selected in the current redundancy version. Using the flip variable, the rate matcher may generate redundancy versions where all bits in the encoded message are selected for inclusion in at least one redundancy version, such as the redundancy versions illustrated in FIGS. 8 and 9.

Figure 12A:
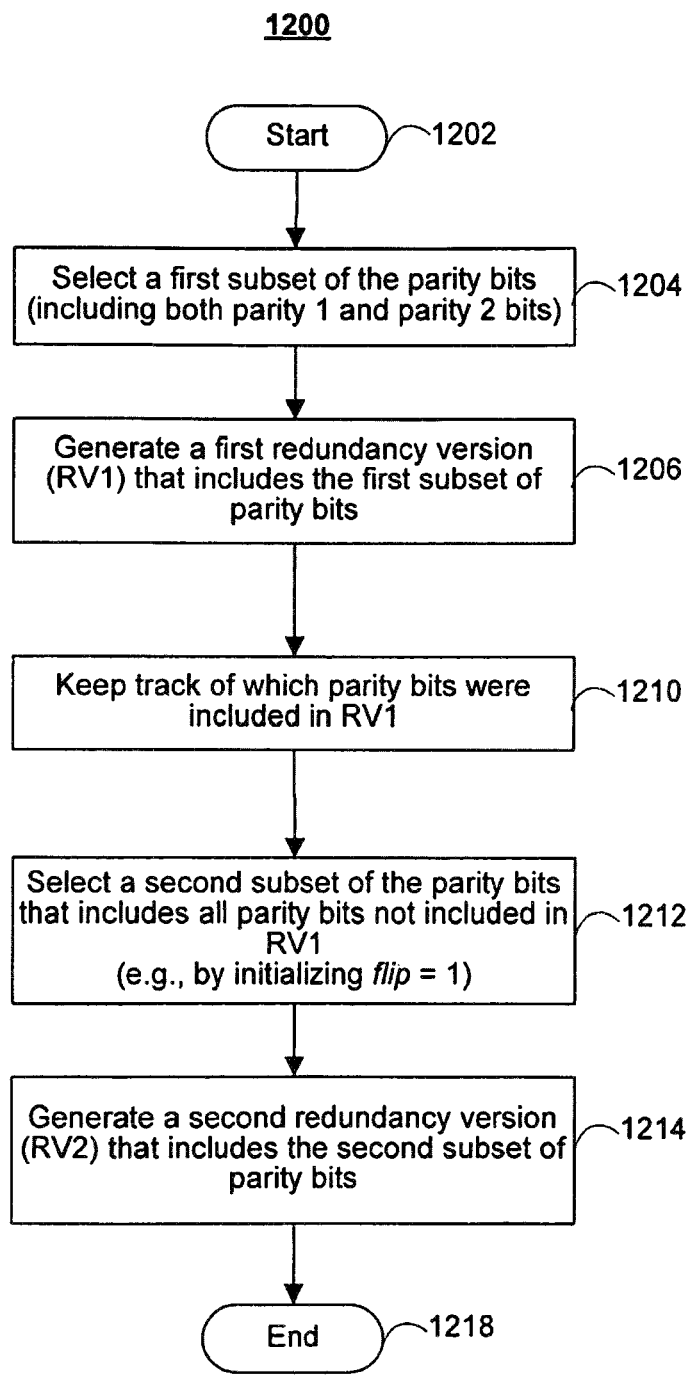
FIG. 12A is a flowchart of an illustrative process for using a flip variable when two redundancy versions are need to transmit all bits of an encoded message.

FIG. 12A shows an illustrative flowchart of process 1200 in which a rate matcher within a suitable transmitting or receiving station uses a flip variable to select parity bits for inclusion in two redundancy versions (e.g., when R≤0.66). The rate matcher may select systematic bits in the manner described above, where all of the systematic bits are chosen for inclusion in the first redundancy version, or may select systematic bits using any of the techniques described below. Thus, while process 1200 is directed to the selection of parity bits, it should be understood that systematic bits are also included in the redundancy versions, and can be selected using any of a variety of approaches. In some embodiments, the selection of parity bits proceeds independently of the selection of systematic bits.

Process 1200 may begin at step 1202 and continue to step 1204. At step 1204, a rate matcher, may select a first subset of the parity bits for inclusion in a first redundancy version. The parity bits may include parity 1 bits and parity 2 bits in any suitable proportion (e.g., half parity 1 bits and half parity 2 bits). Then, at step 1206, the rate matcher may generate the first redundancy version that includes the first subset of the parity bits, as well as all or a portion of the systematic bits. The rate matcher may keep track of which bits were included in RV1 at step 1210. For example, the rate matcher may maintain a binary vector that indicates which parity bits were included in RV1.

Process 1200 may then continue to step 1212, where the rate matcher may select a second subset of parity bits for inclusion in a second redundancy versions. When only two redundancy versions are generated, the rate matcher may choose all of the parity bits (e.g., parity 1 and/or parity 2 bits) that were not included in the first redundancy version for inclusion in the second redundancy version. For example, the rate matcher may initialize the flip variable to one, and may use the binary vector generated at step 1210 to ensure that all of the bits not selected for RV1 are now selected for RV2.

At step 1214, the rate matcher, may generate the second redundancy version. The second redundancy version includes the second subset of parity bits selected at step 1212, as well as all or a portion of the systematic bits. Therefore, after the second redundancy version is generated at step 1214, all of the parity bits may be included in at least one of the two redundancy versions. Process 1200 may then end at step 1218.

Figure 12B:
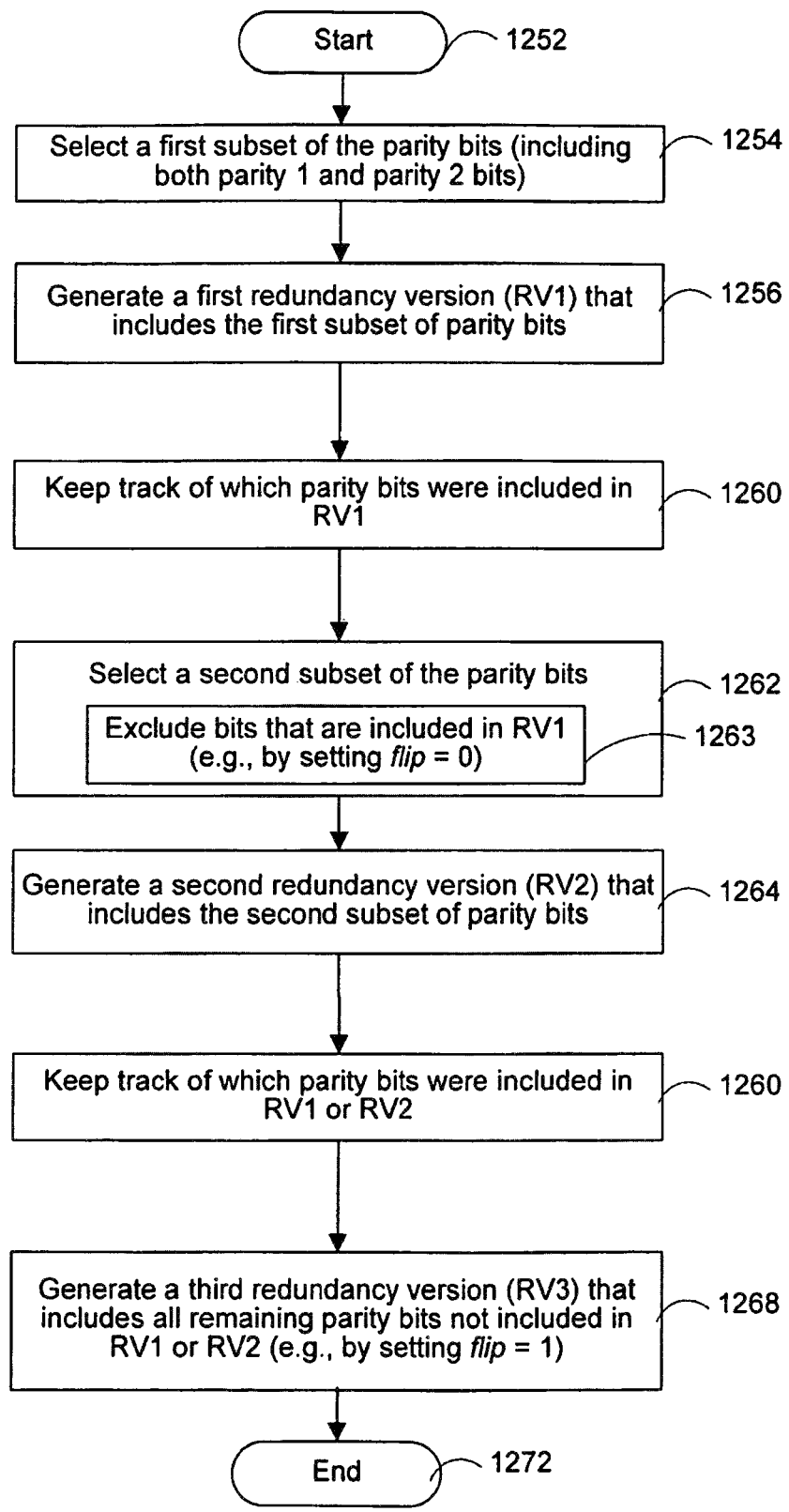
FIG. 12B is a flowchart of an illustrative process for using a flip variable when three redundancy versions are needed to transmit all bits of an encoded message, where the parity bits that were included in a first redundancy version are excluded from the second redundancy version using the flip variable.

FIG. 12B shows an illustrative flowchart of process 1250 in which a rate matcher within a suitable transmitting or receiving station uses a flip variable to select parity bits for inclusion in three redundancy versions (e.g., when 0.66<R≤1). The rate matcher may select systematic bits in the manner described above, where all of the systematic bits are included in the first redundancy version, or may select systematic bits using any of the techniques described below. Thus, while process 1250 is directed to the selection of parity bits, it should be understood that the systematic bits can be included in the redundancy versions and selected using any of a variety of approaches.

Process 1250 begins at step 1252 and proceeds to step 1254. At step 1254, the rate matcher, may select a first subset of the parity bits for inclusion in a first redundancy version. The first subset of parity bits may include both parity 1 bits and parity 2 bits. Then, at step 1256, the rate matcher may generate the first redundancy version that includes the first subset of the parity bits, as well as all or a portion of the systematic bits. The rate matcher may keep track of which bits were included in RV1 at step 1260. For example, the rate matcher may maintain a binary vector that indicates which parity bits were included in RV1.

Process 1250 may then continue to step 1262, where the rate matcher may select a second subset of parity bits for inclusion in a second redundancy version. The rate matcher may select only those parity bits for the second subset that were not included in the first redundancy version. Note, however, that if additional parity bits are required to complete a redundancy version, and all of the parity bits are included either in the first subset or the second subset, then parity bits included in the first subset may also be selected again for inclusion in the second subset. In particular, step 1262 may include step 1263, where the rate matcher excludes those bits that were included in RV1 from being selected for the second subset. To execute step 1263, the rate matcher may initialize the flip variable to zero, which may cause the rate matcher to automatically discard any of the parity bits that the binary vector generated at step 1260 indicates has already been included in RV1. By including only those parity bits that have not already been included in another redundancy version, the rate matcher ensures that all of the remaining parity bits not selected for RV1 or RV2 will fit into the M bits of RV3.

Then, at step 1264, the rate matcher may generate the second redundancy version. The second redundancy version includes the second subset of parity bits selected at step 1262, as well as all or a portion of the systematic bits. At step 1260, the rate matcher may keep track of which parity bits have now been included in either RV1 or RV2. For example, the rate matcher may generate a binary vector that indicates which parity bits have already been included in a redundancy version.

Process 1250 may then continue to step 1268, where the rate matcher generates a third redundancy version. The rate matcher may generate the third redundancy version using a similar technique as that used to generate the second redundancy version when R≤0.66, as described above in connection with FIG. 12A. In particular, the rate matcher may select a third subset of the parity bits that includes all of the parity bits (e.g., parity 1 and/or parity 2 bits) that were not included in RV1 or RV2. For example, the transmitting station's rate matcher may initialize the flip variable to one, and may use the binary vector generated at step 1260 to ensure that all of the bits not selected for RV1 or RV2 are now selected for RV3. In accordance with an embodiment, if all of the parity bits are already included in one of RV1 or RV2, then the technique used to select parity bits for RV1 may be repeated, or some other suitable technique employed. Thus, after the third redundancy version is generated at step 1267, all of the parity bits may be included in at least one of the three redundancy versions. Process 1150 may then end at step 1272.

It should be noted that process 1200 (FIG. 12A) and 1250 (FIG. 12B), as well as any other processes provided in this disclosure, are merely illustrative. Any of the steps of these processes may be modified, combined, or removed, or any additional steps may be added, without departing from the scope of the present invention. For example, steps may be added to implement a HARQ protocol, or any other retransmission protocol, for transmitting the different redundancy versions.

FIG. 13 shows Table 1 of values for the flip variable that are initialized by a rate matcher when generating redundancy versions. Table 1 includes a row for each of the different data streams—e.g., the streams of systematic bits, parity 1 bits, and parity 2 bits. The columns of Table 1 represent four different types of redundancy versions that may be generated by the rate matcher. In particular, when $R_{max}=2$, the rate matcher may generate a first redundancy version (RV1) and a type-I second redundancy version (RV2-I). When $R_{max}=3$, the rate matcher may generate a first redundancy version (RV1), a type-II second redundancy version (RV2-II), and a third redundancy version (RV3). For the parity 1 and parity 2 bits, the values in Table 1 correspond to those described above in connection with process 1200 (FIG. 12A) and 1250 (FIG. 12B). For example, in accordance with an embodiment, flip may be initialized to one for RV2-I so that all parity bits not previously included in RV1 are selected for RV2-II. On the other hand, the flip variable may be set to zero for RV2-II so that all bits that were included in RV1 are not selected for RV2-II.

Table 1 shows that the flip variable may be initialized to different values for systematic bits than for parity bits in some embodiments of the present invention. The particular flip values shown in Table 1 for the systematic bits enable the rate matcher to generate redundancy versions similar to those shown in FIGS. 8 and 9, described above. In particular, by initializing the flip variable to one in RV2-I, RV2-II, and RV3, the rate matcher does not exclude systematic bits that were included in the first redundancy version from being selected for any of the later redundancy versions.

In some embodiments, a rate matcher selects only a portion of the systematic bits to include in a first redundancy version. In these embodiments, the rate matcher may allocate the remaining systematic bits to the second redundancy version, or to both the second redundancy version and the third redundancy version (if $R_{max}=3$). The rate matcher may select a sufficiently large proportion of the systematic bits (e.g., 95%, 90%, 85%, etc.) for inclusion in the first redundancy version to maintain a high probability that a receiving station will be able to successfully decode the first redundancy version. By leaving some of the systematic bits for the second and/or third redundancy versions, the probability that a receiving station can successfully recover the message after receiving the second or third redundancy version is increased, particularly in the event that the header portion of the first redundancy version is not successfully decoded by the receiving station.

The rate matcher may define a variable, referred to as a swap variable, that represents the percentage of the systematic bits that are not included in the first redundancy version, but rather in one or more of the other redundancy versions. In other words, the swap value corresponds to a partitioning of systematic bits, between a first redundancy version and another redundancy version. FIG. 13 shows Table 2 of rate matching parameters for a plurality of transmission schemes (e.g., DAS-5, DAS-10, DBS-5, DBS-6, DBS-8, where DAS-5 and DAS-10 are EGPRS2 Downlink level A modulation and coding schemes and DBS-5, DBS-6, and DBS-8 are EGPRS2 Downlink level B modulation and coding schemes) available for use by the transmitting station and corresponding receiving station. These transmission schemes may represent some or all of the available transmission schemes that have non-zero swap values. In some embodiments, the transmitting station and receiving station may also have available transmission schemes with zero-valued swap variables. The first column of Table 2 includes the swap values for each of the transmission schemes having non-zero swap values. In this table, some of the transmission schemes have a swap value of 5%, indicating that 5% of the systematic bits are removed, or "punctured," from the first redundancy version and included in one of the other redundancy versions. The remaining transmission schemes have a swap value of 15%, indicating that 15% of the systematic bits are punctured from the first redundancy version.

The available transmission protocols may also define the particular Turbo coding and modulation scheme used by the transmitting station and receiving station, as well as other transmission parameters. Thus, the remaining columns of Table 2 show the number of systematic bits used in the transmission protocol, as well as the number of total bits that can be included in each redundancy version when a PAN field is not included ($M_{NO\_PAN}$) and when a PAN field is included ($M_{PAN}$).

Figure 14:
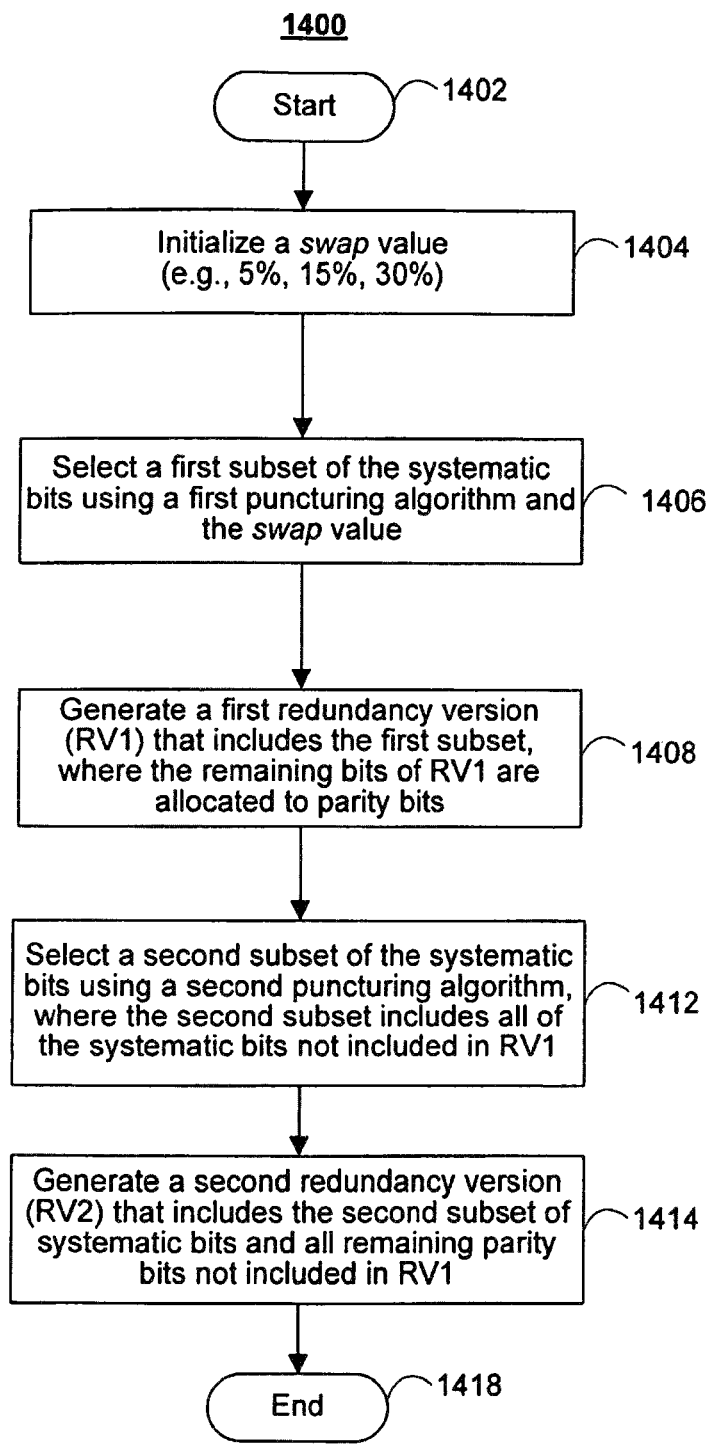
FIG. 14 is a flowchart of an illustrative process for generating two redundancy versions, where a non-zero swap value is used such that neither redundancy version includes all of the systematic bits.
Figure 15:
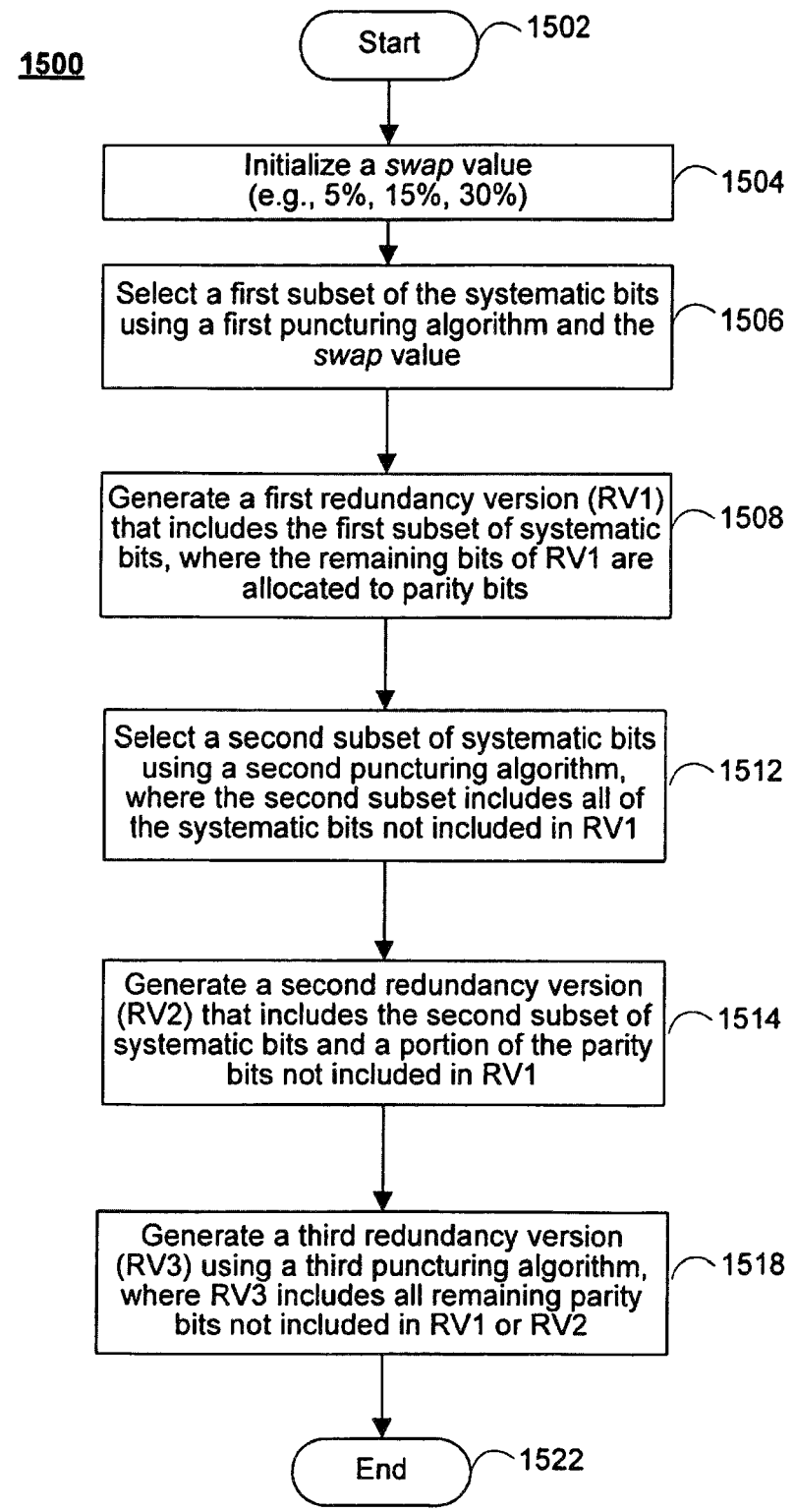
FIG. 15 is a flowchart of an illustrative process for generating three redundancy versions, where a non-zero swap value is used such that none of the redundancy versions includes all of the systematic bits.

FIGS. 14 and 15 show illustrative flowcharts of processes for generating redundancy versions using non-zero swap values when $R_{max}=2$ and $R_{max}=3$, respectively. Referring first to FIG. 14, the flowchart for process 1400 is shown, which may be executed by any suitable rate matcher (e.g., enhanced rate matcher 253 of FIG. 2 or enhanced rate matcher 353 of FIG. 3). Process 1400 begins at step 1402 and proceeds to step 1404. At step 1404, the rate matcher may initialize a swap value. The rate matcher may initialize the swap value based on the particular transmission protocol being used. The swap value may be a zero-valued swap value or any suitable non-zero-valued swap value (e.g., 5%, 15%, 30%, etc.). For example, if the rate matcher employs a DAS-5 transmission protocol with the rate matching parameters shown in the first row of Table 2 (FIG. 13), the rate matcher may initialize the swap variable to 5%.

Then, at step 1406, the rate matcher may select a first subset of the systematic bits using a first puncturing algorithm and the swap value. The percentage of the systematic bits selected for the first subset is based on the value of the swap value initialized at step 1402. For example, if the rate matcher employs the DAS-5 transmission protocol, the rate matcher may select 466*0.95=443 systematic bits for inclusion in the first subset. At step 1408, the rate matcher may generate a first redundancy version that includes the first subset of systematic bits. The remaining bits available in the first redundancy version are allocated to parity bits (e.g., parity 1 and/or parity 2 bits). For example, if the rate matcher transmitting station employs the DAS-5 protocol-without PAN, the $M_{NO\_PAN}=$ 1248 bits of RV1 may include the 443 systematic bits selected at step 1406 and 805 parity bits.

Process 1400 may then continue to step 1412, where the rate matcher selects a second subset of the systematic bits using a second puncturing algorithm. The second subset of systematic bits includes all the remaining systematic bits that were not included in the first redundancy version. For example, in accordance with an embodiment, if the transmitting station employs the DAS-5 protocol, the rate matcher may include the 23 bits that were not selected for RV1 in the second subset. Then, at step 1414, the rate matcher may generate a second redundancy version that includes the second subset of systematic bits and all parity bits based on a flip parameter as described above. For example, in an embodiment, the second redundancy version may be generated so that it includes all of the parity bits not included in RV1. Any space remaining in the second redundancy version may be allocated to the systematic and/or parity bits that were included in the first redundancy version. Process 1400 may then end at step 1418.

FIG. 15 shows an illustrative flowchart of process 1500 for generating redundancy versions using a non-zero swap value when $R_{max}=3$. The steps of process 1500 may be executed by any suitable rate matcher (e.g., enhanced rate matcher 253 of FIG. 2 or enhanced rate matcher 353 of FIG. 3). Process 1500 begins at step 1502 and proceeds to step 1504. At step 1504, the rate matcher initializes a swap value. The rate matcher may initialize the swap value based on the particular transmission protocol being used, and the swap value may be a zero-valued swap value or any suitable non-zero-valued swap value (e.g., 5%, 15%, 30%, etc.). For example, in accordance with an embodiment, if a rate matcher employs a DBS-6 transmission protocol with a PAN field, and with the rate matching parameters shown in the fourth row of Table 2 (FIG. 13), the rate matcher may initialize the swap variable to 15%.

Then, at step 1506, in accordance with an embodiment, the rate matcher may select a first subset of the systematic bits using a first puncturing algorithm and the swap value. The percentage of the systematic bits selected for the first subset is based on the value of the swap value initialized at step 1402. For example, if a rate matcher employs the DBS-6 transmission protocol, the rate matcher may select 610*0.85=519 systematic bits for inclusion in the first subset. At step 1508, the rate matcher may generate a first redundancy version that includes the first subset of systematic bits. The remaining bits available in the first redundancy version are allocated to parity bits (e.g., parity 1 and/or parity 2 bits). For example, if a transmitting station employs the DAS-5 protocol with PAN, the $M_{PAN}$=876 bits of RV1 may include the 519 systematic bits selected at step 1506 and 357 parity bits.

Process 1500 may then continue to step 1512, where the rate matcher selects a second subset of the systematic bits using a second puncturing algorithm. The second subset of systematic bits includes all the remaining systematic bits that were not included in the first redundancy version. For example, if a rate matcher employs the DBS-6 protocol, the rate matcher may include the 91 systematic bits that were not selected for RV1 in the second subset. Then, at step 1514, the rate matcher may generate a second redundancy version that includes the second subset of systematic bits, as well as a portion of the parity bits (e.g., parity 1 and/or parity 2 bits) that were not included in the first redundancy version.

At step 1518, the rate matcher may generate a third redundancy version using a third puncturing algorithm. In an embodiment, the third redundancy version may include all of the parity bits that were not included in the first redundancy version or the second redundancy version. In some embodiments, any remaining bit locations in the third redundancy version, after all of the systematic, parity 1, and/or parity 2 bits have been included in one of the redundancy versions, may be allocated to any of the bits (e.g., systematic, parity 1, and/or parity 2 bits) that were included in RV1. Process 1500 may end at step 1522.

Referring now to FIGS. 16 and 17, two examples are shown illustrating the redundancy versions that may be generated by executing processes 1400 (FIG. 14) and 1500 (FIG. 15). In particular, FIG. 16 illustrates the rate matching that generates two redundancy versions when the code rate of the system is 0.5 and the swap value is 25%, and FIG. 17 illustrates the rate matching that generates three redundancy versions when the code rate of the system is 1.0 and swap value is 25%.

FIG. 16 illustrates the generation of redundancy versions 1630 and 1640 from systematic bits 1600, parity 1 bits 1610, and parity 2 bits 1620. 75% of systematic bits 1600 are selected for inclusion in RV1 1630. The remaining bit positions of RV1 1630 are allocated to parity 1 bits 1610 and parity 2 bits 1620 in some suitable proportion. For example, approximately half of the remaining bit positions in RV1 1630 not taken by systematic bits 1650 may be allocated to a portion of parity 1 bits 1610, while the other approximately half of the remaining bit positions may be allocated to a portion of parity 2 bits 1620.

The second redundancy version, RV2 1640, may include all remaining systematic bits 1660 that were not included in RV1 1630, as well as all remaining parity bits 1670 that were not included in RV1 1630. In particular, systematic bits 1660 includes the 25% of systematic bits 1600 that were not included in the first redundancy version, RV1 1630. Since the code rate of the system is 0.5, systematic bits 1660 and parity bits 1670 may take up only half of the M bit positions available in RV2 1640. Therefore, the remaining bit positions 1680 in RV2 1640 are allocated to bits (e.g., systematic, parity 1, and/or parity 2 bits in some suitable proportion) that were included in RV1 1630. In some embodiments, the bits of RV2 1640 may be selected in accordance with process 1000 (FIG. 10), described above.

FIG. 17 illustrates the generation of redundancy versions 1730, 1740, and 1750 from systematic bits 1700, parity 1 bits 1710, and parity 2 bits 1720. The code rate of the system in this example is 1.0, and therefore all of systematic bits 1700 could be included in RV1 1730 if some of the systematic bits were not purposely partitioned to RV2 due to the swap value. With a swap value of 25% in this example, 75% of the bits in RV1 1730 are taken by systematic bits 1760. Systematic bits 1760 of RV1 1730 may be selected from systematic bits 1700 using any suitable puncturing algorithm. The remaining 25% of the bits in RV1 1730 are allocated to parity 1 bits 1710 and parity 2 bits 1720 in some suitable proportion.

The second redundancy version, RV2 1740, can include systematic bits 1770. Systematic bits 1770 may be those of systematic bits 1700 that were not selected for inclusion in the first redundancy version, RV1 1730. Thus, due to the code rate of 1.0, 25% of the bits in RV2 1740 may be taken by systematic bits 1770, while the remaining 75% of RV2 1740 may be allocated to parity bits 1780 that were not selected for inclusion in RV1 1730. In particular, parity bits 1780 may include parity 1 bits 1710 and parity 2 bits 1720 in some suitable proportion, where these parity 1 and parity 2 bits were not included as part of RV1 1730. Finally, due to the high code rate, in accordance with an embodiment, RV3 1750 may include only parity bits 1790, wherein parity bits 1790 include all of the parity 1 bits 1710 and parity 2 bits 1720 that were not included in either RV1 1730 or RV2 1740.

In accordance with an embodiment of the present invention, a rate matcher (e.g., enhanced rate matcher 420 (FIG. 4) or enhanced rate matcher 540 (FIG. 5), etc.) can separately execute puncturing algorithms on the different data streams—systematic, parity 1, and parity 2 streams—to select bits for inclusion in a current redundancy version. For example, the rate matcher may loop through the systematic bits and selectively puncture a portion of the systematic bits such that the punctured bits are not included in the currently redundancy version. The rate matcher may then loop through the parity 1 bits, and then the parity 2 bits, in a similar fashion to selectively puncture bits.

Figure 18:
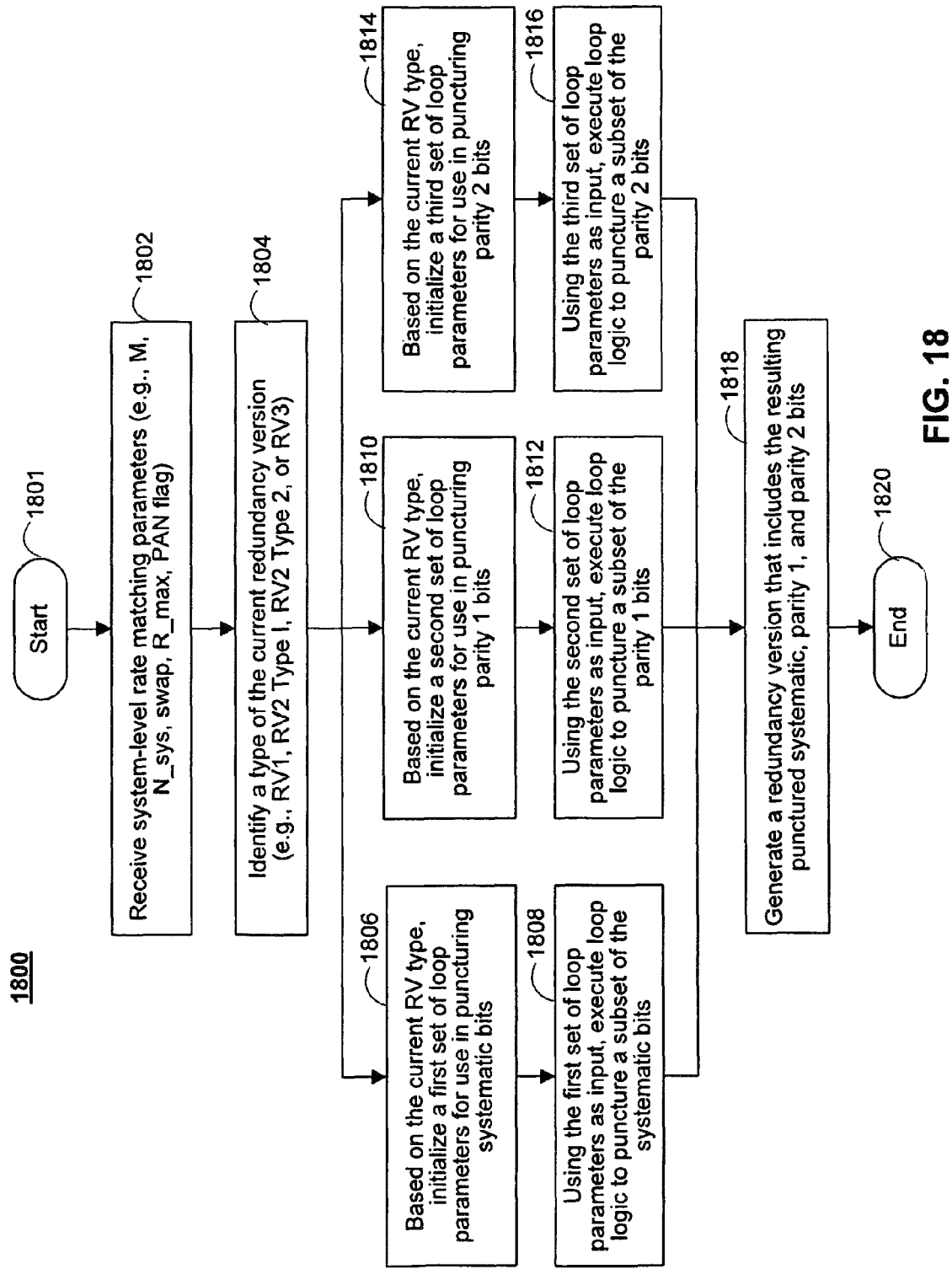
FIG. 18 is a flowchart of an illustrative process for generating a redundancy version by separately initializing loop parameters and separately running loop logic for the systematic, parity 1, and parity 2 bits.

FIG. 18 shows an illustrative flowchart of process 1800 for selecting systematic, parity 1, and parity 2 bits for inclusion in a current redundancy version, and generating the current redundancy version using the selected bits. The steps of process 1800 may be performed by any suitable rate matcher implemented on a transmitting station or a receiving station, for example, process 1800 begins at step 1801 and proceeds to step 1802. At step 1802, the rate matcher receives system-level rate matching parameters. The system-level rate matching parameters may be obtained from another component in the transmitting station or receiving station, and may be based on a particular transmission protocol. For example, the system-level rate matching parameters may include any of the parameters shown for the transmission protocols in Table 2 of FIG. 13 (e.g., swap, $N_w$, $M_{NO\_PAN}$, $M_{PAN}$). Other system-level rate matching parameters may include, for example, R and whether a PAN field should be included in the current redundancy version.

Then, at step 1804, the rate matcher can identify the type of the current redundancy version. In particular, using the value of $R_{MAX}$, the rate matcher may determine whether the current redundancy version is RV1, RV2 type I, RV2 type II, or RV3. Process 1800 may then proceed to one, two, or all three of steps 1806, 1810, and 1814. In particular, in some embodiments, the rate matcher may execute these steps concurrently or substantially concurrently. In other embodiments, the rate matcher may execute steps 1806 and 1808 before moving to steps 1810 and 1812, and may then execute steps 1814 and 1816 once steps 1810 and 1812 are complete. That is, the rate matcher may use a serial approach that takes more time to complete, but can use the same resources (e.g., hardware, circuitry, logic, etc.) to complete the computations at these steps.

At step 1806, the rate matcher may initialize a first set of loop parameters for use in puncturing the systematic bits. That is, the loop parameters may be used to enable the rate matcher to determine which systematic bits to exclude from the current redundancy version. The rate matcher may compute the values of the first set of loop parameters based on the type of the current redundancy version (as identified at step 1804), using computations (e.g., loop parameter computation equations) specific to systematic bit puncturing, and using the system-level rate matching parameters (as received at step 1802). The first set of loop parameters may include values for: flip, $e_{plus}$, $e_{minus}$, $e2_{plus}$, and $e2_{minus}$. The flip variable was described above in connection with FIGS. 12A-13. The remaining parameters will be described below in connection with FIGS. 19 and 20.

Then, at step 1808, the rate matcher may execute loop logic to puncture a subset of the systematic bits. The rate matcher may use the first set of loop parameters calculated at step 1806 as inputs into the loop logic. Using the loop logic, the rate matcher may loop through each of the systematic bits to determine whether each bit should be included in the current redundancy version. The determination for each bit is based at least partially on the first set of loop parameters. Thus, at the conclusion of the loop logic, the rate matcher may have punctured a subset of the systematic bits, leaving the remaining systematic bits to be included in the current redundancy version. Process 1800 may then proceed to step 1810 (for a serial implementation) or to step 1818 (for a parallel implementation).

At step 1810, the rate matcher may initialize a second set of loop parameters for use in puncturing the parity 1 bits. That is, the loop parameters may be used to enable the rate matcher to determine which parity 1 bits to exclude from the current redundancy version. The rate matcher may compute the values of the second set of loop parameters based on the type of the current redundancy version (as identified at step 1804), using computations (e.g., loop parameter computation equations) specific to parity 1 bit puncturing, and using the system-level rate matching parameters (as received at step 1802). The second set of loop parameters may include values for: flip, $e_{ini}$, $e_{plus}$, $e_{minus}$, $e2_{ini}$, $e2_{plus}$, and $e2_{minus}$, and T. The flip variable was described above in connection with FIGS. 12A-13. The remaining parameters will be described below in connection with FIGS. 19 and 20.

Then, at step 1812, the rate matcher may execute the loop logic to puncture a subset of the parity 1 bits. The rate matcher may use the second set of loop parameters calculated at step 1810 as inputs into the loop logic. Using the loop logic, the rate matcher may loop through each of the parity 1 bits to determine whether each bit should be included in the current redundancy version. The determination for each bit is based at least partially on the second set of loop parameters. Thus, even though the rate matcher may use the same loop logic implementation to puncture parity 1 bits as that used to puncture the systematic bits at step 1808, the different loop parameters used as input into the loop logic may cause the rate matcher to select a different number of parity 1 bits and at different bit positions. The different inputs may even cause the loop logic to execute a different puncturing algorithm, since the different loop parameters used for the parity 1 bits may cause the loop logic to branch off and execute a different portion of the logic. At the conclusion of the loop logic, the rate matcher may have punctured a subset of the parity 1 bits, leaving the remaining parity 1 bits to be included in the current redundancy version. Process 1800 may then proceed to step 1814 (for a serial implementation) or to step 1818 (for a parallel implementation).

At step 1814, the rate matcher may initialize a third set of loop parameters for use in puncturing the parity 2 bits. That is, the loop parameters may be used to enable the rate matcher to determine which parity 2 bits to exclude from the current redundancy version. The rate matcher may compute the values of the third set of loop parameters based on the type of the current redundancy version (as identified at step 1804), using computations (e.g., loop parameter computation equations) specific to parity 2 bit puncturing, and using the system-level rate matching parameters (as received at step 1802). The third set of loop parameters may include values for: flip, $e_{ini}$, $e_{plus}$, $e_{minus}$, $e2_{ini}$, $e2_{plus}$, and $e2_{minus}$, and T. The third set of loop parameters may be the same as or different from the second set of loop parameters. The flip variable was described above in connection with FIGS. 12A-13. The remaining parameters will be described below in connection with FIGS. 19 and 20.

Then, at step 1816, the rate matcher may execute the loop logic to puncture a subset of the parity 2 bits. The rate matcher may use the third set of loop parameters calculated at step 1814 as inputs into the loop logic. Using the loop logic, the rate matcher may loop through each of the parity 2 bits to determine whether each bit should be included in the current redundancy version. The determination for each bit is based at least partially on the third set of loop parameters. Thus, even though the rate matcher may use the same loop logic implementation to puncture parity 2 bits as that used to puncture the systematic bits at step 1808 or the parity 1 bits at step 1812, the different loop parameters used as input into the loop logic may cause the rate matcher to select a different number of parity 2 bits and/or bits at different bit positions. The different inputs may even cause the loop logic to execute a different puncturing algorithm, since the different loop parameters used for the parity 2 bits may cause the loop logic to branch off and execute a different portion of the logic. At the conclusion of the loop logic, the rate matcher may have punctured a subset of the parity 2 bits, leaving the remaining parity 2 bits to be included in the current redundancy version. Process 1800 may then proceed to step 1818.

With continued reference to FIG. 18, once the rate matcher reaches step 1818, the rate matcher may have identified all of the bits, whether systematic, parity 1, or parity 2 bits, that are to be included in the current redundancy version. At step 1818, the rate matcher may generate a redundancy version that includes the punctured systematic, parity 1, and parity 2 bits Process 1800 may then continue to step 1820 and end.

FIG. 19 shows Table 3 with a subset of the loop parameters that are calculated for the first, second, and third sets of loop parameters. In particular, Table 3 illustrates the computations that the rate matcher may perform to obtain values for the loop parameters, $e_{plus}$, $e_{minus}$, $e2_{plus}$, and $e2_{minus}$. These computations are based on internal parameters (e.g., $X_{ir,3}$, etc.) that the rate matcher computes using system-level rate matching parameters.

The loop parameters illustrated in Table 3 are loop error correction values. Generally, the loop logic operates by puncturing bits such that a desired puncturing ratio is achieved. For example, if a rate matcher allocates 150 bits for parity 1 bits, and there are 300 parity 1 bits to choose from, the loop logic will attempt to achieve a puncturing ratio of 0.50. The rate matcher uses the error correction values to achieve the desired puncturing ratio. In particular, while looping though all of the parity 1 bits (for example), the rate matcher can keep track of the difference between the current puncturing ratio and the desired puncturing ratio. Based on this difference, the rate matcher may incrementally adjust loop variable e by loop parameters $e2_{minus}$ and $e2_{plus}$ depending on whether a current bit has been punctured. The loop parameters $e2_{minus}$ and $e2_{plus}$ may be used to adjust the correction factors based on whether a PAN field is also being included. The $e2_{minus}$ and $e2_{plus}$ loop parameters will be described in greater detail below in connection with FIG. 23.

Since a different number of each type of bit (e.g., systematic, parity 1, and parity 2) are selected for each redundancy version, the desired puncturing ratio is different for each type of bit and for each type of redundancy version (e.g., RV1, RV2-I, RV2-II, and RV3). Thus, the internal parameters shown in Table 3 (FIG. 19) are computed using equations that are specific to systematic, parity 1, or parity 2 bits, and are also specific to the type of the current redundancy version. For example, in accordance with an embodiment, the rate matcher can compute the following internal parameters for use in generating the error values of a first redundancy version (RV1):

$$X_{i1,s} = N_w \quad (EQ. 5)$$

$$X_{i1,p1} = N_{p1} \quad (EQ. 6)$$

$$X_{i1,p2} = N_{p2} \quad (EQ. 7)$$

$$N_{r1,sys} = \min(\lceil (1 - \text{swap}) \cdot N_w \rceil, M) \quad (EQ. 8)$$

$$N_{r1,p1} = \left\lfloor \frac{M - N_{r1,w}}{2} \right\rfloor \quad (EQ. 9)$$

$$N_{r1,p2} = \left\lfloor \frac{M - N_{r1,w}}{2} \right\rfloor \quad (EQ. 10)$$

$$e_{ini} = \{(X_{ir,1} - \lfloor (r-1) \cdot e_{plus}/r_{max} \rfloor - 1) \bmod e_{lus}\} + 1 \quad (EQ. 10b)$$

$$e2_{ini} = \{(\tilde{X}_{ir,1} - \lfloor (r-1) \cdot e2_{plus}/r_{max} \rfloor - 1) \bmod e2_{plus}\} + 1 \quad (EQ. 10c)$$

In EQ. 6 and EQ. 7, $N_{p1}$ and $N_{p2}$ are equal to the number of parity 1 and parity 2 bits prior to rate matching, respectively, which may be same or close to $N_w$. Thus, the $X_{r1}$ variables show the initial number of systematic, parity 1, and parity 2 bits that are present prior to rate matching. The $N_{r1}$ variables refer to the number of bits of each type that are allocated for transmission in the first redundancy version. As shown in EQ. 8 through EQ. 10, all of the systematic bits except those swapped out of RV1 are included in the first redundancy version (if possible), while approximately half of the remaining bits in the size M (e.g., $M_{PAN}$ or $M_{NO\_PAN}$) redundancy version are allocated to parity 1 bits, and the other approximately half of the remaining bits are allocated to parity 2 bits.

EQS. 5 though 10c are computed using the system-level rate matching parameters defined by the transmission protocol used by the rate matcher. The values generated by these equations and any other loop parameters (e.g., flip) enable the rate matcher to select bits in accordance with processes 1400 (FIG. 14) and 1500 (FIG. 15), described above. The rate matcher may use other equations to compute loop parameters for the other redundancy versions (e.g., RV2-I, RV2-II, and RV3), which can be derived in a similar manner to EQS. 5 through 10c.

Figure 20:
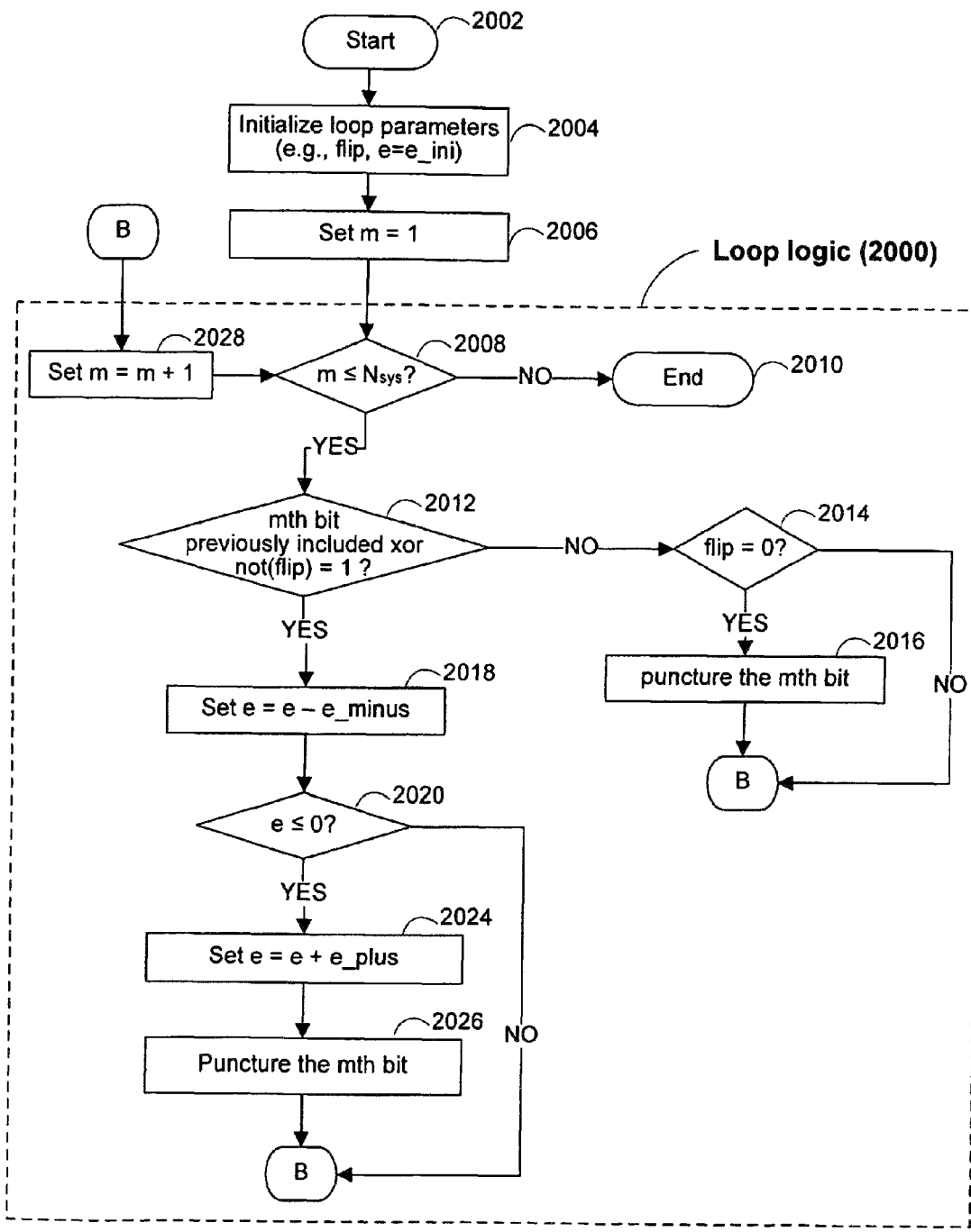
FIG. 20 is a flowchart of illustrative loop logic for looping through and selectively puncturing systematic, parity 1, and parity 2 bits in accordance with an embodiment of the present invention.

FIG. 20 shows an illustrative flowchart of a process that includes loop logic 2000. Loop logic 2000 may be executed by a rate matcher (e.g., enhanced rate matcher 104 or 108 of FIG. 1) to select bits for inclusion in a current redundancy version. In some embodiments, the rate matcher may execute loop logic 2000 to perform each of steps 1808, 1812, and 1816 of FIG. 18. Therefore, the rate matcher may include two or three implementations of loop logic 2000 if any of steps 1808, 1812, or 1816 are performed in parallel. Otherwise, the rate matcher may include one implementation of loop logic 2000, and may initiate loop logic 2000 each time one of steps 1808, 1812, or 1816 is performed. For simplicity in describing the process, FIG. 20 will be described in terms of selecting bits from a plurality of data bits. It should be understood that these data bits may refer to systematic bits, parity 1 bits, or parity 2 bits, depending on whichever step in FIG. 18 the rate matcher is currently performing.

The process of FIG. 20 begins at step 2002 and proceeds to step 2004. At step 2004, the rate matcher may initialize a set of loop parameters. The rate matcher may compute an initial error value, $e_{ini}$, which is used in conjunction with other loop parameters to achieve a desired puncturing ratios. The rate matcher may then set the current error value, e, to this initial error value. At step 2004, the rate matcher may also compute any of the loop parameters described above in connection with steps 1806, 1810, and 1814 (FIG. 18). Thus, the loop parameters may include any of the loop parameters described above in connection with FIGS. 18 and 19. These loop parameters, as well as some of the system-level rate matching parameters, are sufficient to initiate and run loop logic 2000 to completion.

Then, at step 2006, the rate matcher may set a loop variable, m, to one. The loop variable is used to index to a particular bit in the data stream. Thus, by setting m=1, the rate matcher initializes loop logic 2000 to start the loop by considering the first bit in the data stream.

Continuing to step 2008, the rate matcher determines whether the loop variable, m, is less than or equal to $N_w$. If the loop variable is greater than $N_w$, then loop logic 2000 has looped through all of the bits in the data stream. Therefore, loop logic 2000 ends at step 2010. Otherwise, loop logic 2000 continues to step 2012 in which the rate matcher computes;

$$m\text{th bit previously included xor not(flip)} \quad (EXPR. 1)$$

If the rate matcher determines that this expression, EXPR. 1, is not equal to one, loop logic 2000 moves to step 2014. At step 2014, the rate matcher determines whether the flip variable is equal to zero. If the flip variable is equal to zero, the rate matcher punctures the mth bit at step 2016 so that the mth bit is excluded from the current redundancy version. Loop logic 2000 then moves to step 2028 to consider the next bit in the data stream. Otherwise, if the rate matcher determines that the flip variable is equal to one, loop logic 2000 moves directly to step 2028 without puncturing the mth bit, thereby including the mth bit in the current redundancy version.

Returning to step 2012, if the rate matcher determines that EXPR. 1 equals one, loop logic 2000 instead continues to step 2018. At step 2018, the rate matcher adjusts the current error value, e, by subtracting the current error value by $e_{minus}$. Then, at step 2020, the rate matcher determines whether the current error value is less than zero. If not, the rate matcher does not puncture the mth bit, and loop logic 2000 moves to step 2028 to consider the next bit in the data stream. If, at step 2020, the rate matcher instead determines that the current error value is less than zero, this indicates that the mth bit should be punctured to maintain an appropriate error value. Thus, at step 2024, the rate matcher adjusts the current error value to indicate that the mth bit will be punctured. In particular, the rate matcher adds $e_{plus}$ to the current error value. Then, at step 2026, the rate matcher punctures the mth bit so that the mth bit is not included in the current redundancy version. Loop logic 2000 then moves to step 2028 to consider the next bit in the data stream.

To consider the next bit, the rate matcher increments the loop variable, m, at step 2028. Loop logic 2000 may then return to step 2008, where the above-described steps are performed for the next bit. Once all of the bits are considered, the rate matcher will end at step 2010.

Loop logic 2000 of FIG. 20 illustrates an example of logic that the rate matcher may execute to generate redundancy versions in accordance with any of the previously described processes. In particular, even though different algorithms are used to select bits depending on the current type of data and redundancy version, loop logic 2000 is configured such that the initialized flip variable (among other loop parameters) instructs the rate matcher to branch to particular steps in loop logic 2000 to execute the appropriate algorithm. Moreover, the values of $e_{ini}$, $e_{minus}$, and $e_{plus}$ initialized at step 2004 are able to dictate how many and which of the bits are excluded from the current redundancy version so that the appropriate number of bits are included in the current redundancy version. Loop logic 2000, therefore, represents a concise and efficient way to implement the rate matcher's selection logic.

Figure 22:
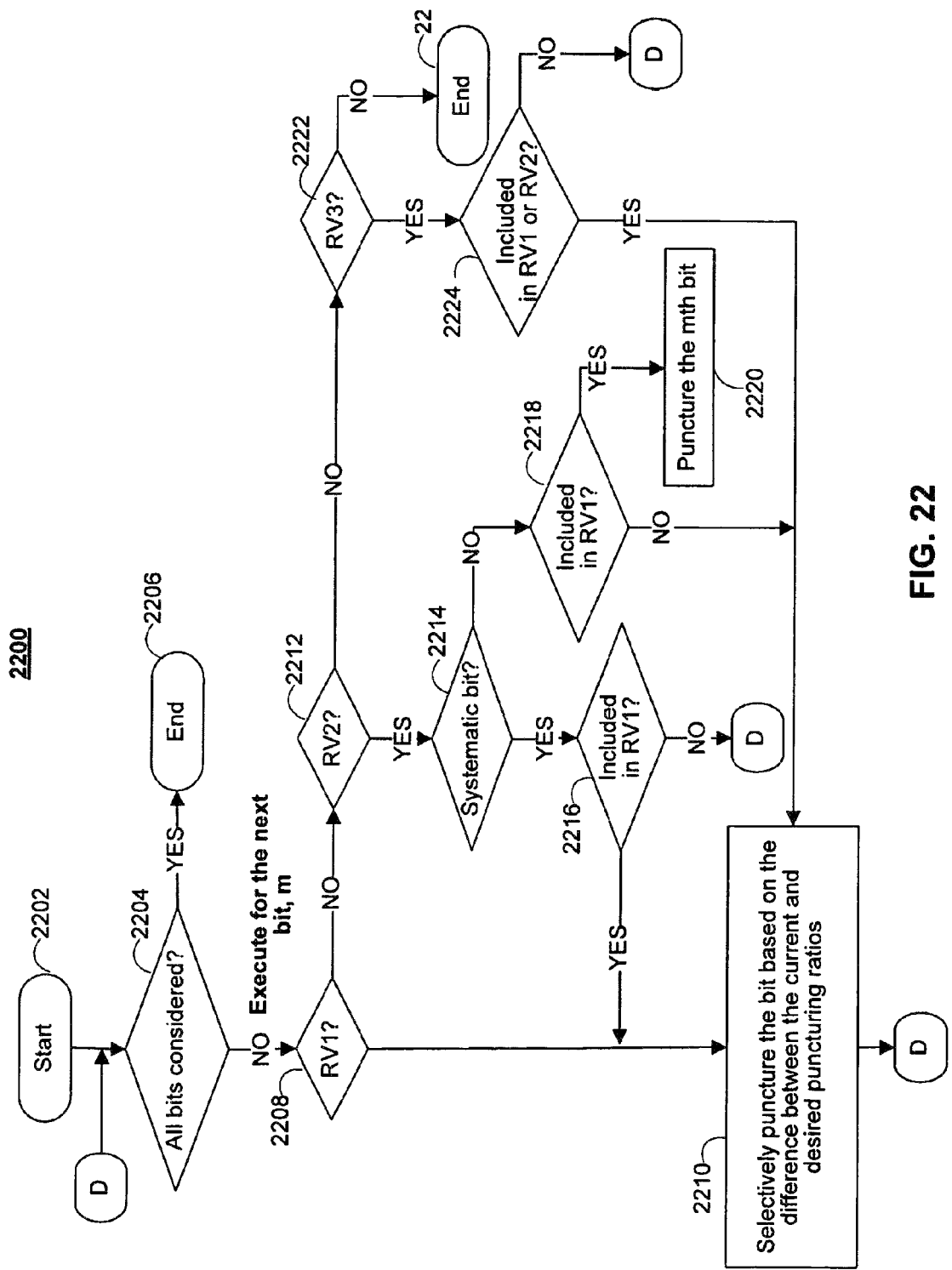
FIG. 22 is a flowchart illustrating the result of performing the loop logic of FIG. 20 when three redundancy versions are needed (e.g., R_max=3)
Figure 23:
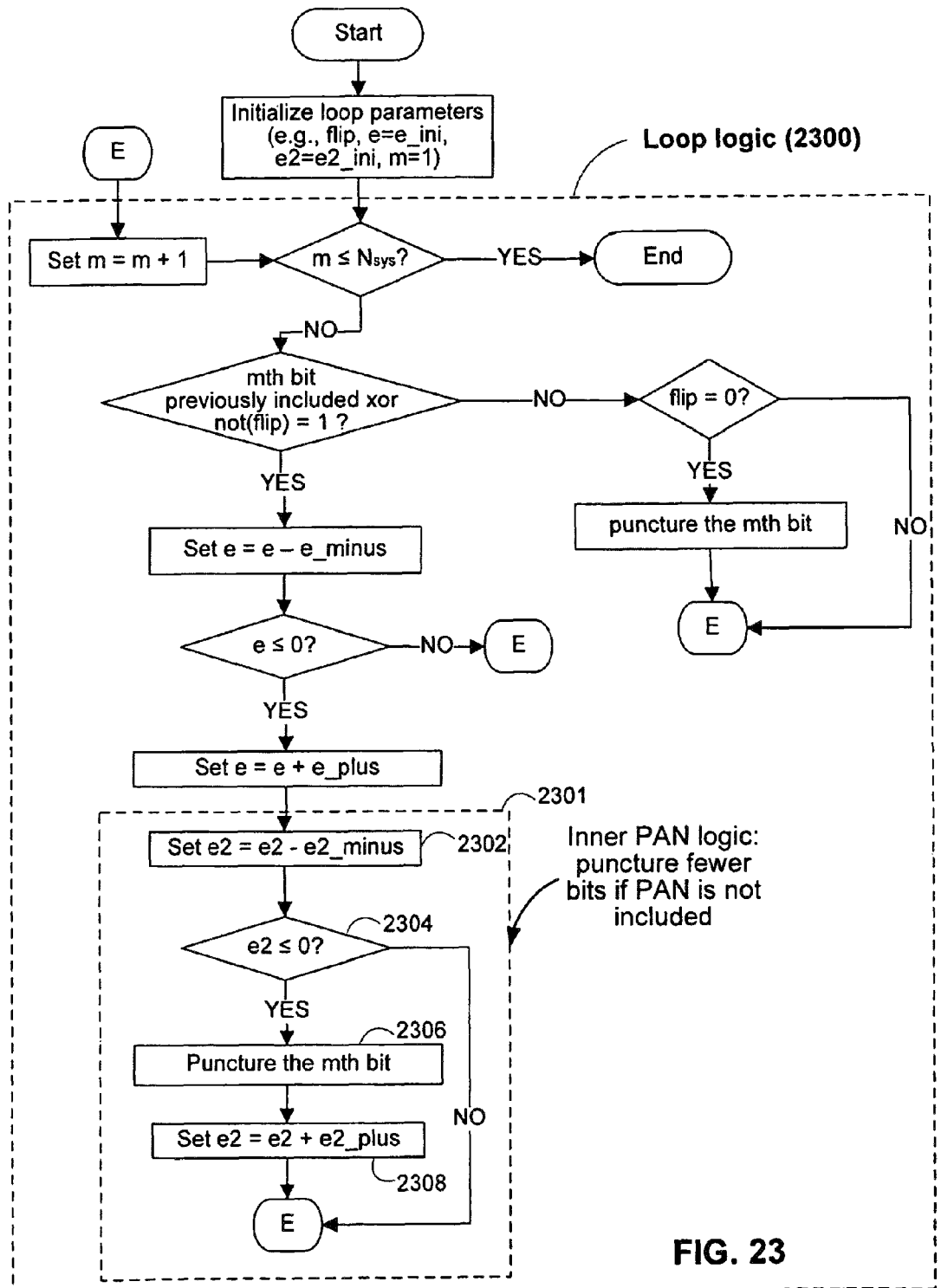
FIG. 23 is a flowchart showing the loop logic in FIG. 20 with additional steps for puncturing fewer bits when a piggybacked ACK/NACK (PAN) field is not included in a radio block.

To show that loop logic 2000 generates redundancy versions in accordance with previously described processes (e.g., processes 600 (FIG. 6) and processes 700 (FIG. 7), etc.), FIGS. 22 and 23 illustrate what the rate matcher essentially accomplishes when performing loop logic 2000 for $R_{MAX}=2$ and $R_{MAX}=3$, respectively. In other words, FIGS. 22 and 23 illustrate the puncturing algorithm that loop logic 2000 implements for each type of redundancy version—e.g., RV1 and RV2-I for FIG. 22 and RV1, RV2-II, and RV3 for FIG. 23. The processes of FIGS. 22 and 23 may be derived from inserting some of the loop parameters (e.g., flip) into loop logic 2000 for each type of redundancy version.

Figure 21:
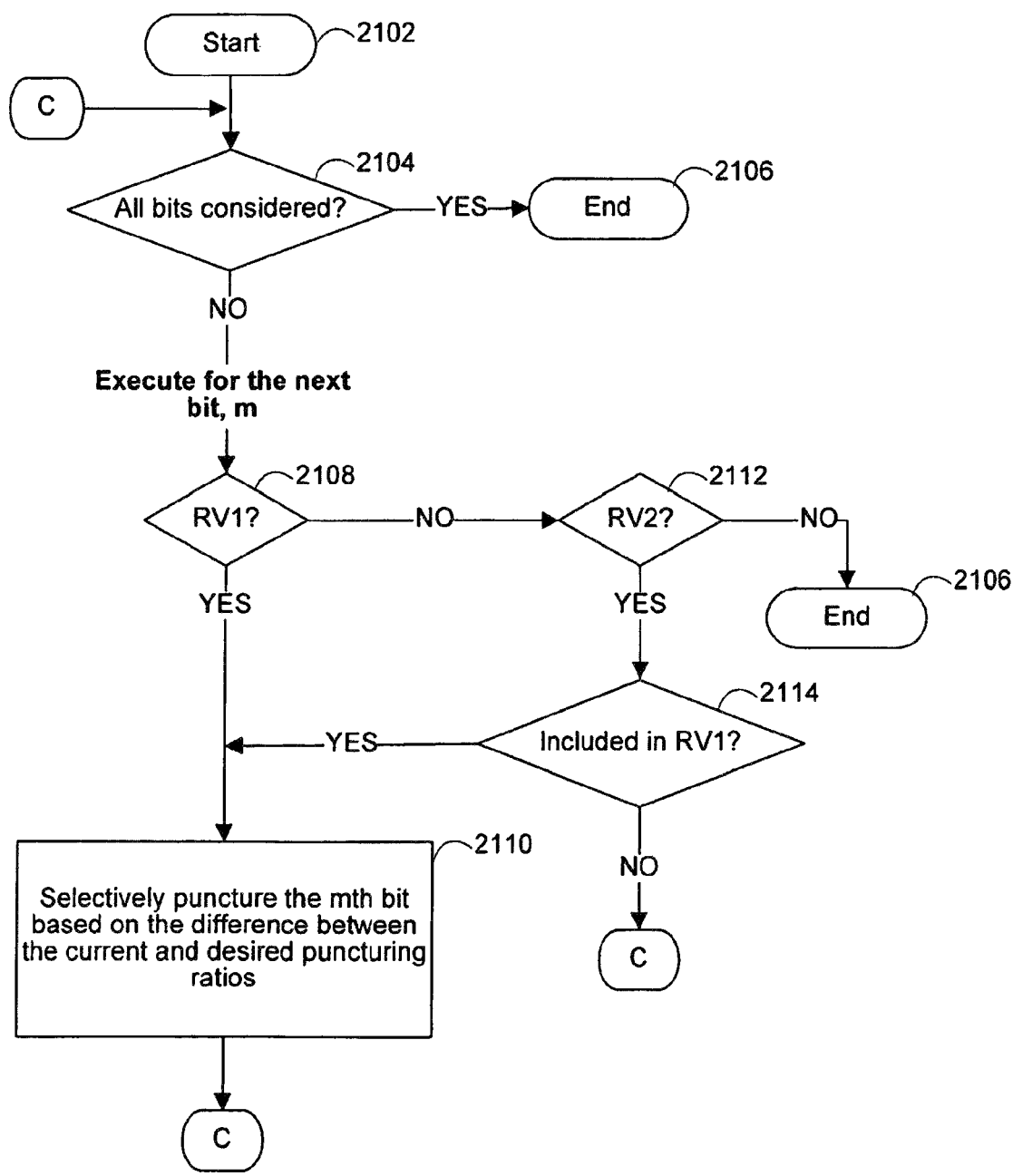
FIG. 21 is a flowchart illustrating the result of performing the loop logic of FIG. 20 when only two redundancy versions are needed (e.g., R_max=2)

Referring first to FIG. 21, a flowchart of illustrative process 2100 is shown that loop logic 2000 (FIG. 20) effectively implements when $R_{MAX}=2$. Process 2100 begins at step 2102 and proceeds to step 2104. At step 2104, the rate matcher executing the loop logic may determine whether all bits (e.g., the systematic, parity 1, or parity 2 bits) have been considered. If all bits have been looped through, process 2100 ends at step 2106. Otherwise, the rate matcher moves to the next bit, m, and performs the remaining steps of the FIG. 21 flowchart for this next bit. If the current redundancy version is a first redundancy version (2108), the rate matcher may selectively puncture the mth bit based on the current error value between the current and desired puncturing ratios. Thus, the rate matcher can puncture a sufficient number of bits so that the remaining, unpunctured bits fit within the predetermined size of the redundancy version (e.g., M). If the current redundancy version is a type-I second redundancy version (2112), the rate matcher may first determine at step 2114 whether the mth bit has already been included in RV1. If the rate matcher determines that the mth bit has not been included in RV1, process 2100 moves back to step 2104 to consider the next bit (if one exists). In this scenario, the rate matcher does not puncture the mth bit, and therefore the mth bit is included in RV2 if it has not already been included in RV1. This way, process 2100 (and therefore loop logic 2000) ensures that all bits are included at least once within the two redundancy versions.

If, at step 2114, the rate matcher determines that the current mth bit has already been included in RV1, process 2100 moves to step 2110, where the mth bit may be punctured. Thus, any bit that has already been included may or may not be selected for inclusion in the second redundancy version, depending on whether additional space is available in the M-bit redundancy version. Process 2100 may then return to step 2104 to consider the next bit (if one exists).

Referring now to FIG. 22, a flowchart of illustrative process 2200 is shown that loop logic 2000 (FIG. 20) effectively implements when $R_{MAX}=3$. Process 2200 begins at step 2202 and proceeds to step 2204. At step 2204, the rate matcher executing the loop logic may determine whether all bits (e.g., the systematic, parity 1, or parity 2 bits) have been considered. If all bits have been looped through, process 2200 ends at step 2206. Otherwise, the rate matcher moves to the next bit, m, and performs the remaining steps of the FIG. 22 flowchart for this next bit. If the current redundancy version is a first redundancy version (2208), the rate matcher may selectively puncture the mth bit based on the current error value between the current and desired puncturing ratios. Thus, the rate matcher can puncture a sufficient number of bits so that the remaining, unpunctured bits fit within the predetermined size of the redundancy version (e.g., M).

If the current redundancy version is a type-II second redundancy version (2212), the rate matcher behaves differently based on whether the data is systematic data or parity data. If the current redundancy version includes systematic data (2214), the rate matcher may first determine at step 2216 whether the mth systematic bit has already been included in RV1. If the rate matcher determines that the mth bit has not been included in RV1, process 2200 moves back to step 2204 to consider the next bit (if one exists). In this scenario, the rate matcher does not puncture the mth systematic bit, and therefore the mth systematic bit is included in RV2 if it has not already been included in RV1. This way, process 2100 (and therefore loop logic 2000) ensures that all the systematic bits are included at least once within the two redundancy versions.

If, at step 2216, the rate matcher determines that the mth systematic bit has already been included in RV1, process 2200 moves to step 2210, where the mth bit may be punctured. Thus, any systematic bit that has already been included in RV1 may or may not be selected for inclusion in the second redundancy version, depending on whether additional space is available in the M-bit redundancy version. Process 2200 may then return to step 2204 to consider the next bit (if one exists).

Returning to step 2214, if the data bits are parity bits (e.g., a parity 1 or parity 2 data bits) and the rate matcher determines that the mth parity bit has already been included in RV1, the rate matcher punctures the current parity bit at step 2220. That is, the rate matcher automatically excludes any parity bit that has already been included in RV1 from being selected for inclusion in RV2. If the rate matcher determines that the current parity bit has not been included in RV1, the parity bit may or may not be punctured at step 2210 based on whether the M-bit second redundancy version has enough space available. Thus, the rate matcher selects, for inclusion in the second redundancy version, only a portion of the parity bits that were not included in RV1.

With the continued reference to FIG. 22, if the current redundancy version is a third redundancy version (2222), the rate matcher determines whether the current bit was included in RV1 or RV2 at step 2224. If the rate matcher determines that the mth bit has not been included in either RV1 or RV2, process 2200 moves back to step 2204 to consider the next bit (if one exists). In this scenario, the rate matcher does not puncture the mth bit, and therefore the mth bit is included in RV3 if it has not already been included in RV1 or RV2. This way, process 2100 (and therefore loop logic 2000) ensures that all of the bits are included in at least one of the three redundancy versions. Process 2200 then moves back to step 2204 to consider the next bit (if one exists).

Returning to step 2224, if the rate matcher determines that the mth bit has already been included in RV1 or RV2, process 2200 moves to step 2210, where the mth bit may be punctured. Thus, any bit that has already been included in RV1 or RV2 may or may not be selected for inclusion in the third redundancy version, depending on whether additional space is available in the M-bit redundancy version. Process 2200 may then return to step 2204 to consider the next bit.

With continued reference to FIGS. 20-22, loop logic 2000 (FIG. 20) essentially illustrates one representative approach to implement the processes of FIGS. 21 and 22. It should be noted that the general selection strategy illustrated by the processes in FIGS. 21 and 22 may be implemented using any suitable set of logic structures and loop variables.

Each packet of information transmitted by a transmitting station may or may not include a PAN field. Therefore, the number of bits available for each redundancy version may vary depending on whether a PAN field is included in the redundancy version. In some embodiments, loop logic 2000 of FIG. 20 represents the steps performed by a rate matcher when a PAN field is included in the transmitted packet (e.g., when $M=M_{PAN}$). Thus, if a PAN field is not included in the transmitted packet, additional systematic and/or parity bits may be selected for inclusion in a current redundancy version.

FIG. 23 shows an illustrative flowchart of loop logic 2300, which is similar to loop logic 2000 (FIG. 20), except that loop logic 2300 initializes a second error value, $e2=e2_{ini}$, and includes inner PAN logic 2301. The second error value, e2, is used to obtain a desired puncturing ratio when a PAN field is not included, and therefore more space is available in the redundancy version. The second error value may be associated with correction factors, $e2_{plus}$, and $e2_{minus}$, which may be initialized and utilized in a similar manner as $e_{plus}$ and $e_{minus}$ described above. Inner PAN logic 2301 prevents some of the bits that loop logic 2000 (FIG. 20) would have punctured in order to accommodate a PAN field from being punctured when a PAN field is not included.

Inner PAN logic 2301 starts with step 2302 in which the rate matcher adjusts the second error value to maintain an accurate current error value. That is, the rate matcher subtracts $e2_{minus}$ from the current second error value. Then, at step 2304, the rate matcher determines whether the second error value is less than or equal to zero. If not, the rate matcher does not puncture the mth bit, and loop logic 2300 moves out of inner PAN logic 2301 to consider the next bit. In this scenario, inner PAN logic 2301 does not puncture a bit that loop logic 2000 (FIG. 20) would have punctured to accommodate a PAN field.

If, at step 2304, the rate matcher instead determines that the second error value is less than zero, this indicates that the mth bit should be punctured to achieve the desired puncturing ratio. Thus, at step 2306, the rate matcher punctures the mth bit so that the mth bit is not included in the current redundancy version. In this scenario, the rate matcher punctures the same bit that loop logic 2000 (FIG. 20) is configured to puncture. Then, at step 2026, since the current bit has been punctured, the rate matcher adjusts the second error value accordingly by adding $e2_{plus}$ to the current second error value. Loop logic 2300 then moves out of inner PAN logic 2301 to consider the next bit.

By implementing inner PAN logic, such as inner PAN logic 2301 of FIG. 23, a rate matcher can determine whether to puncture additional bits for the PAN field at the time of execution of loop logic 2300. In particular, the possible inclusion of a PAN field does not affect the way in which $e_{ini}$, $e_{plus}$, and $e_{minus}$ are computed. Thus, in an embodiment, the rate matcher may not have knowledge on whether a PAN field is to be included in the current radio block until the redundancy version for that radio block is generated.

In some embodiments of the present invention, a rate matcher may distribute systematic bits between all three redundancy versions when $R_{MAX}=3$, instead of including all of the systematic bits in the first two redundancy versions. This may be useful in systems with a high code rate—e.g., systems in which the code rate is at or near one, since few or no systematic bits would otherwise be included in the third redundancy version. By distributing all of the systematic bits between only the first two redundancy versions, the corresponding rate matcher may not be able to recover the transmitted message should RV1 or RV2 not be successfully received (e.g., if the header is not correctly decoded), especially because RV3 would not add any systematic bits to aid in decoding.

The rate matcher may distribute the systematic bits between the redundancy versions in a manner that improves decoding performance when combining pairs of received redundancy versions at a receiving station. In particular, the rate matcher allocates the systematic bits such that the combinations of RV1 and RV2, RV1 and RV3, as well as RV2 and RV3 can each be decoded successfully with high probability. Thus, the decoding performance may still be high in the event that a corresponding receiving station fails to receive one of the redundancy versions.

Figure 24:
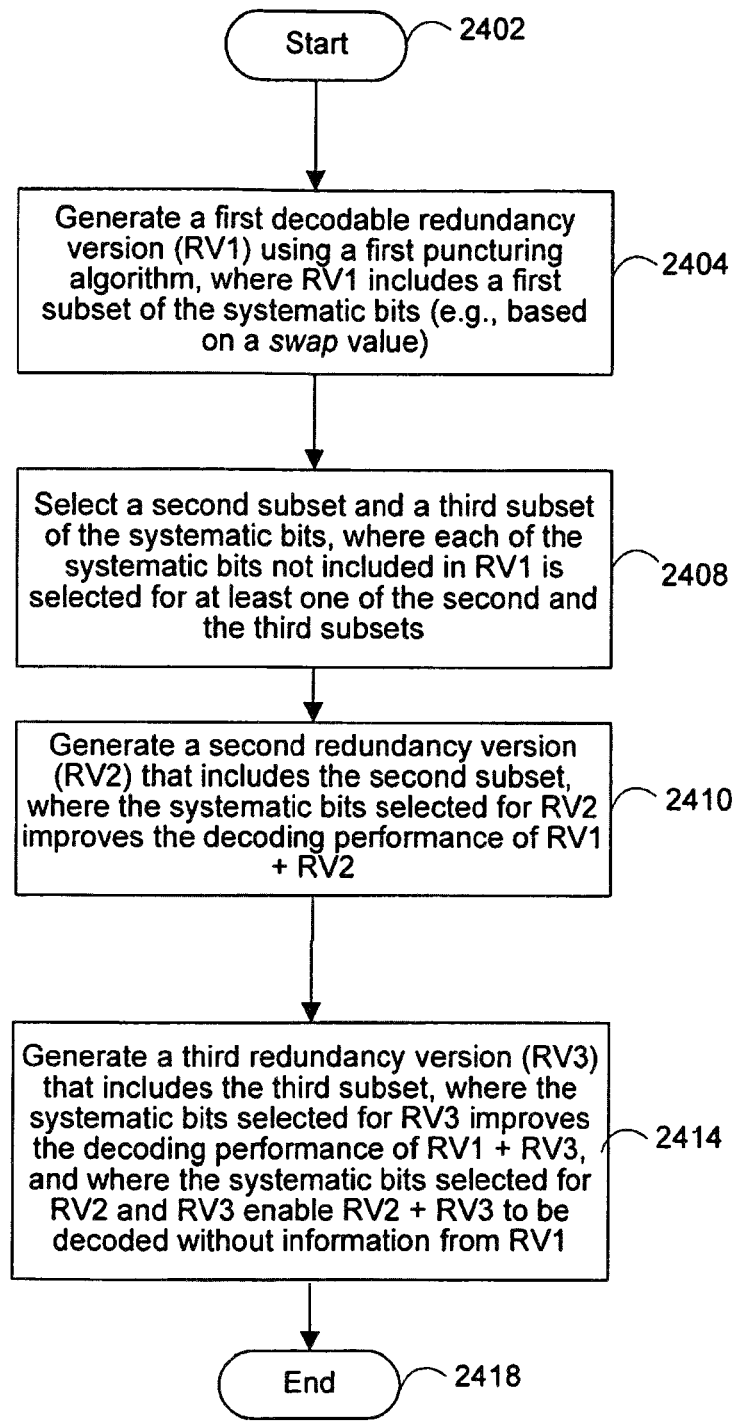
FIG. 24 is a flowchart of an illustrative process for distributing systematic bits between three redundancy versions (RV1, RV2, and RV3) such that RV1 is decodable and RV2 and RV3 are decodable together.

FIG. 24 shows an illustrative flowchart of process 2400 for generating three redundancy versions that each include a portion of the systematic bits. Process 2400 may be executed by any suitable transmitting station or receiving stations implementing a rate matcher. Process 2400 begins at step 2402 and proceeds to step 2404. At step 2404, the rate matcher generates a first redundancy version using a first puncturing algorithm. The first redundancy version may have a sufficient number of systematic bits to be decodable by itself, but may include only a portion of all of the systematic bits. The proportion of the systematic bits included the first redundancy version may be based on a swap value initialized prior to executing the first puncturing algorithm.

At step 2408, the rate matcher may select a second and a third subset of the systematic bits, where each of the systematic bits not included in RV1 is selected for at least one of the second and the third subsets. The rate matcher may use the second subset of systematic bits to generate a second redundancy version at step 2410. The second redundancy version can include the second subset of systematic bits. In an embodiment, where the second subset may be selected such that the expected decoding performance of RV1 and RV2 is improved.

Process 2400 of FIG. 24 may then continue to step 2414. At step 2414, the rate matcher may generate a third redundancy version that includes the third subset of systematic bits selected previously at step 2408. The third subset may have been selected such that the third redundancy version generated at step 2414 is decodable in combination with RV2 (without need of systematic bits included only in RV1). In an embodiment the third redundancy version has improved decoding performance when combined with the first redundancy version. Process 2400 may then move to step 2418 and end.

Figure 25:
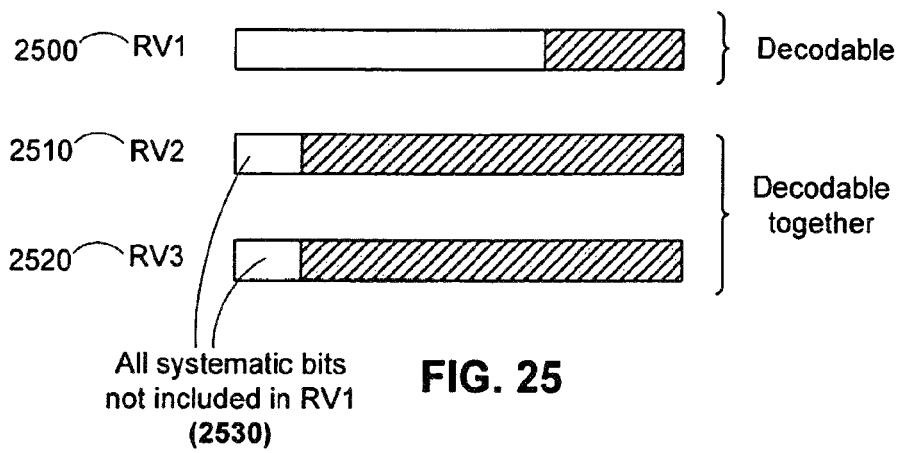
FIG. 25 is a schematic diagram illustrating three redundancy versions generated in accordance with the flowchart of FIG. 24.

FIG. 25 shows illustrative redundancy versions, RV1 2500, RV2 2510, and RV3 2520, generated in accordance with process 2400 of FIG. 24 in a system with a code rate of 1.0. RV1 2500 includes fewer than all of the systematic bits. In an embodiment, the remaining systematic bits 2530 are allocated to RV2 2510 and RV3 2520. The remaining bit positions in RV1 2500 are allocated to parity bits (e.g., parity 1 and/or parity 2 bits in some suitable proportion). RV1 2500 may include a sufficient number of systematic bits so that RV 2500 is still decodable by itself.

In some embodiments, RV1 2500, RV2 2510, and RV3 2520 may be generated such that all of the systematic bits and parity bits are included in the redundancy versions. Thus, due to code rate of one, each systematic bit and parity bit can only be included in one redundancy version. In these embodiments, the number of systematic bits selected for RV1 may be sufficient to allow a receiving station to decode RV1 by itself, but a number of the systematic bits may be reserved for transmission in RV2 2510 and RV3 2520 such that these two redundancy versions may be decodable together without systematic information from RV1.

In some embodiments of the present invention, a rate matcher may generate redundancy versions when $R_{MAX}=3$ such that the third redundancy version may be the same as or similar to the first redundancy version. This approach may have relative computational simplicity, yet may still produce sufficiently high decoding performance at the corresponding receiving station.

Figure 26:
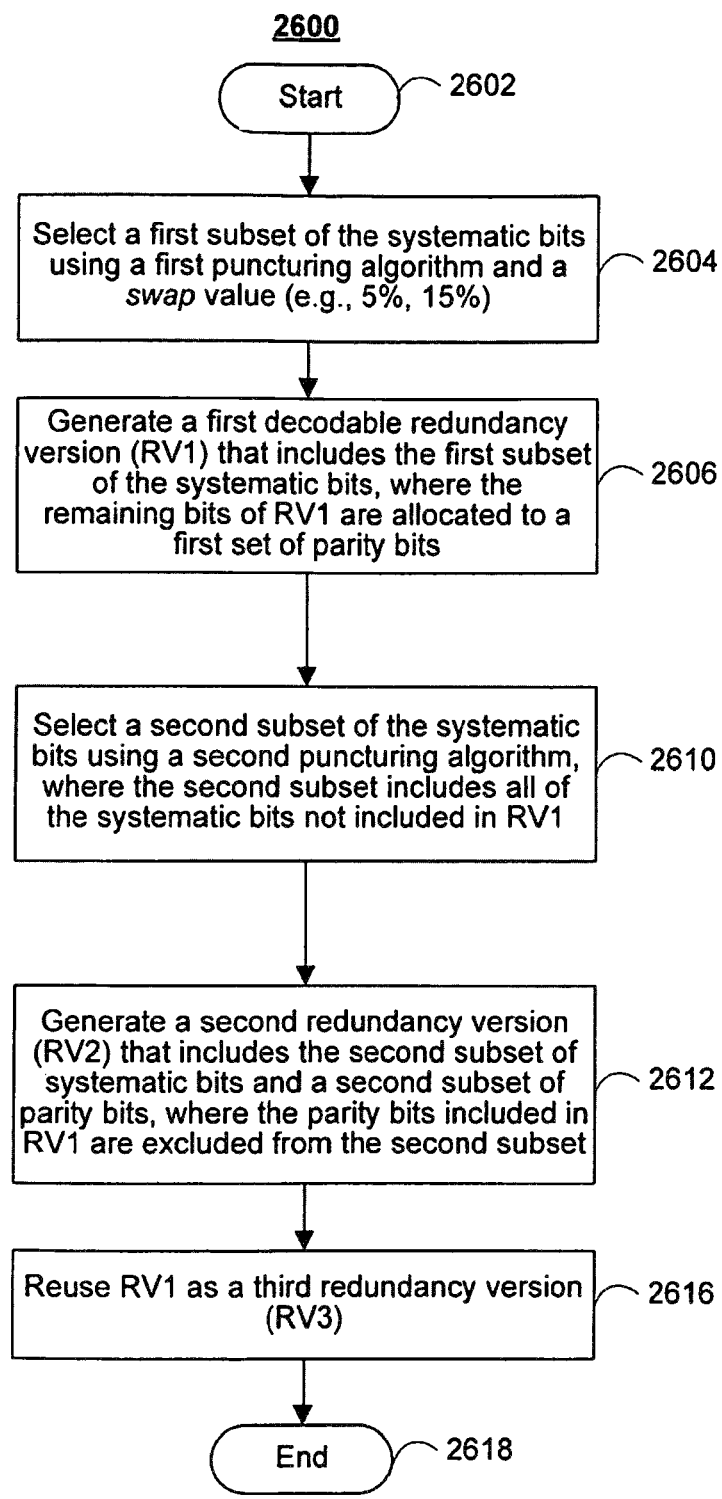
FIG. 26 is a flowchart of an illustrative process for generating three redundancy versions such that the third redundancy version is the same as the first redundancy version.

FIG. 26 shows an illustrative flowchart of process 2600 for generating three redundancy versions, where the third redundancy version is the same as the first redundancy version. Process 2600 may be executed by any suitable transmitting station or receiving station implementing a rate matcher. Process 2600 begins at step 2602 and proceeds to step 2604. At step 2604, the rate matcher generates a first redundancy version using a first puncturing algorithm and a first swap value (e.g., 5%, 15%, etc.). Thus, only a portion of the systematic bits defined by the swap value are selected by the first puncturing algorithm for inclusion in the first redundancy version. The rate matcher may then generate a first decodable redundancy version that includes the first subset of systematic bits at step 2606. The remaining bits of the first redundancy version may be allocated to parity bits (e.g., parity 1 and/or parity 2 bits in some suitable proportion).

Process 2600 then continues to step 2610, where the rate matcher selects a second subset of the systematic bits using a second puncturing algorithm. Since, in an embodiment, a distinct third redundancy version will not be generated, the rate matcher may include all of the systematic bits not selected for RV1 into the second subset of systematic bits. The rate matcher may then generate a second redundancy version at step 2612, which includes the second subset of systematic bits. The rate matcher may allocate the remaining bits to parity bits, but may exclude any of the parity bits included in RV1 from being included in RV2 (e.g., by initializing the flip variable to zero). This maximizes the number of bits from the encoded message that are included in the first two redundancy versions, since as noted additional bits will not be selected for the third redundancy version. If necessary, at step 2616, the rate matcher reuses the first redundancy version as the third redundancy version. Process 2600 may move to step 2618 and ends.

Figure 27:
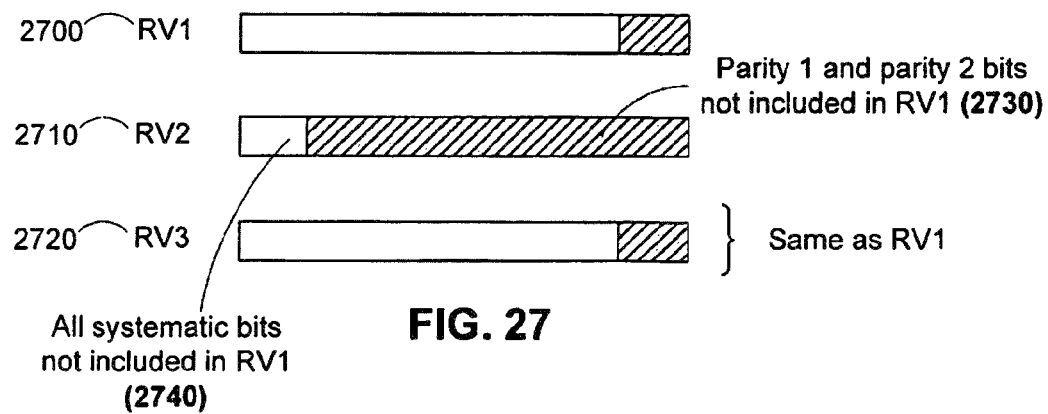
FIG. 27 is a schematic diagram illustrating three redundancy versions generated in accordance with the flowchart of FIG. 26.

FIG. 27 shows illustrative redundancy versions, RV1 2700, RV2 2710, and RV3 2720, generated in accordance with process 2600 of FIG. 26 in a system with a code rate of 1.0. RV1 2700 includes a portion of the systematic bits and a portion of the parity bits (e.g., parity 1 and/or parity 2 bits). RV2 2710 includes the systematic bits 2740 that are not included in RV1 2700, as well as parity 1 and/or parity 2 bits 2730 that are not included in RV1 2700. Therefore, in an embodiment maximum percentage of the encoded message (e.g., 66% for R=1) is included within the first two redundancy versions. The third redundancy version, RV3 2720, is the same as RV1 2700, and therefore does not provide information on any of the remaining bits not included in RV1 or RV2. However, including 66% of the encoded message, of which half is included in two redundancy versions, may be sufficient to obtain a high decoding performance at the corresponding receiving station.

In some embodiments of the present invention, a rate matcher may generate redundancy versions in a manner similar to that described in connection with FIGS. 26 and 27. However, rather than setting the third redundancy version to be the same as the first redundancy version, the rate matcher may generate the third redundancy version using the same puncturing algorithm as the first redundancy version, but using a different swap value. For example, the rate matcher may use a swap value of 5% or 10% to generate the first redundancy version, and may use a swap value of 30% to generate the third redundancy version. This technique simplifies the computational complexity of the rate matching approach for the third redundancy version compared to other approaches, since the third redundancy version is generated without consideration for which bits were selected for the first and second redundancy versions. Yet, unlike the approach of reusing RV1 as RV3, this selection approach still allows different bits to be selected for the third redundancy version.

Figure 28:
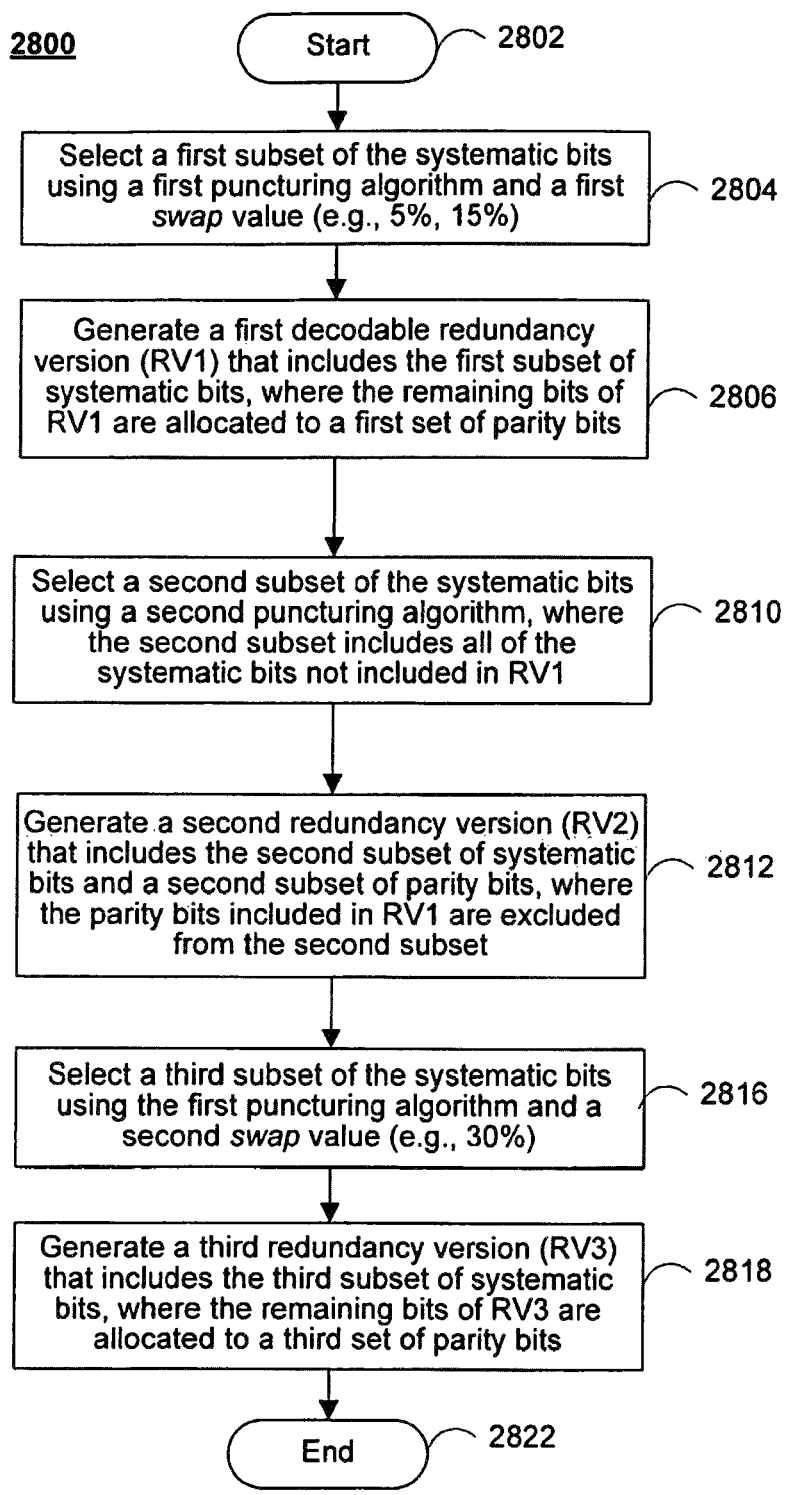
FIG. 28 is a flowchart of an illustrative process for generating three redundancy versions such that RV1 and RV3 are generated using the same puncturing algorithm but different swap values.

FIG. 28 shows an illustrative flowchart of process 2800 for generating redundancy versions, where the first and third redundancy versions are generated using the same puncturing algorithm but different swap values. Process 2800 may be executed by any suitable transmitting or receiving station implementing a rate matcher. Process 2800 begins at step 2802 and proceeds to step 2804. At step 2804, the rate matcher generates a first redundancy version using a first puncturing algorithm and a first swap value (e.g., 5%, 15%, etc.). Thus, only a portion of the systematic bits defined by the swap value are selected by the first puncturing algorithm for inclusion in the first redundancy version. The rate matcher may then generate a first decodable redundancy version that includes the first subset of systematic bits at step 2806. The remaining bits of the first redundancy version may be allocated to a first subset of parity bits (e.g., parity 1 and/or parity 2 bits in some suitable proportion).

Process 2800 then continues to step 2810, where the rate matcher selects a second subset of the systematic bits using a second puncturing algorithm which may be different from the first puncturing algorithm. The rate matcher may select all of the systematic bits not included in RV1 for the second subset of systematic bits. The rate matcher may then generate a second redundancy version at step 2812, which includes the second subset of systematic bits. The rate matcher may allocate the remaining bits to a second subset of parity bits, but may exclude any of the parity bits included in RV1 from being included in the second subset of parity bits (e.g., by initializing the flip variable to zero). This maximizes the number of bits from the encoded message that are included in the first two redundancy versions.

With continued reference to FIG. 28, at step 2816, the rate matcher selects a third subset of the systematic bits using the first puncturing and a second swap value (e.g., 30%). The second swap value may be different from the first swap value used to select the first subset at step 2804. For example, the second swap value may be greater than the first swap value so that a different number of systematic bits at different bit positions are selected for inclusion in the third subset. Then, at step 2818, the rate matcher generates a third redundancy version that includes the third subset of systematic bits, and where the remaining bits in RV3 are allocated to a third subset of parity bits. Process 2800 may then move to step 2822 and end.

Figures 29, 30:
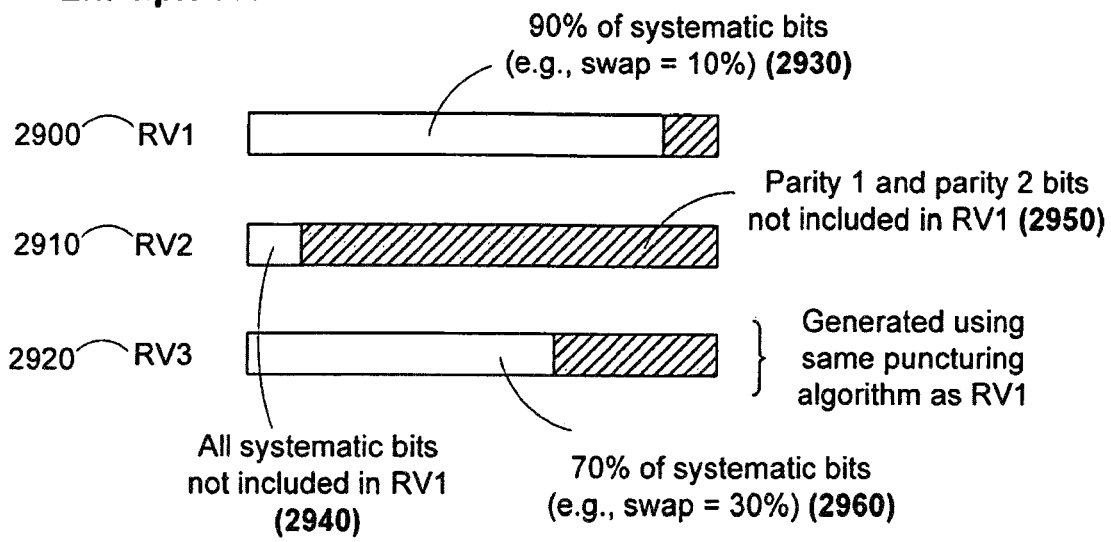
FIG. 29 is a schematic diagram illustrating three redundancy versions generated in accordance with the flowchart of FIG. 28.
FIG. 30 is a table of flip variables for different redundancy versions for use with the flowchart of FIG. 26.

FIG. 29 shows illustrative redundancy versions, RV1 2900, RV2 2910, and RV3 2920, generated in accordance with process 2800 of FIG. 28 in a system with a code rate of 1.0. In this example, the swap value for RV1 2900 is initialized to 10% and the swap value for RV3 2920 is initialized to 30%. Therefore, RV1 2900 includes 90% systematic bits 2930, while RV3 2920 includes 70% systematic bits 2960. As described above, RV1 2900 and RV3 2920 are generated using the same puncturing algorithm. RV2 2910 may be generated using a different puncturing algorithm (or using the same puncturing algorithm with different loop parameters), since the rate matcher selects bits for inclusion in RV2 2910 based on which bits were selected for inclusion in RV1 2900. Thus, RV2 2910 may include systematic bits 2940, which is composed of all 10% of the systematic bits not selected for inclusion in RV1, and parity bits 2950, which is composed of parity 1 bits and parity 2 bits not selected for inclusion in RV1 2900.

The rate matcher may initialize the flip variable according to the values shown in Table 4 to generate redundancy versions in accordance with the technique described above in connection with FIGS. 28 and 29. The rate matcher may use these values regardless of whether the loop logic is being executed on a systematic, parity 1, or parity 2 data bits. In addition to the flip variable, the rate matcher may initialize other loop parameters for use in puncturing systematic, parity 1, and parity 2 bits. The loop parameters may include any of the loop parameters described above, though some of the parameters may be computed differently due to the differences in the puncturing algorithms. The rate matcher may use these loop parameters to separately execute loop logic on the data bits (e.g., using any of the techniques described above in connection with process 1800 of FIG. 18).

Figure 31:
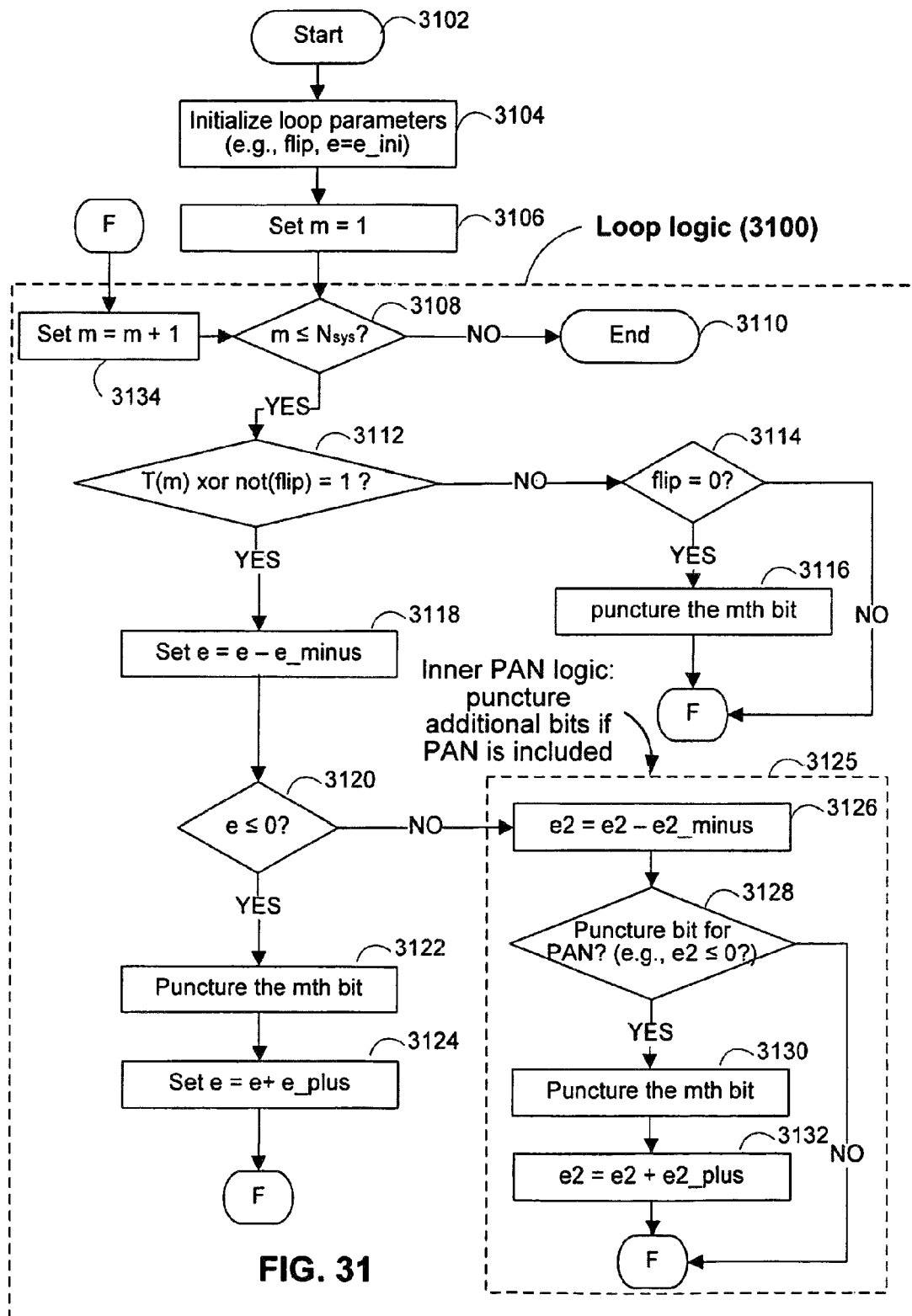
FIG. 31 is a flowchart of illustrative loop logic for looping through and selectively puncturing systematic, parity 1, and parity 2 bits in accordance with an embodiment of the present invention.

FIG. 31 shows an illustrative flowchart of a process that includes loop logic 3100. Loop logic 3100 may be executed by a rate matcher (e.g., enhanced rate matcher 104 or enhanced rate matcher 108 of FIG. 1) to select bits for inclusion in a current redundancy version. In some embodiments, the rate matcher may execute loop logic 3100 to perform each of steps 1808, 1812, and 1816 of FIG. 18. Therefore, the rate matcher may include two or three implementations of loop logic 3100 if any of steps 1808, 1812, or 1816 are performed in parallel. Otherwise, the rate matcher may include one implementation of loop logic 3100, and may initiate loop logic 3100 each time one of steps 1808, 1812, or 1816 is performed. For simplicity in describing the process, FIG. 31 will be described in terms of selecting data bits. It should be understood that these data bits may refer to systematic bits, parity 1 bits, or parity 2 bits, depending on whichever step in FIG. 18 the rate matcher is currently performing.

The process of FIG. 31 begins at step 3102 and proceeds to step 3104. At step 3104, rate matcher may initialize a set of loop parameters. The rate matcher may compute initial error value, $e_{ini}$ and $e2_{ini}$, which are used in conjunction with other loop parameters to achieve a desired puncturing ratios. The rate matcher may then set the current error values, e and e2, to these initial error values. The rate matcher may also initialize a binary loop vector referred to by the variable, T(m), which includes $N_w$ components. For the first and third redundancy versions, T(m) may be initialized to all ones. For the second redundancy version, T(m) may be a vector that includes a one in all positions corresponding to bits were included in RV1 and zeros in all positions corresponding to bits that were punctured from RV1 (assuming that PAN was not included). This vector enables the rate matcher to identify which bits were previously included in RV1, so that those bits will not be included in RV2.

Then, at step 3106, the rate matcher may set a loop variable, m, to one. The loop variable is used to index to a particular data bit. Thus, by setting m=1, the rate matcher initializes loop logic 3100 to start the loop by considering the first bit.

Continuing to step 3108, the rate matcher determines whether the loop variable, m, is less than or equal to the $N_w$. If the loop variable is greater than $N_w$, then loop logic 3100 has looped through all of the bits. Therefore, loop logic 3100 ends at step 3110. Otherwise, loop logic 3100 continues to step 3112 in which the rate matcher computes:

$$T(m) \text{ xor not(flip)} \quad \text{(EXPR. 2)}$$

If the rate matcher determines that this expression, EXPR. 2, is not equal to one, loop logic 3100 moves to step 3114. At step 3114, the rate matcher determines whether the flip variable is equal to zero. If the flip variable is equal to zero, the rate matcher punctures the mth bit at step 3116 so that the mth bit is excluded from the current redundancy version. Loop logic 3100 then moves to step 3134 to consider the next bit. Otherwise, if the rate matcher determines that the flip variable is equal to one, loop logic 2000 moves directly to step 2034 without puncturing the mth bit. In this case, the mth bit is included the current redundancy version.

Returning to step 3112, if the rate matcher determines that EXPR. 2 equals one, loop logic 3100 instead continues to step 3118. At step 3118, the rate matcher adjusts the current error value, e, by subtracting the current error value by $e_{minus}$. Then, at step 3120, the rate matcher determines whether the current error value is less than zero. If the current error value is less than zero, process 3100 continues to step 3122, where the rate matcher punctures the mth bit. The rate matcher also adjusts the error value accordingly at step 3124 by adding $e_{plus}$ to the current error value.

If, at step 3120, the rate matcher determines that the current error value is greater than zero, the mth bit is not punctured unless additional bits are needed to accommodate a PAN field. Loop logic 3100 therefore enters into inner PAN logic 3125, which determines whether the current bit should be punctured so that room for a PAN field can be made. Note that, unlike in loop logic 2300, loop logic 3100 includes inner PAN logic that punctures additional bits if a PAN is included, rather than preventing bits from being punctured if a PAN is not included.

Inner PAN logic 3125 starts with step 3126 in which the rate matcher adjusts the second error value to maintain an accurate current error value. That is, the rate matcher subtracts e2$_{minus}$ from the current second error value. Then, at step 3128, the rate matcher determines whether the second error value is less than or equal to zero. If not, the rate matcher does not puncture the mth bit, and loop logic 2300 moves to step 3134 to consider the next bit.

If, at step 3128, the rate matcher instead determines that the second error value is less than zero, this indicates that the mth bit should be punctured to achieve the desired puncturing ratio. Thus, at step 3130, the rate matcher punctures the mth bit so that the mth bit is not included in the current redundancy version. In this scenario, the rate matcher punctures this bit so that a bit in the PAN field may be included in the current radio block. Then, at step 3132, since the current bit has been punctured, the rate matcher adjusts the second error value accordingly by adding e2$_{plus}$ to the current second error value. Loop logic 3100 then moves to step 3134 to consider the next bit.

Figure 32:
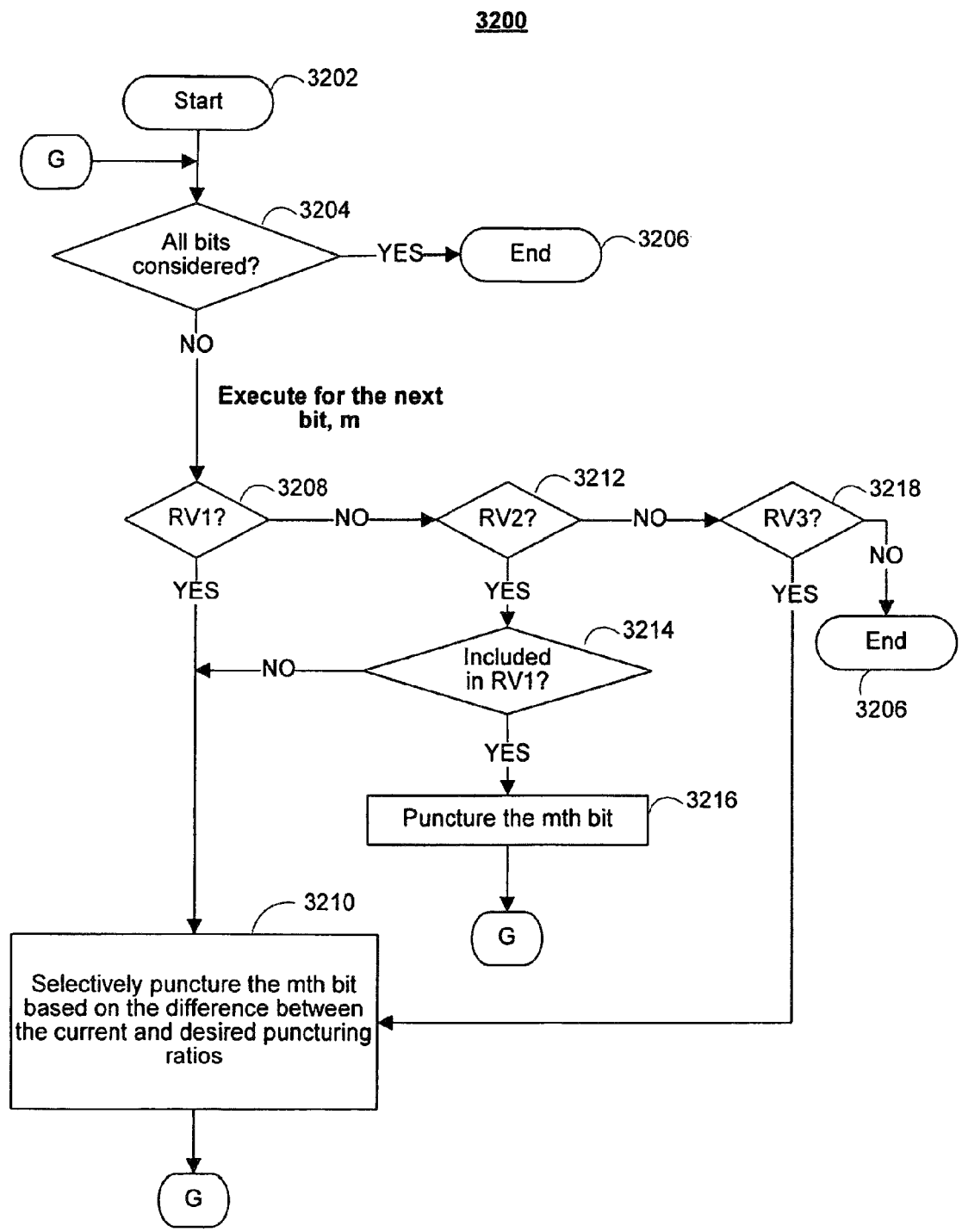
FIG. 32 is a flowchart illustrating the result of performing the loop logic of FIG. 31 when three redundancy versions are needed (e.g., R_max=3)

To show that loop logic 3100 generates redundancy versions in accordance with process 2800 of FIG. 28, FIG. 32 illustrates the effective process executed by a rate matcher when performing loop logic 3100 for $R_{MAX}=3$, respectively. In other words, FIG. 32 illustrates the puncturing algorithm that loop logic 3100 implements for each type of redundancy version—e.g., RV1, RV2-II, and RV3. The process of FIG. 32 may be derived from inserting some of the loop parameters (e.g., the flip variables from Table 4 (FIG. 30)) into loop logic 3100 (FIG. 31) for each type of redundancy version. For $R_{MAX}=2$, loop logic 3100 has a flow similar to that described above in connection with process 2100 of FIG. 21.

Process 3200 begins at step 3202 and proceeds to step 3204. At step 3204, the rate matcher executing the loop logic may determine whether all bits (e.g., the systematic, parity 1, or parity 2 bits) have been considered. If all bits have been looped through, process 3200 ends at step 3206. Otherwise, the rate matcher moves to the next bit, m, and performs the remaining steps of the process 3200 for this next bit. If the current redundancy version is a first redundancy version (3208), the rate matcher may selectively puncture the mth bit based on the current error value between the current and desired puncturing ratios. Thus, the rate matcher can puncture a sufficient number of bits so that the remaining, unpunctured bits fit within the predetermined size of the redundancy version (e.g., M).

If the current redundancy version is a second redundancy version (3212), the rate matcher may determine at step 3214 whether the mth bit was included in the first redundancy version (e.g., using T(m)). If the rate matcher determines that the mth bit has already been included in RV1, the rate matcher punctures the mth bit at step 3214 so that this bit is not included in the second redundancy version. Otherwise, process 3200 moves to step 3210, where the mth bit is selectively punctured. Thus, any bits that have not been included in RV1 may or may not be included in the second redundancy version, depending on the amount of space available in the current redundancy version. Process 3200 may then move back to step 3204 to consider the next bit.

With continued reference to FIG. 32, if the current redundancy version is a third redundancy version (3218), process 3200 moves directly to step 3210, rather than considering whether the bit has been included in the first or the second redundancy versions. At step 3210, the rate matcher may or may not puncture the current bit. Note that the rate matcher behaves in a similar manner for RV1 (3208) and RV3 (3218). In particular, in both situations, process 3200 moves directly to step 3210 to determine whether the current bit should be punctured. Since the case of RV1 (3208) may be associated with a different swap value than that of RV3 (3218), the result of the determination at step 3210 of whether the current bit should be punctured may be different. Thus, even though the same general puncturing algorithm is used in these scenarios, the rate matcher may select a different number of bits and different bit positions for inclusion in the respective redundancy versions.

Figure 33A:
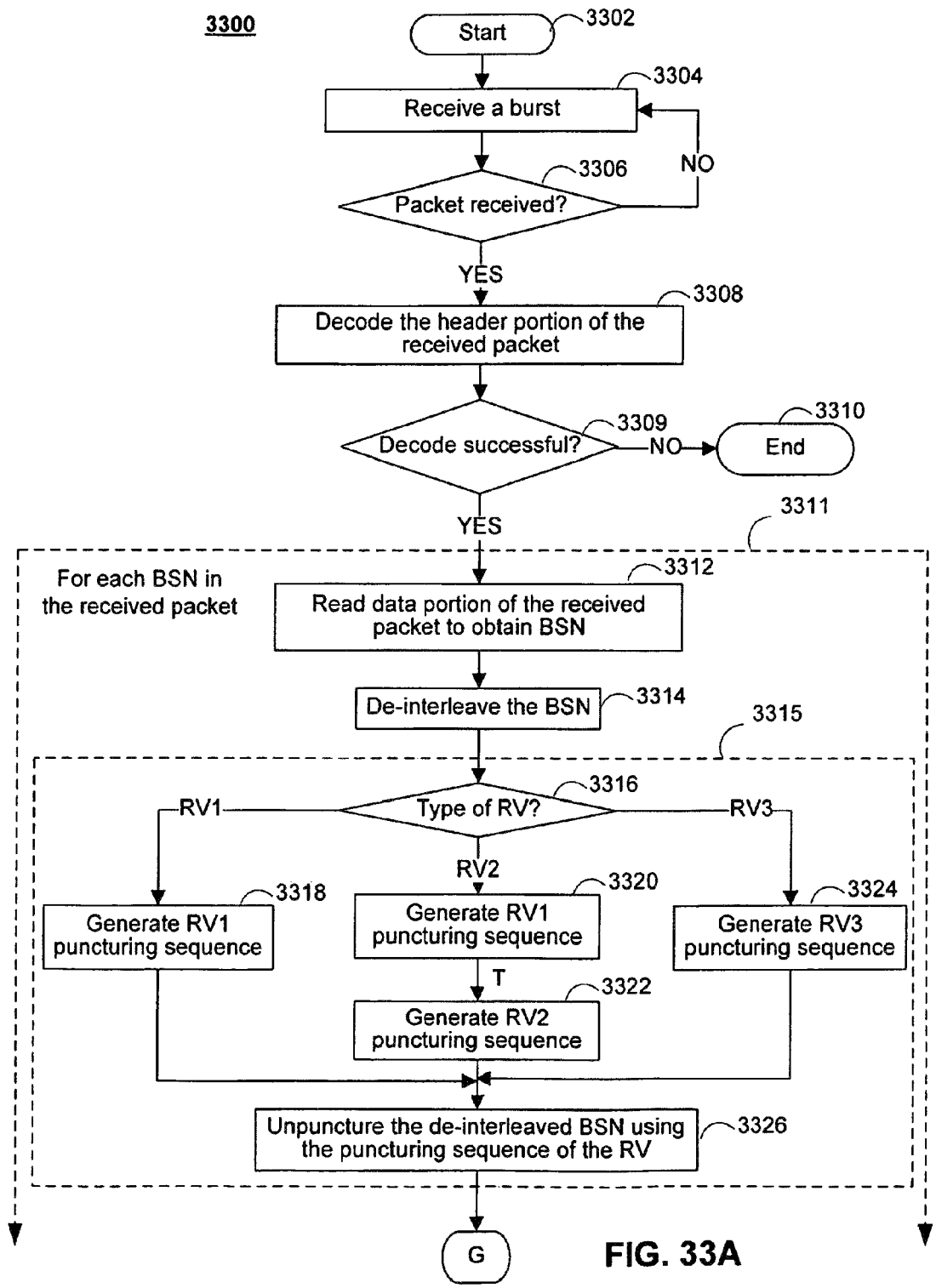
FIGS. 33A and 33B are a flowchart of an illustrative process for decoding one or more received redundancy versions at a receiving station.
Figure 33B:
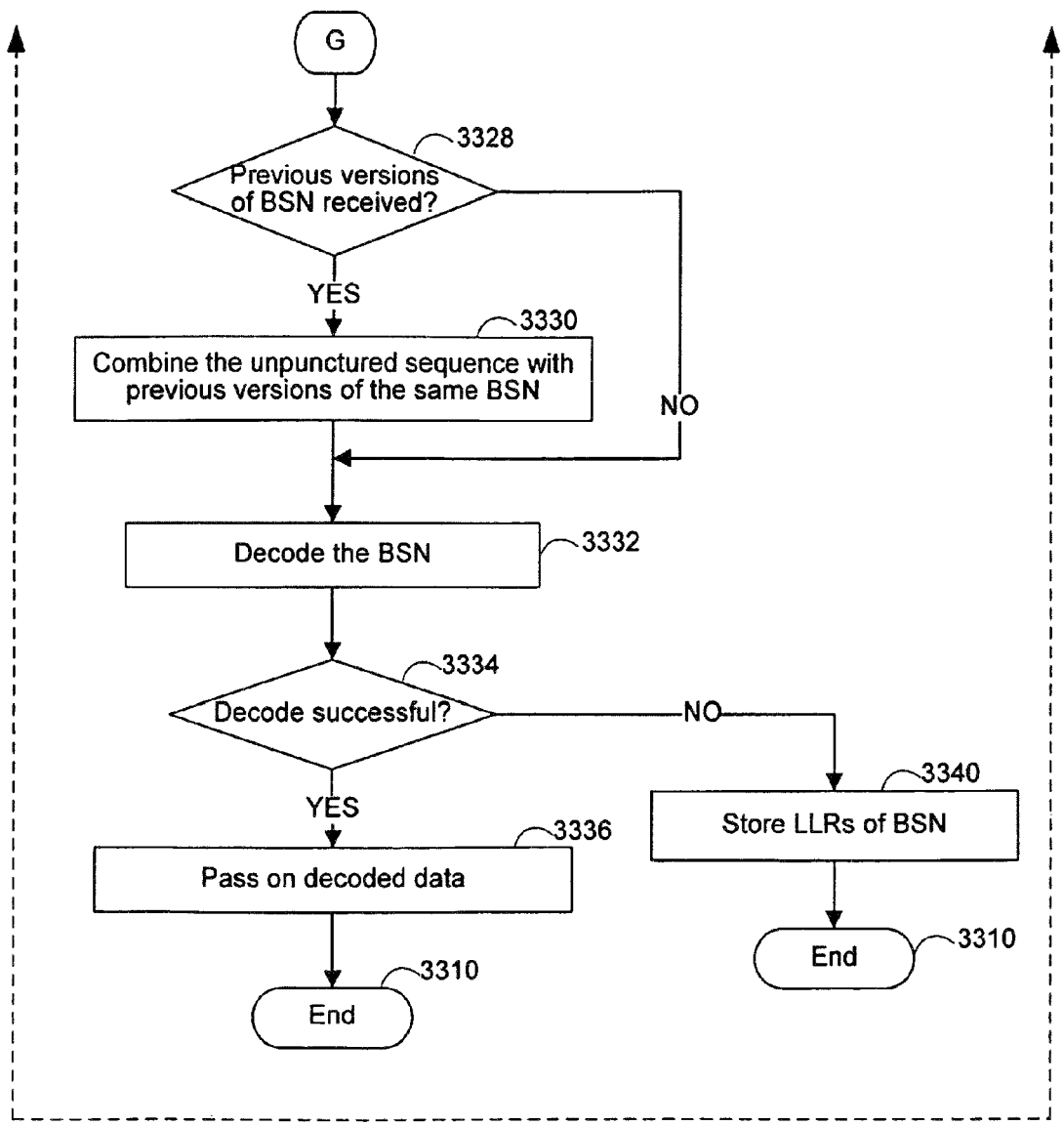

Referring now to FIGS. 33A and 33B, an illustrative flowchart of process 3300 is shown for decoding received redundancy versions generated in accordance with the rate matching techniques described above in connection with FIGS. 28-32. Process 3300 may be performed by a receiving station (e.g., mobile station 106 or base station 102 of FIG. 1).

Process 3300 starts at step 3302 and proceeds to step 3304. At step 3304, the receiving station receives a burst from a wireless communications network (e.g., a cellular network) in a current time slot. The receiving station may determine whether a complete packet of information has been received at step 3306. For example, the receiving station may need to receive four bursts to obtain a full packet of information. Process 3300 may return to step 3304 if all bursts for the current packet have not been received, and otherwise moves to step 3308. At step 3309, the receiving station decodes the header portion of the received packet.

If, at step 3309, the receiving station determines that the header cannot be decoded successfully, the receiving station may not be able to interpret the information in the data portion of the packet. In this scenario, process 3300 ends at step 3310. Otherwise, if the receiving station successfully decodes the header portion, the receiving station can process the BSNs within the data portion of the received packet. Process 3300 therefore continues to the steps shown within region 3311, which are steps that the receiving station performs for each of the BSNs in the data portion.

The steps within region 3311 begin with step 3312. At step 3312, the receiving station may read the data portion of the received packet to obtain one of the BSNs, and at step 3314, the receiving station may deinterleave the obtained BSN. Process 3300 then continues to step 3316 within region 3315. In some embodiments, the steps within this region may be performed by a rate matcher implemented on the receiving station (e.g., enhanced rate matcher 108 of FIG. 1 or enhanced rate matcher 353 of FIG. 3). At step 3316, the receiving station identifies the redundancy version type (e.g., RV1, RV2, or RV3) that the BSN corresponds to. If the receiving station determines that the BSN is a first redundancy version, at step 3318, the receiving station may generate a puncturing sequence using the RV1 puncturing algorithm, as described above in connection with FIGS. 28-32. The puncturing sequence may be, for example, a size $N_w$ binary vector indicating which bit positions of the mother code are included in the received BSN.

If, at step 3316, the receiving station instead determines that the received BSN is a second redundancy version, the receiving station may generate a puncturing sequence corresponding to a second redundancy version. The puncturing algorithm for generating RV2, however, may need the puncturing sequence for RV1. Thus, the receiving station first generates a puncturing sequence using the RV1 puncturing algorithm at step 3320. The receiving station may generate the RV1 puncturing sequence for the case where no PAN field is included, regardless of whether a PAN field was actually used in the previous RV1 transmission. By performing step 3320, the receiving station may obtain T, a loop parameter used in the RV2 puncturing algorithm (described above). Process 3300 may then continue to step 3322 in which the receiving station generates a puncturing sequence using the RV2 puncturing algorithm and the loop parameter, T, obtained from step 3320. The RV2 puncturing sequence may be, for example, a size $N_w$ binary vector indicating which bit positions of the mother code are included in the received BSN.

Returning to step 3316, if the receiving station instead determines that the BSN is a third redundancy version, process 3300 continues to step 3324. At step 3324, the receiving station generates a puncturing sequence using the RV3 puncturing algorithm. For example, the receiving station may generate the puncturing sequence using the puncturing algorithm that would have been used for RV1 at step 3318, except the receiving station may use a different swap value. The RV3 puncturing sequence may be, for example, a size $N_w$ binary vector indicating which bit positions of the mother code are included in the received BSN. In another embodiment (not shown), the receiving station may need to generate the puncturing sequences for RV1 and/or RV2 in order to generate the puncturing sequence for RV3.

Once the receiving station generates a puncturing sequence for the current redundancy version at step 3318, step 3322, or step 3324, process 3300 continues to step 3326. At step 3326, the receiving station, via its rate matcher, may unpuncture the de-interleaved BSN using the generated RV1, RV2, or RV3 puncturing sequence. In particular, the receiving station may map the bits of the de-interleaved BSN to particular bit positions of the mother code based on the puncturing sequence. For the remaining bit positions of the mother code, the receiving station may use erasures as placeholders.

Process 3300 may then continue to step 3328, which is shown in FIG. 33B. At step 3328, the receiving station determines whether previous versions of the same BSN has been received. If previous versions have been received, the receiving station may combine the unpunctured, current BSN to the previous versions. The receiving station may combine these redundancy versions using incremental redundancy combining, for example, or any other suitable combining technique. If, at step 3328, the receiving station instead determines that no previous versions of the same BSN have been received, process 3300 skips to step 3332 without performing combining.

At step 3332, the receiving station decodes the unpunctured BSN, which may or may not be combined with previously received versions of the same BSN. If, at step 3334, the receiving station determines that the unpunctured BSN has been successfully decoded, process 3300 moves to step 3336. At step 3336, the receiving station passes the decoded data to the parts of the receiving station that use the decoded data, and process 3300 ends at step 3310. If, at step 3334, the receiving station instead determines that decoding was unsuccessful, the receiving station may store the corresponding log-likelihood ratios (LLRs) of the BSN. The receiving station may then use the stored LLRs when the next redundancy version of the same BSN is received. In particular, the receiving station can combine the stored LLRs with the next received BSN when the receiving station performs step 3330 for the next received version of the same BSN. Process 3300 may then end at step 3310.

The foregoing describes apparatuses and methods for rate matching. Those skilled in the art will appreciate that the invention can be practiced by other than the described embodiments, which are presented for the purpose of illustration rather than of limitation.

What is claimed is:

1. A method of transmitting a message over a wireless communications network, the method comprising:

encoding the message using a Turbo code to produce encoded data, the encoded data comprising a plurality of systematic bits and a plurality of parity bits;

selecting, for transmission over the wireless communications network, a first subset of the systematic bits using a first puncturing algorithm and a first parameterized swap value;

generating a first redundancy version of the message that has a predetermined number of bit positions, the first redundancy version including the first subset of the systematic bits, wherein unused bit positions of the first redundancy version are allocated to a first subset of the parity bits;

selecting, for transmission over the wireless communications network, a second subset of the systematic bits that has substantially all of the systematic bits corresponding to the message that are not included in the first subset of the systematic bits;

generating a second redundancy version of the message that has the predetermined number of bit positions, the second redundancy version including the second subset of systematic bits, wherein unused bit positions of the second redundancy version are allocated to a second subset of parity bits that is generated from parity bits which are not included in the first subset of parity bits, and includes additional parity bits only if all of the parity bits are otherwise included in the first or second subsets; and transmitting at least the first redundancy version.

2. The method of claim 1, wherein selecting the first subset or the second subset of systematic bits comprises puncturing a portion of the systematic bits such that the portion is excluded from the that subset.

3. The method of claim 1, further comprising:

selecting, for transmission over the wireless communications network, a third subset of the systematic bits using the first puncturing algorithm and a second parameterized swap value, wherein the second parameterized swap value is greater than the first parameterized swap value; and generating a third redundancy version of the message that has the predetermined number of bit positions, the third redundancy version including the third subset of the systematic bits and a third subset of the parity bits.

4. The method of claim 3, wherein the plurality of parity bits comprises a first plurality of parity bits and a second plurality of parity bits, the method further comprising:

allocating a portion of the first, second, and third subsets of parity bits to the first plurality of parity bits; and allocating a remaining portion of the first, second, and third subsets of parity bits to the second plurality of parity bits.

5. The method of claim 1, wherein the plurality of parity bits comprises a first plurality of parity bits and a second plurality of parity bits, the method further comprising:

allocating approximately half of the first and second subsets of parity bits to the first plurality of parity bits; and allocating a remaining approximately half of the first and second subsets of parity bits to the second plurality of parity bits.

6. The method of claim 1, wherein selecting the second subset of parity bits comprises:

excluding parity bits that are included in the first subset of the parity bits from the second subset of parity bits.

7. The method of claim 6, wherein excluding the parity bits from being selected for the second subset is performed in response to determining that more than two redundancy versions are needed to transmit all bits of the encoded data.

8. The method of claim 1, wherein including all of the parity bits in the second subset that have not been included in the first redundancy version is performed in response to determining that two redundancy versions are needed to transmit all bits of the encoded data stream.

9. A transmitter for transmitting a message over a wireless communications network, the transmitter comprising:
a Turbo encoder configured to encode the message to produce encoded data, the encoded data comprising a plurality of systematic bits and a plurality of parity bits;
a rate matcher configured to:
select, for transmission over the wireless communications network, a first subset of the systematic bits using a first puncturing algorithm and a first parameterized swap value;
generate a first redundancy version that has a predetermined number of bit positions, the first redundancy version including the first subset of the systematic bits, wherein unused bit positions of the first redundancy version are allocated to a first subset of the parity bits;
select, for transmission over the wireless communications network, a second subset of the systematic bits that has substantially all of the systematic bits corresponding to the message that are not included in the first subset of the systematic bits; and
generate a second redundancy version that has the predetermined number of bit positions, the second redundancy version including the second subset of the systematic bits, wherein unused bit positions of the second redundancy version are allocated to a second subset of parity bits that is generated from parity bits which are not included in the first subset of parity bits, and includes additional parity bits only if all of the parity bits are otherwise included in the first or second subsets; and
communications circuitry configured to transmit at least the first redundancy version over the wireless communications network.

10. The transmitter of claim 9, wherein the rate matcher is further configured to:
select the first subset or the second subset of systematic bits by puncturing a portion of the systematic bits such that the portion is excluded from the that subset.

11. The transmitter of claim 9, wherein the rate matcher is further configured to:
select, for transmission over the wireless communications network, a third subset of the systematic bits using the first puncturing algorithm and a second parameterized swap value, wherein the second parameterized swap value is different from the first parameterized swap value; and
generate a third redundancy version of the message that has the predetermined number of bit positions, the third redundancy version including the third subset of the systematic bits and a third subset of the parity bits.

12. The transmitter of claim 11, wherein the second parameterized swap value is greater than the first parameterized swap value.

13. The transmitter of claim 11, wherein the plurality of parity bits comprises a first plurality of parity bits and a second plurality of parity bits, the rate matcher further configured to:
allocate a portion of the first, second, and third subsets of parity bits to the first plurality of parity bits; and
allocate a remaining portion of the first, second, and third subsets of parity bits to the second plurality of parity bits.

14. The transmitter of claim 9, wherein the plurality of parity bits comprises a first plurality of parity bits and a second plurality of parity bits, the rate matcher further configured to:
allocate a portion of the first and second subsets of parity bits to the first plurality of parity bits; and
allocate a remaining portion of the first and second subsets of parity bits to the second plurality of parity bits.

15. The transmitter of claim 9, wherein the rate matcher is further configured to:
select the second subset of parity bits by excluding parity bits that are included in the first subset of the parity bits from the second subset of parity bits.

16. The transmitter of claim 9, wherein the rate matcher is configured to include all of the parity bits in the second subset that have not been included in the first redundancy version in response to determining that two redundancy versions are needed to transmit all bits of the encoded data stream.

17. A method of generating redundancy versions of a message having associated systematic bits and parity bits, the method comprising:
selecting a first subset of the systematic bits using a first puncturing algorithm and a first parameterized swap value;
generating a first redundancy version of the message that has a predetermined number of bit positions, the first redundancy version including the first subset of the systematic bits, wherein unused bit positions of the first redundancy version are allocated to a first subset of the parity bits;
selecting a second subset of the systematic bits that has substantially all of the systematic bits corresponding to the message that are not included in the first subset of the systematic bits; and
generating a second redundancy version of the message that has the predetermined number of bit positions, the second redundancy version including the second subset of systematic bits, wherein unused bit positions of the second redundancy version are allocated to a second subset of parity bits that is generated from parity bits which are not included in the first subset of parity bits, and includes additional parity bits only if all of the parity bits are otherwise included in the first or second subsets.

18. The method in claim 17, further comprising:
selecting a third subset of the systematic bits using the first puncturing algorithm and a second parameterized swap value, wherein the second parameterized swap value is different from the first parameterized swap value; and
generating a third redundancy version of the message that has the predetermined number of bit positions, the third redundancy version including the third subset of the systematic bits and a third subset of the parity bits.

19. The method in claim 18, wherein the second parameterized swap value is greater than the first parameterized swap value.

20. A rate matcher for generating redundancy versions of a message having associated systematic bits and parity bits, the rate matcher configured to:
select a first subset of the systematic bits using a first puncturing algorithm and a first parameterized swap value;
generate a first redundancy version that has a predetermined number of bit positions, the first redundancy version including the first subset of the systematic bits, wherein unused bit positions of the first redundancy version are allocated to a first subset of the parity bits;

select a second subset of the systematic bits that has substantially all of the systematic bits corresponding to the message that are not included in the first subset of the systematic bits; and generate a second redundancy version that has the predetermined number of bit positions, the second redundancy version including the second subset of the systematic bits, wherein unused bit positions of the second redundancy version are allocated to a second subset of parity bits that is generated from parity bits which are not included in the first subset of parity bits, and includes additional parity bits only if all of the parity bits are otherwise included in the first or second subsets.

21. The rate matcher in 20, wherein the rate matcher is further configured to:

select the first subset or the second subset of systematic bits by puncturing a portion of the systematic bits such that the portion is excluded from the that subset.

22. The rate matcher in 20, wherein the rate matcher is further configured to:

select a third subset of the systematic bits using the first puncturing algorithm and a second parameterized swap value, wherein the second parameterized swap value is different from the first parameterized swap value; and generate a third redundancy version of the message that has the predetermined number of bit positions, the third redundancy version including the third subset of the systematic bits and a third subset of the parity bits.

* * * * *